United States Patent
Quilici

(10) Patent No.: US 9,754,712 B2
(45) Date of Patent: Sep. 5, 2017

(54) EMBEDDED MAGNETIC COMPONENTS AND METHODS

(71) Applicant: Radial Electronics, Inc., El Dorado Hills, CA (US)

(72) Inventor: James E. Quilici, El Dorado Hills, CA (US)

(73) Assignee: RADIAL ELECTRONICS, INC., El Dorado Hills, CA (US)

( * ) Notice: Subject to any disclaimer, the term of this patent is extended or adjusted under 35 U.S.C. 154(b) by 0 days.

(21) Appl. No.: 14/963,579

(22) Filed: Dec. 9, 2015

(65) Prior Publication Data

US 2016/0086709 A1    Mar. 24, 2016

Related U.S. Application Data

(60) Continuation-in-part of application No. 12/329,887, filed on Dec. 8, 2008, now Pat. No. 9,355,769, which
(Continued)

(51) Int. Cl.
H01F 5/00 (2006.01)
H01F 17/00 (2006.01)
(Continued)

(52) U.S. Cl.
CPC ....... *H01F 17/0033* (2013.01); *H01F 17/062* (2013.01); *H01F 41/02* (2013.01);
(Continued)

(58) Field of Classification Search
CPC ................... H01F 5/00; H01F 27/00–27/30
(Continued)

(56) References Cited

U.S. PATENT DOCUMENTS 3,638,156 A    1/1972   West
5,372,967 A    12/1994  Sundaram et al.
(Continued)

FOREIGN PATENT DOCUMENTS

EP    1122750       8/2001
EP    06815217.2    9/2006
(Continued)

OTHER PUBLICATIONS

PCT/US2009/052512, WO2011014200, publ. Mar. 2, 2011, International Search Report.
(Continued)

*Primary Examiner* — Tuyen Nguyen
(74) *Attorney, Agent, or Firm* — Inventive Patent Law P.C.; Jim H. Salter

(57) ABSTRACT

Disclosed are apparatus and methods for a magnetic component. In accordance with an embodiment, a magnetic component comprises a base substrate defining a winding cup having a shape of a closed groove surrounding a hub. The winding cup defines a core space operable to receive a core therein. A first conductive pattern is disposed on at least a portion of the base substrate including the winding cup. A second substrate defines a second conductive pattern. The second substrate is coupled to the first base surface with the first conductive pattern in operable alignment with the second conductive pattern. The first and second conductive patterns are coupled in electrical communication so as to define one or more winding-type electric circuits surrounding the core space so as to induce a magnetic flux within the core space when the one or more electric circuits are energized by a voltage source.

45 Claims, 25 Drawing Sheets

Related U.S. Application Data is a division of application No. 11/233,824, filed on Sep. 22, 2005, now Pat. No. 7,477,128, application No. 14/963,579, which is a continuation-in-part of application No. 14/891,645, filed as application No. PCT/US2009/052512 on Jul. 31, 2009.

(51) Int. Cl.

| | | |
|---|---|---|
| *H01F 17/06* | (2006.01) | |
| *H01F 41/02* | (2006.01) | |
| *H01F 41/04* | (2006.01) | |
| *H05K 1/16* | (2006.01) | |
| *H01F 41/064* | (2016.01) | |
| *H05K 1/02* | (2006.01) | |
| *H05K 3/04* | (2006.01) | |
| *H05K 3/46* | (2006.01) | |
| *H01F 27/02* | (2006.01) | |
| *H01F 27/28* | (2006.01) | |
| *H05K 3/00* | (2006.01) | |

(52) U.S. Cl.
CPC ....... *H01F 41/0206* (2013.01); *H01F 41/041* (2013.01); *H01F 41/042* (2013.01); *H01F 41/064* (2016.01); *H05K 1/0284* (2013.01); *H05K 1/165* (2013.01); *H05K 3/045* (2013.01); *H05K 3/4611* (2013.01); *H01F 27/027* (2013.01); *H01F 2027/2814* (2013.01); *H05K 3/0014* (2013.01); *H05K 2201/086* (2013.01); *H05K 2201/09036* (2013.01); *H05K 2201/09045* (2013.01); *H05K 2201/09118* (2013.01); *H05K 2201/2036* (2013.01); *Y10T 29/4902* (2015.01); *Y10T 29/49073* (2015.01); *Y10T 29/49075* (2015.01); *Y10T 156/10* (2015.01)

(58) Field of Classification Search
USPC .................................. 336/65, 200, 232, 229
See application file for complete search history.

(56) References Cited

U.S. PATENT DOCUMENTS

| | | | |
|---|---|---|---|
| 5,781,091 A * | 7/1998 | Krone | ................ H01F 17/0033 336/200 |
| 5,787,569 A | 8/1998 | Lotfi et al. | |
| 5,942,963 A | 8/1999 | Reznik et al. | |
| 5,959,846 A | 9/1999 | Noguchi et al. | |
| 6,148,500 A | 11/2000 | Krone et al. | |
| 6,181,130 B1 | 1/2001 | Hoshi et al. | |
| 6,362,714 B1 | 3/2002 | Rice | |
| 6,417,754 B1 | 7/2002 | Bernhardt | |
| 6,535,085 B2 | 3/2003 | Song et al. | |
| 6,686,824 B1 | 2/2004 | Yamamoto | |
| 6,768,409 B2 | 7/2004 | Inoue et al. | |
| 6,940,385 B2 | 9/2005 | Kusano | |
| 6,990,729 B2 | 1/2006 | Pleskach et al. | |
| 7,196,607 B2 | 3/2007 | Pleskach et al. | |
| 7,489,226 B1 * | 2/2009 | Chignola | ............ H01F 27/2804 336/229 |
| 8,591,262 B2 * | 11/2013 | Schaffer | ................. H01F 5/003 336/170 |
| 8,860,543 B2 * | 10/2014 | Schaffer | ............. H01F 17/0033 336/200 |
| 2002/0057173 A1 | 5/2002 | Johnson | |
| 2003/0011041 A1 | 1/2003 | Acosta | |
| 2004/0113738 A1 | 6/2004 | Ahn et al. | |
| 2005/0122199 A1 | 6/2005 | Ahn et al. | |

FOREIGN PATENT DOCUMENTS

| | | |
|---|---|---|
| GB | 2271880 | 4/1994 |
| JP | 01287911 A | 11/1989 |
| WO | WO2007038309 A3 | 5/2007 |
| WO | WO2011014200 A1 | 3/2011 |

OTHER PUBLICATIONS

PCT/US2009/052512, WO2011014200, publ. Mar. 2, 2011, International Preliminary Report on Patentability.
PCT/US2009/052512, WO2011014200, publ. Mar. 2, 2011, International Written Opinion.
PCT/US2006/037049, WO2007038309, publ. May 4, 2007, International Search Report.
PCT/US2006/037049, WO2007038309, publ. May 4, 2007, International Preliminary Report on Patentability.
PCT/US2006/037049, WO2007038309, publ. May 4, 2007, International Written Opinion.
European Supplemental Search Report, Appl. No. 06815217.2, filed Sep. 22, 2006, priority document PCT/US2006/037049, Report dated Oct. 4, 2015.

* cited by examiner

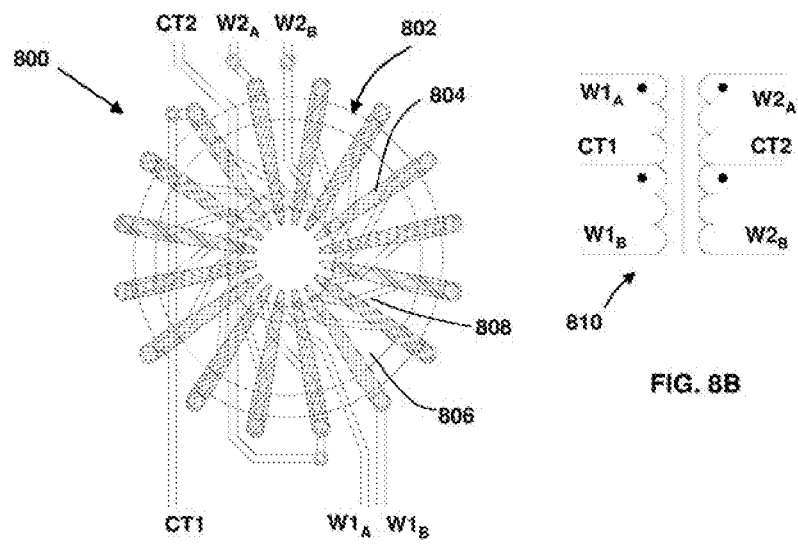
FIG. 8A
FIG. 8B
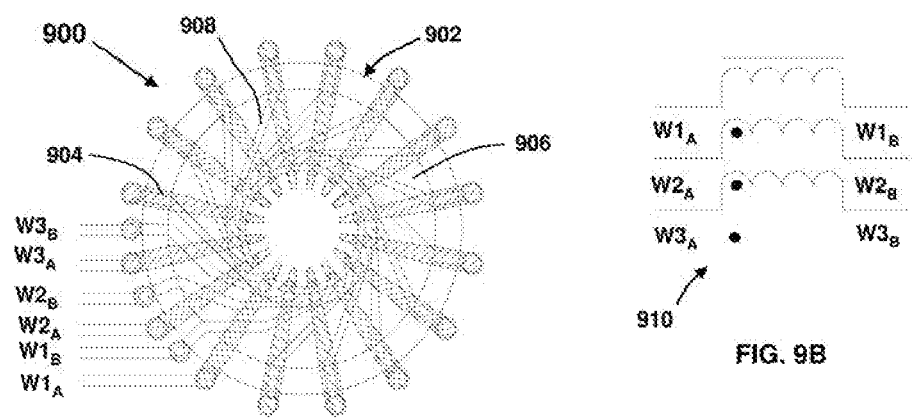
FIG. 9A
FIG. 9B
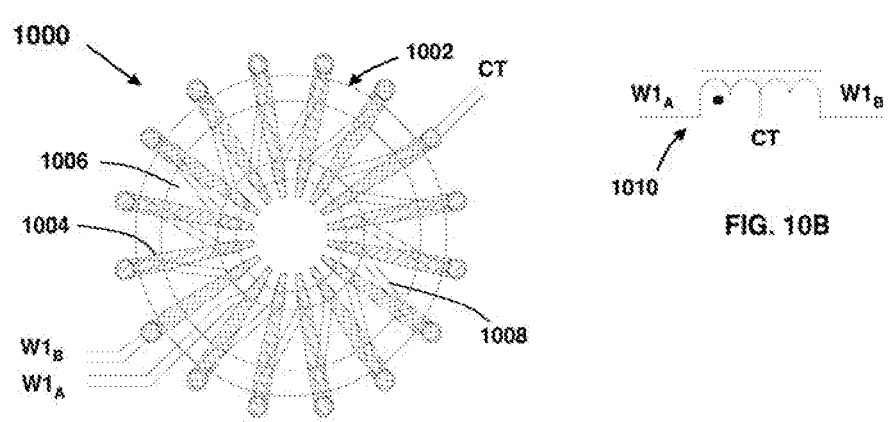
FIG. 10A
FIG. 10B

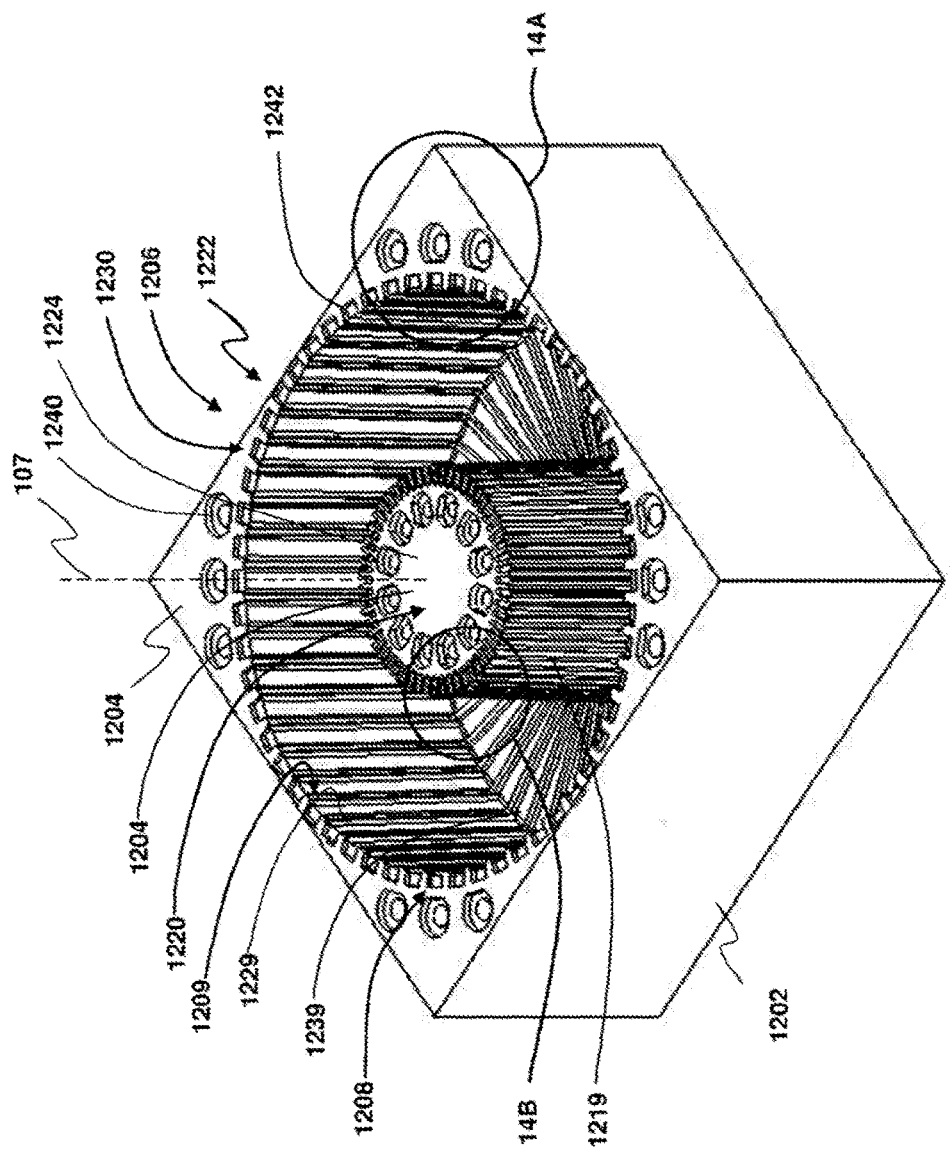

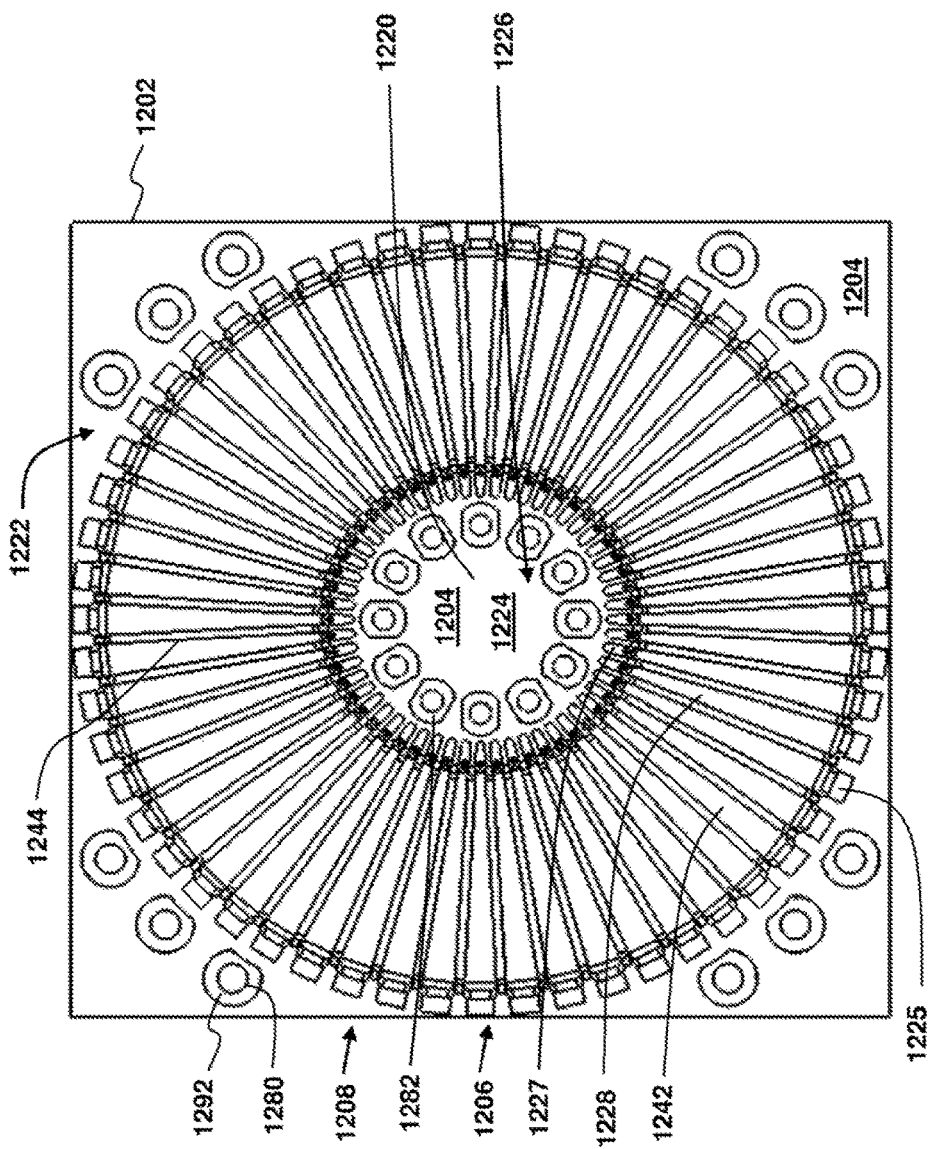

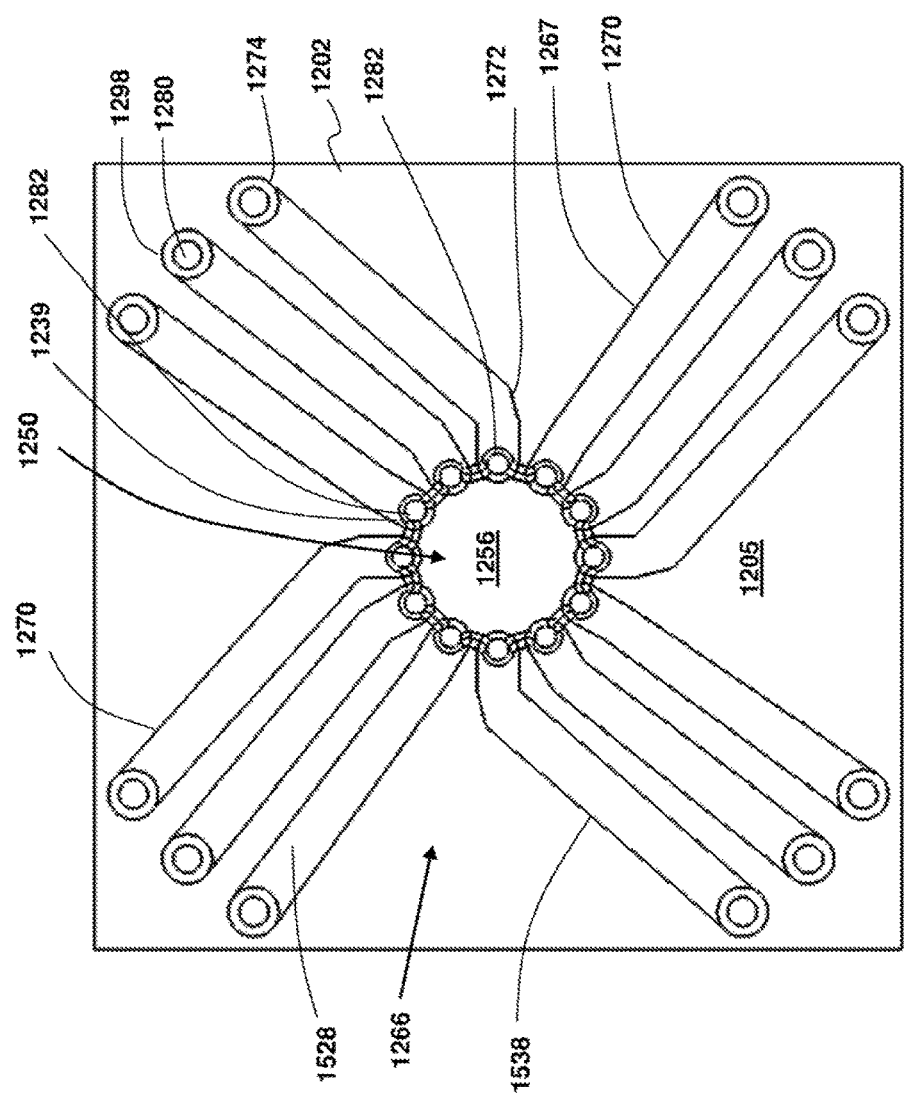

EMBEDDED MAGNETIC COMPONENTS AND METHODS

PRIORITY APPLICATIONS

This is a continuation-in-part application of and claiming priority to U.S. non-provisional patent application Ser. No. 12/329,887, filed on Dec. 8, 2008, which is a divisional application of U.S. non-provisional patent application Ser. No. 11/233,824, now U.S. Pat. No. 7,477,128, filed on Sep. 22, 2005; this is also a continuation-in-part application of and claiming priority to U.S. non-provisional patent application Ser. No. 14/891,645, filed on Nov. 16, 2015, which is a U.S. national phase application of PCT/US2009/052512, filed on Jul. 31, 2009. The entire disclosure of the referenced patent applications is considered part of the disclosure of the present application and is hereby incorporated by reference herein in its entirety.

FIELD

The disclosure generally relates to magnetic components having winding-type electrical circuits.

BACKGROUND

A wide range of electronic devices may have various magnetic components. Magnetic components may be capable of providing various functions. For example, magnetic components in electronic devices may function as transformers, inductors, filters, and so forth.

Commonly, in order to have magnetic properties, magnetic components may comprise an assembly of one or more wires wound around a material having permeability properties such as ferromagnetic material having a toroidal type shape, a rod type shape, etc. When a current is applied to the one or more wires, the component may produce a magnetic field, which may be utilized to address a wide range of electrical needs associated with electronic devices.

SUMMARY

In accordance with an embodiment, a magnetic component is provided comprising a base substrate defining a first base surface and a second base surface opposite the first base surface. The first base surface defines a winding cup depending therefrom having a shape of a closed groove surrounding a hub. The winding cup defines a winding cup surface. The hub defines a hub top surface that is substantially coplanar with the first base surface. The winding cup defines a core space operable to receive a core therein. A first conductive pattern is disposed on at least a portion of the first base surface, the winding cup surface, and the hub top surface. A second substrate defines a second substrate first side and a second substrate second side opposite the second substrate first side. A second conductive pattern is disposed on at least a portion of the second substrate second side. The second substrate is coupled to the first base surface and the hub top surface with the first conductive pattern in operable alignment with the second conductive pattern. The first conductive pattern and the second conductive pattern are coupled in electrical communication so as to define one or more winding-type electric circuits surrounding the core space so as to induce a magnetic flux within the core space when the one or more electric circuits are energized by a voltage source.

In accordance with another embodiment, the magnetic component further comprises a plurality of vias operable to electrically interconnect the first conductive pattern and the second conductive pattern wherein the vias extend from the second conductive pattern to the first conductive pattern through the second substrate.

In accordance with another embodiment, the magnetic component further comprises a core disposed within the core space so as to impart magnetic properties to the core when the one or more electric circuits are energized by a voltage source.

In accordance with another embodiment, the winding cup defines a groove of revolution about an axis that is perpendicular to the first base surface.

In accordance with another embodiment, the first base surface defines a winding cup periphery surface portion adjacent the winding cup. The hub top surface defines a hub periphery surface portion, wherein the first conductive pattern is at least partially disposed on at least a portion of the winding cup periphery surface portion and the hub periphery surface portion.

In accordance with another embodiment, the winding cup surface defines a winding cup bottom, a winding cup inner wall and a winding cup outer wall that are contiguous with the winding cup bottom. The hub extends from the first base surface to the winding cup bottom defining the winding cup inner wall. The winding cup surface defines a plurality of winding cup channels depending from the winding cup surface and defines winding cup lands between the winding cup channels. Each of the winding cup channels are continuous from the winding cup periphery surface portion to the hub periphery surface portion. The first conductive pattern comprises conductive material disposed within each of the winding cup channels defining a plurality of discontinuous first conductive traces extending from the winding cup periphery surface portion to the hub periphery surface portion. The winding cup lands define an electrically insulative separation between each first conductive trace.

In accordance with another embodiment, each of the first conductive traces comprise a trace hub end that is associated with the hub periphery surface portion and a trace winding cup periphery end that is associated with the winding cup periphery surface portion. The second conductive pattern comprises a plurality of discontinuous second conductive traces extending from about the axis. The second conductive traces comprise a second conductive trace first end adjacent the axis and a second conductive trace second end opposite the second conductive trace first end. The number of second conductive traces is predetermined by the number of first conductive traces and for a particular purpose. The second conductive pattern is operable to be associated with the first conductive pattern on both the hub periphery surface portion and the winding cup periphery surface portion. At least one trace hub end is electrically coupled to at least one second conductive trace first end and at least one trace winding cup periphery end is electrically coupled to at least one second conductive trace second end defining one or more winding-type electric circuits. Each of the one or more winding-type electric circuits has two opposite ends for coupling to a voltage source operable to complete an electrical circuit.

In accordance with another embodiment, the first conductive pattern and the second conductive pattern are in electrical communication so as to define one or more winding-type electric circuits beginning at a first terminal and terminating at a second terminal.

In accordance with another embodiment, the second conductive traces radiate from about the axis such that each of the second conductive trace first ends is aligned with each of the trace hub ends of a corresponding first conductive trace and each of the second conductive trace second ends is aligned with each of the trace winding cup periphery ends of an adjacent first conductive trace when the second substrate is coupled to the base substrate.

In accordance with another embodiment, the first conductive pattern and the second conductive pattern are in electrical communication so as to impart magnetic properties to the core operable for facilitating inductor-type functionality.

In accordance with another embodiment, the first conductive pattern and the second conductive pattern are in electrical communication so as to impart magnetic properties to the core operable for facilitating transformer-type functionality.

In accordance with another embodiment, the first conductive pattern and the second conductive pattern are in electrical communication so as to impart magnetic properties to the core operable for facilitating common mode-filter type functionality.

In accordance with another embodiment, the first conductive pattern and second conductive pattern are electrically interconnected so as to define four interleaved electrical paths operable for facilitating a dual common mode filter-type functionality, and wherein the magnetic properties of the core comprise magnetic properties operable for facilitating a dual common mode filter-type functionality.

In accordance with another embodiment, the first conductive pattern and second conductive pattern are electrically interconnected so as to define two interleaved electrical paths operable for facilitating a single common mode filter-type functionality, and wherein the magnetic properties of the core comprise magnetic properties operable for facilitating a single common mode filter-type functionality.

In accordance with another embodiment, the first conductive pattern and second conductive pattern are electrically interconnected so as to define two interleaved electrical paths operable for facilitating a single inductor-type functionality, and wherein the magnetic properties of the core comprise magnetic properties capable of facilitating a single inductor-type functionality.

In accordance with another embodiment, the first conductive pattern and second conductive pattern are electrically interconnected so as to define three interleaved electrical paths operable for facilitating a transformer-type functionality, and wherein the magnetic properties of the core comprise magnetic properties capable of facilitating a transformer-type functionality.

In accordance with another embodiment, the core space defines a tapered profile and wherein the core comprises a complimentary tapered profile, wherein the complimentary tapered profiles provide for self-alignment of the core within the core space.

In accordance with another embodiment, the magnetic component further comprises a hub recess depending from the second base surface. The hub recess has an axis substantially coaxial with that of the hub axis. A thermally-conductive element is disposed within the hub recess whereby thermal energy from the one or more winding-type electric circuits may be conducted away from the one or more winding-type electric circuits and into the thermally-conductive element.

In accordance with another embodiment, the magnetic component further comprises a third substrate including a third substrate first side and a third substrate second side opposite the third substrate first side. A third conductive pattern comprising at least one third conductive trace is disposed on at least a portion of the third substrate second side. Each third conductive trace has a hub end and a secondary channel end opposite the hub end. A secondary conductive pattern is disposed on at least a portion of the second base surface. The third substrate is coupled to the second substrate. The third conductive pattern and the secondary conductive pattern are in electrical communication so as to define one or more winding-type electric circuits surrounding the core space so as to impart magnetic properties to the core space when the one or more electric circuits are energized by a voltage source.

In accordance with another embodiment, the magnetic component further comprises a third substrate including a third substrate first side and a third substrate second side opposite the third substrate first side. A third conductive pattern comprising at least one third conductive trace is disposed on at least a portion of the third substrate second side. Each third conductive trace has a hub end and a secondary channel end opposite the hub end. At least one third hub via extends from the hub end of the third conductive trace to the third substrate first side. At least one third secondary channel via extends from the secondary channel end of the third conductive trace to the third substrate first side. A hub recess depends from the second base surface. The hub recess has an axis substantially coaxial with that of the hub axis. The hub recess defines a hub recess surface. The secondary conductive pattern is disposed on at least a portion of the second base surface and at least a portion of the hub recess surface. At least one hub recess via extends from the secondary conductive pattern disposed on at least a portion of the hub recess surface to the hub top surface. At least one secondary via extends from the secondary conductive pattern disposed on at least a portion of the second base surface to the first base surface. The second substrate further comprises pass-through vias extending from the second substrate first side to the second substrate second side and operable to electrically interconnect the third hub vias with the hub vias and to electrically interconnect the secondary channel vias with the secondary vias. The third substrate is coupled to the second substrate. The third conductive pattern and the secondary conductive pattern are in electrical communication so as to define one or more winding-type electric circuits surrounding the core space so as to impart magnetic properties to the core space when the one or more electric circuits are energized by a voltage source.

In accordance with another embodiment, the magnetic component further comprises a third substrate including a third substrate first side and a third substrate second side opposite the third substrate first side. A third conductive pattern comprises at least one third conductive trace disposed on at least a portion of the third substrate second side. Each third conductive trace has a hub end and a secondary channel end opposite the hub end. At least one third hub via extends from the hub end of the third conductive trace to the third substrate first side. At least one third secondary channel via extends from the secondary channel end of the third conductive trace to the third substrate first side. A hub recess depends from the second base surface. The hub recess has an axis substantially coaxial with that of the hub axis. The hub recess defines a hub recess side surface and a hub recess bottom surface. The hub recess side surface defines a plurality of hub recess channels depending from the hub recess side surface defining hub recess lands that extend from the hub recess bottom surface to the second base surface. The second base surface defines a plurality of second surface channels that extend from each of the hub recess channels and terminating at a second surface channel end. The magnetic component further comprises an electrically conductive material disposed in the hub recess channels and the second surface channels defining a secondary conductive winding pattern. The secondary conductive winding pattern defines a plurality of secondary traces. At least one hub recess via extends from each of the hub recess channels to the hub top surface. At least one secondary via extends from the second surface channel end to the first base surface. The second substrate further comprises pass-through vias extending from the second substrate first side to the second substrate second side and operable to electrically interconnect the third hub vias with the hub vias and to electrically interconnect the secondary channel vias with the secondary vias. The third substrate is coupled to the second substrate. The third conductive pattern and the secondary conductive pattern are in electrical communication so as to define one or more winding-type electric circuits surrounding the core space so as to impart magnetic properties to the core space when the one or more electric circuits are energized by a voltage source.

In accordance with an embodiment, a method for a magnetic component comprises providing a base substrate defining a first base surface and a second base surface opposite the first base surface, providing a winding cup depending from the first base surface having a shape of a closed groove surrounding a hub, the winding cup defining a winding cup surface, the hub defining a hub top surface that is substantially coplanar with the first base surface, the winding cup defining a core space operable to receive a core therein, disposing a first conductive pattern on at least a portion of the first base surface, the winding cup surface, and the hub top surface, providing a second substrate defining a second substrate first side and a second substrate second side opposite the second substrate first side, and disposing a second conductive pattern on at least a portion of the second substrate second side, providing a plurality of vias within the second substrate that extend from the second conductive pattern on the second substrate to the first conductive pattern on the base substrate, the vias comprising an electrically conductive material so as to provide electrical interconnects between the first conductive pattern and the second conductive pattern, coupling the second substrate to the first base surface and the hub top surface with the first conductive pattern in operable alignment with the second conductive pattern, and coupling the first conductive pattern and the second conductive pattern in electrical communication so as to define one or more winding-type electric circuits surrounding the core space so as to induce a magnetic flux within the core space when the one or more electric circuits are energized by a voltage source.

In accordance with another embodiment, the method for a magnetic component further comprises disposing a core of permeability material within the core space.

In accordance with another embodiment, the method for a magnetic component wherein disposing a winding cup further comprises disposing a winding cup defining a groove of revolution about an axis that is perpendicular to the first base surface.

In accordance with another embodiment, the method for a magnetic component wherein providing a base substrate further comprises providing a base substrate wherein the first base surface defines a winding cup periphery surface portion adjacent the winding cup and the hub top surface defining a hub periphery surface portion, and wherein disposing a first conductive pattern on at least a portion of the first base surface, the winding cup surface, and the hub top surface further comprises disposing the first conductive pattern on at least a portion of the winding cup periphery surface portion and the hub periphery surface portion.

In accordance with another embodiment, the method for a magnetic component further comprises wherein disposing a winding cup further comprises disposing a winding cup wherein the winding cup surface defines a winding cup bottom, a winding cup inner wall and a winding cup outer wall that are contiguous with the winding cup bottom, the hub extending from the first base surface to the winding cup bottom defining the winding cup inner wall.

In accordance with another embodiment, the method for a magnetic component further comprises wherein disposing a winding cup further comprises disposing a winding cup wherein the winding cup surface defines a plurality of winding cup channels depending from the winding cup surface and defining winding cup lands between the winding cup channels, each of the winding cup channels being continuous from the winding cup periphery surface portion to the hub periphery surface portion, wherein disposing a first conductive pattern further comprises disposing a first conductive pattern disposed within each of the winding cup channels defining a plurality of discontinuous first conductive traces extending from the winding cup periphery surface portion to the hub periphery surface portion, the winding cup lands defining an electrically insulative separation between each first conductive trace.

In accordance with another embodiment, the method for a magnetic component wherein disposing a first conductive pattern within each of the winding cup channels comprises disposing conductive material on the winding cup surface, and removing the conductive material on the winding cup lands.

In accordance with another embodiment, the method for a magnetic component wherein disposing a first conductive pattern further comprises disposing a first conductive pattern includes wherein each of the first conductive traces comprise a trace hub end that is associated with the hub periphery surface portion and a trace winding cup periphery end that is associated with the winding cup periphery surface portion, and wherein disposing a second conductive pattern further comprises disposing a second conductive pattern comprising a plurality of discontinuous second conductive traces extending from about the axis, the second conductive traces comprising a second conductive trace first end adjacent the axis and a second conductive trace second end opposite the second conductive trace first end, the number of second conductive traces is predetermined by the number of first conductive traces and for a particular purpose, the second conductive pattern is operable to be associated with the first conductive pattern on both the hub periphery surface portion and the winding cup periphery surface portion, and wherein coupling the first conductive pattern and the second conductive pattern comprises coupling at least one trace hub end to at least one second conductive trace first end and coupling at least one trace winding cup periphery end to at least one second conductive trace second end defining one or more winding-type electric circuits, each of the one or more winding-type electric circuits having two opposite ends operable for coupling to a voltage source operable to complete an electrical circuit.

In accordance with another embodiment, the method for a magnetic component wherein coupling the first conductive pattern and the second conductive pattern comprises coupling the first conductive pattern and the second conductive pattern so as to define at least one continuous winding-type electric circuits beginning at a first terminal and terminating at a second terminal.

In accordance with another embodiment, the method for a magnetic component wherein disposing a second conductive pattern further comprises disposing a second conductive pattern wherein the second conductive traces radiate from about the axis such that each of the second conductive trace first ends is aligned with each of the trace hub ends of a corresponding first conductive trace and each of the second conductive trace second ends is aligned with each of the trace winding cup periphery ends of an adjacent first conductive trace when the second substrate is coupled to the base substrate.

In accordance with another embodiment, the method for a magnetic component wherein coupling the first conductive pattern and the second conductive pattern in electrical communication further comprises coupling the first conductive pattern and the second conductive pattern in electrical communication so as to impart magnetic properties to the core operable for facilitating inductor-type functionality.

In accordance with another embodiment, the method for a magnetic component wherein coupling the first conductive pattern and the second conductive pattern in electrical communication further comprises coupling the first conductive pattern and the second conductive pattern in electrical communication so as to impart magnetic properties to the core operable for facilitating transformer-type functionality.

In accordance with another embodiment, the method for a magnetic component wherein coupling the first conductive pattern and the second conductive pattern in electrical communication further comprises coupling the first conductive pattern and the second conductive pattern in electrical communication so as to impart magnetic properties to the core operable for facilitating common mode-filter type functionality.

In accordance with another embodiment, the method for a magnetic component wherein coupling the first conductive pattern and the second conductive pattern in electrical communication further comprises coupling the first conductive pattern and the second conductive pattern in electrical communication so as to define four interleaved electrical paths operable for facilitating a dual common mode filter-type functionality, and wherein the magnetic properties of the core comprise magnetic properties operable for facilitating a dual common mode filter-type functionality.

In accordance with another embodiment, the method for a magnetic component wherein coupling the first conductive pattern and the second conductive pattern in electrical communication further comprises coupling the first conductive pattern and the second conductive pattern in electrical communication so as to define two interleaved electrical paths operable for facilitating a single common mode filter-type functionality, and wherein the magnetic properties of the core comprise magnetic properties operable for facilitating a single common mode filter-type functionality.

In accordance with another embodiment, the method for a magnetic component wherein coupling the first conductive pattern and the second conductive pattern in electrical communication further comprises coupling the first conductive pattern and the second conductive pattern in electrical communication so as to define two interleaved electrical paths operable for facilitating a single inductor-type functionality, and wherein the magnetic properties of the core comprise magnetic properties capable of facilitating a single inductor-type functionality.

In accordance with another embodiment, the method for a magnetic component wherein coupling the first conductive pattern and the second conductive pattern in electrical communication further comprises coupling the first conductive pattern and the second conductive pattern in electrical communication so as to define three interleaved electrical paths operable for facilitating a transformer-type functionality, and wherein the magnetic properties of the core comprise magnetic properties capable of facilitating a transformer-type functionality.

In accordance with another embodiment, the method for a magnetic component wherein disposing a winding cup further comprises disposing a winding cup defining a core space having an inwardly tapered profile, and wherein disposing a core further comprises disposing a core having a complimentary tapered profile to the winding cup, wherein the complimentary tapered profiles provide for self-alignment of the core within the core space.

In accordance with another embodiment, the method for a magnetic component further comprises providing a hub recess depending from the second base surface, the hub recess having an axis substantially coaxial with that of the hub axis, and disposing a thermally-conductive element within the hub recess whereby thermal energy from the one or more winding-type electric circuits may be conducted away from the one or more winding-type electric circuits and into the thermally-conductive element.

In accordance with another embodiment, the method for a magnetic component further comprises providing a third substrate including a third substrate first side and a third substrate second side opposite the third substrate first side, disposing a third conductive pattern comprising at least one third conductive trace on at least a portion of the third substrate second side, each third conductive trace having a hub end and a secondary channel end opposite the hub en, and disposing a secondary conductive pattern on at least a portion of the second base surface, coupling the third substrate to the second substrate, and coupling the third conductive pattern and the secondary conductive pattern in electrical communication so as to define one or more winding-type electric circuits surrounding the core space so as to impart magnetic properties to the core space when the one or more electric circuits are energized by a voltage source.

In accordance with another embodiment, the method for a magnetic component further comprises providing a third substrate including a third substrate first side and a third substrate second side opposite the third substrate first side, disposing a third conductive pattern comprising at least one third conductive trace on at least a portion of the third substrate second side, each third conductive trace having a hub end and a secondary channel end opposite the hub end, providing at least one third hub via extending from the hub end of the third conductive trace to the third substrate first side, providing at least one third secondary channel via extending from the secondary channel end of the third conductive trace to the third substrate first side, providing a hub recess depending from the second base surface, the hub recess having an axis substantially coaxial with that of the hub axis, the hub recess defining a hub recess surface, wherein disposing the secondary conductive pattern further comprises disposing the secondary conductive pattern on at least a portion of the second base surface and at least a portion of the hub recess surface, providing at least one hub recess via extending from the secondary conductive pattern disposed on at least a portion of the hub recess surface to the hub top surface, providing at least one secondary via extending from the secondary conductive pattern disposed on at least a portion of the second base surface to the first base surface, providing pass-through vias extending from the second substrate first side to the second substrate second side and operable to electrically interconnect the third hub vias with the hub vias and to electrically interconnect the secondary channel vias with the secondary vias, coupling the third substrate to the second substrate, and coupling the third conductive pattern and the secondary conductive pattern in electrical communication so as to define one or more winding-type electric circuits surrounding the core space so as to impart magnetic properties to the core space when the one or more electric circuits are energized by a voltage source.

In accordance with another embodiment, the method for a magnetic component further comprises providing a third substrate including a third substrate first side and a third substrate second side opposite the third substrate first side, disposing a third conductive pattern comprising at least one third conductive trace on at least a portion of the third substrate second side, each third conductive trace having a hub end and a secondary channel end opposite the hub end, providing at least one third hub via extending from the hub end of the third conductive trace to the third substrate first side, providing at least one third secondary channel via extending from the secondary channel end of the third conductive trace to the third substrate first side, providing a hub recess depending from the second base surface, the hub recess having an axis substantially coaxial with that of the hub axis, the hub recess defining a hub recess side surface and a hub recess bottom surface, the hub recess side surface defining a plurality of hub recess channels depending from the hub recess side surface defining hub recess lands that extend from the hub recess bottom surface to the second base surface, the second base surface defining a plurality of second surface channels that extend from each of the hub recess channels and terminating at a second surface channel end, disposing an electrically conductive material in the hub recess channels and the second surface channels defining a secondary conductive winding pattern, the secondary conductive winding pattern defining a plurality of secondary traces, providing at least one hub recess via extending from each of the hub recess channels to the hub top surface, providing at least one secondary via extending from the second surface channel end to the first base surface, providing pass-through vias extending from the second substrate first side to the second substrate second side and operable to electrically interconnect the third hub vias with the hub vias and to electrically interconnect the secondary channel vias with the secondary vias, coupling the third substrate to the second substrate, and coupling the third conductive pattern and the secondary conductive pattern in electrical communication so as to define one or more winding-type electric circuits surrounding the core space so as to impart magnetic properties to the core space when the one or more electric circuits are energized by a voltage source.

BRIEF DESCRIPTION OF THE DRAWINGS

Embodiments are illustrated by way of example and not by way of limitation in the figures of the accompanying drawings, in which like references may indicate similar elements and in which:

FIG. 8A is a circuit illustration as a superimposed image of another magnetic component in accordance with another embodiment;

FIG. 8B is a schematic related to the embodiment of FIG. 8A;

FIG. 9A is a circuit illustration as a superimposed image of another magnetic component in accordance with another embodiment;

FIG. 9B is a schematic related to the embodiment of FIG. 9A;

FIG. 10A is a circuit illustration as a superimposed image of another magnetic component in accordance with another embodiment;

FIG. 10B is a schematic related to the embodiment of FIG. 10A;

FIGS. 13A-D are top perspective, top, bottom perspective, and bottom views, respectively, of the base substrate of the embodiment of FIG. 12;

DETAILED DESCRIPTION

Figure 1A:
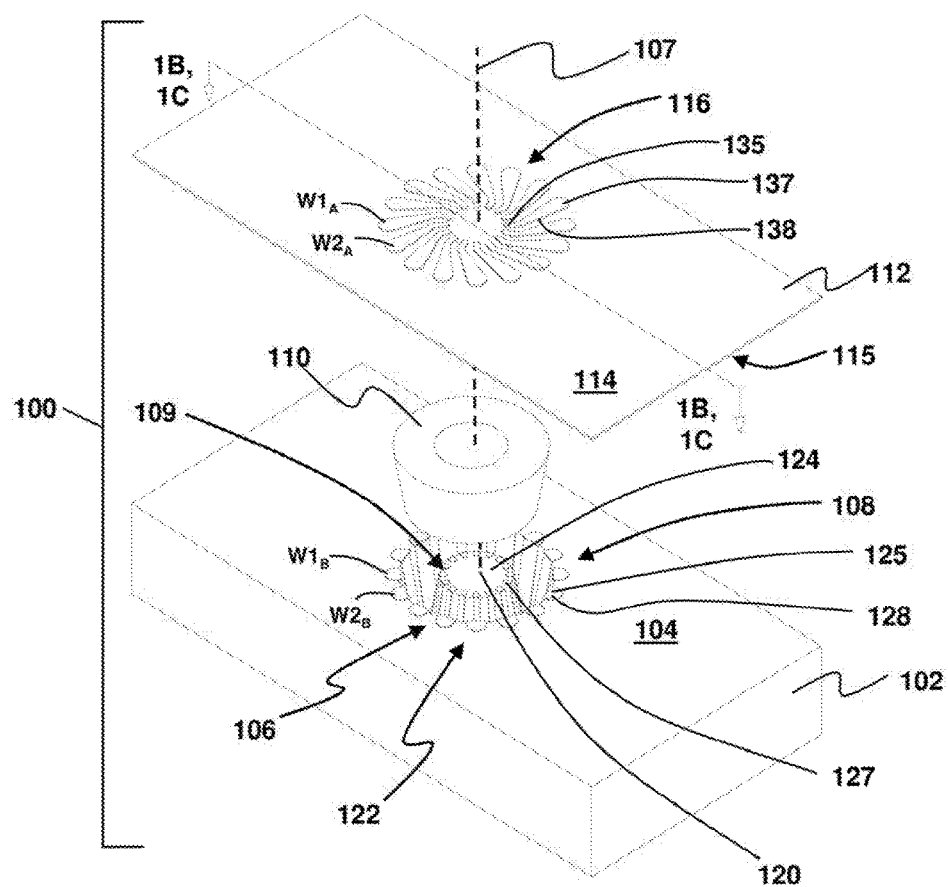
FIG. 1A is a perspective exploded view and FIG. 1B is a cross-sectional exploded view about line 1B-1B of a magnetic component in accordance with an embodiment.

In the following description, embodiments will be disclosed. For purposes of explanation, specific numbers, materials, and/or configurations are set forth in order to provide a thorough understanding of the embodiments. However, it will also be apparent to those skilled in the art that the embodiments may be practiced without one or more of the specific details, or with other approaches, materials, components, etc. In other instances, well-known structures, materials, and/or operations are not shown and/or described in detail to avoid obscuring the embodiments. Accordingly, in some instances, features are omitted and/or simplified in order to not obscure the disclosed embodiments. Furthermore, it is understood that the embodiments shown in the figures are illustrative representations and are not necessarily drawn to scale.

References throughout this specification to "one embodiment" or "an embodiment" means that a particular feature, structure, material, and/or characteristic described in connection with the embodiment is included in at least one embodiment. Thus, the appearances of the phrases "in one embodiment" and/or "in an embodiment" in various places throughout this specification are not necessarily all referring to the same embodiment. Furthermore, the particular features, structures, materials, and/or characteristics may be combined in any suitable manner in one or more embodiments.

For the purposes of the subject matter disclosed herein, substrates may include a wide range of substrates such as, but not limited to, plastic type substrates, metal type substrates, semiconductor type substrates, and so forth. Accordingly, it should appreciated by those skilled in the art that types of substrates may vary widely based at least in part on its application. However, for the purposes of describing the subject matter, references may be made to a substrate along with some example types, but the subject matter is not limited to a type of substrate. It is understood that the substrate provides a means to electrically insulate the conductive pattern, and therefore, an insulative substrate is known to be used in the art for electronic components. It is understood that an insulative layer may be used between the conductive pattern and the substrate wherein the substrate comprises an electrically conductive material. In embodiments presented herein, it is provided that the substrate is relatively electrically insulative for purposes of illustrating the subject matter.

For the purposes of the subject matter disclosed herein, reference to conductive pattern, conductive trace, circuit pattern and circuit trace, used interchangeable herein, refer to an electrically conductive material that defines an electric circuit pattern. Electric circuit patterns are well known, for example, in the printed circuit board arts.

For the purposes of the subject matter disclosed herein, reference to windings, winding-type electric circuits, and winding patterns, used interchangeable herein, refer to an electrically conductive material that defines an electric circuit pattern substantially analogous in function to a circuit comprising a wire that is wrapped around a mandrel.

For the purposes of the subject matter disclosed herein, reference to permeability material refers to a material making up a core of a magnetic component. For example, but not limited thereto, permeability material includes air and ferromagnetic material. As used herein, the term "core" refers to a solid or semisolid element of permeability material. The use of the term "air-core" refers to a void, such as, for example, that which might be used in an air-core transformer designed to transfer radio-frequency currents.

Additionally, for the purposes of describing various embodiments, references may be made to magnetic components. However, it should be appreciated by those skilled in the relevant art that magnetic components may include devices having one or more of a wide variety of magnetic functionality such as, but not limited to, transformer-type components, inductor-type components, filter-type components, and so forth, and accordingly, the claimed subject matter is not limited in scope in these respects.

Embodiments of magnetic components presented herein comprise a permeability material surrounded by one or more conductive patterns operable to facilitate magnetic properties of the permeability material when the one or more conductive patterns are electrically energized. Further, embodiments of methods of making magnetic components are presented herein.

Figure 1B:
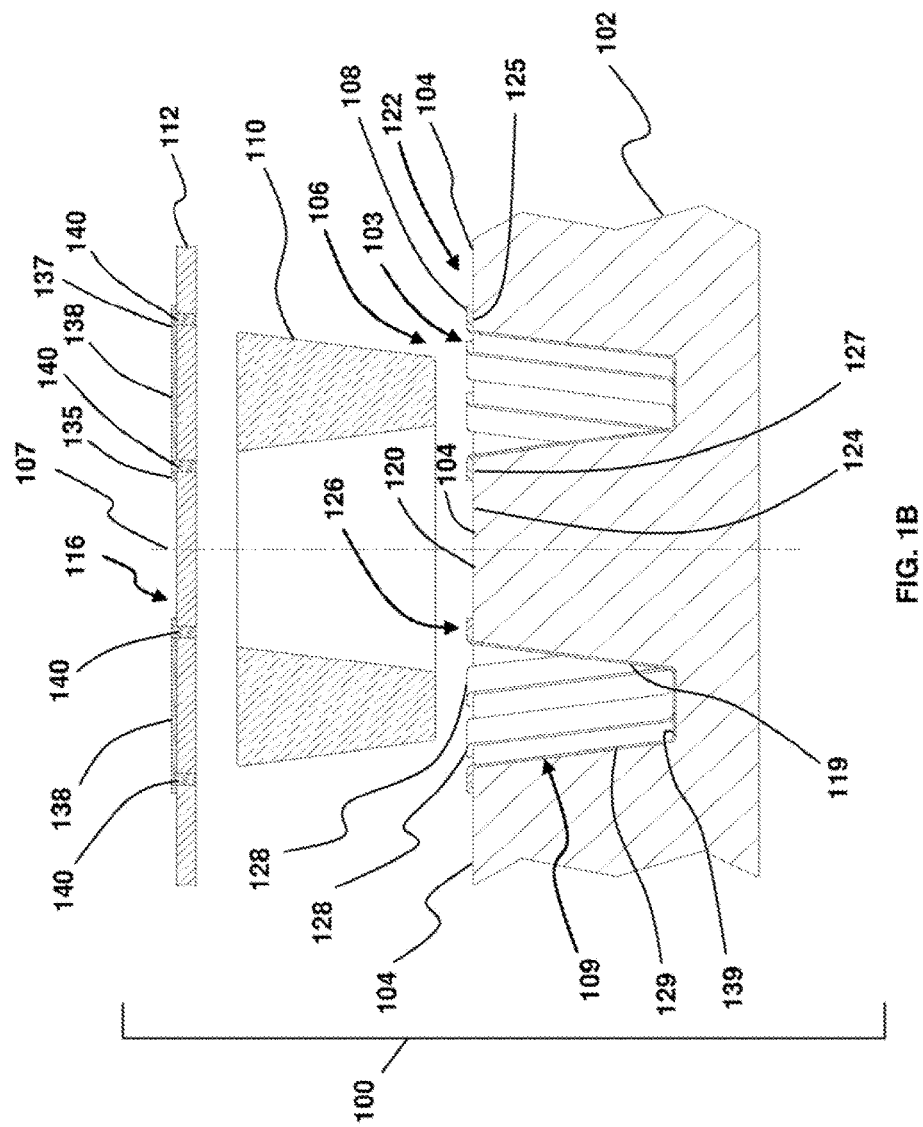

FIG. 1A is a perspective exploded view and FIG. 1B is a cross-sectional exploded view about line 1B-1B of a magnetic component 100 in accordance with an embodiment. The magnetic component 100 comprises a base substrate 102, a first conductive pattern 108, a permeability material 110, a second substrate 112, a second conductive pattern 116, and means for electrically coupling the first conductive pattern 108 and second conductive pattern 116.

The base substrate 102 comprises a base substrate first surface 104 and a feature 106. The first conductive pattern 108 is disposed on and about the feature 106. The permeability material 110 is disposed within the feature 106. The second substrate 112 comprises a second substrate first surface 115 and a second substrate second surface 114. The second substrate first surface 115 is disposed on the base substrate first surface 104, over the feature 106, and over the permeability material 110. The second conductive pattern 116 is disposed on the second substrate second surface 114 in cooperative alignment with the first conductive pattern 108. The first and second conductive patterns 108, 116 comprise an electrically conductive material. As will be further described below, the first conductive pattern 108 and the second conductive pattern 116 are electrically interconnected so as to electrically cooperate to be operable for facilitating magnetic properties of the permeability material 110 when electrically energized, in accordance with various embodiments.

It should be appreciated that FIGS. 1A and 1B illustrate an exploded view to describe an embodiment of the claimed subject matter, and accordingly, as will be described in further detail, the magnetic component 100 may have a permeability material 110 substantially enclosed within the feature 106, with the second substrate 112 substantially covering the permeability material 110. The electrically interconnected first conductive pattern 106 and second conductive pattern 116 surround the permeability material 110, thereby forming a winding-type relationship such as associated with a winding-type electric circuit, that cooperates in electrical communication when coupled to a voltage source. Such winding-type relationship is similar in function to known electrical devices in the art that comprise a wire-wrapped core configuration.

Continuing to refer to FIGS. 1A and 1B, the base substrate 102 is shown having a substantially rectangular-type shape. However, it should be appreciated that the base substrate 102 may have any type of shape such as, but not limited to, substantially circular, substantially oval, substantially square, or any other type of polygonal shape.

Additionally, the base substrate 102 may comprise many types of material suitable for use as a substrate, such as, but not limited to, material suitable for printed circuit boards (PCBs), various plastic-type materials, material suitable for injection molding, molded ceramic materials and so forth.

For example, in one embodiment, the base substrate 102 may comprise of a thermoplastic-type material such as, but not limited to, polyimide resin and polyetherimide (PEI)-type material. In another embodiment, the base substrate 102 may comprise of a plastic resin-type material that may be suitable for injection-type molding, compression molding, such as, but not limited to, liquid crystal polymer-type material. It should be appreciated by those skilled in the relevant art that the shape and materials described are merely examples, and the claimed subject matter is not limited in scope in these respects.

In the embodiment of FIGS. 1A and 1B, the feature 106 extends below a plane defined by the first surface 104. The feature 106 defines a toroidal-type shape depression, also referred herein as a groove of revolution about an axis 107, depending from the base substrate first surface 104 into the base substrate 102. The axis 107 is perpendicular to the plane defined by the base substrate first surface 104. The feature 106 defines a hub 120 having a hub top surface 124 that extends to the plane defined by the base substrate first surface 104. The feature 106 further defines a bottom wall 139 and an inner wall 119 and an outer wall 129 contiguous with the bottom wall 139 defining a feature wall surface 109. It is appreciated that in other embodiments, the inner wall 119 and outer wall 129 may be contiguous with no bottom wall 139 as dictated by design preference.

It should be appreciated by those skilled in the relevant art that the feature 106 may have a wide range of shapes such as, but not limited to, a rod-type shape, oval-type, oblong-type shape, and so forth, and accordingly, the claimed subject matter is not limited in scope in these respects. Some of these other feature shapes are presented below by way of example, and not limited thereto.

A variety of approaches may be utilized in order to facilitate formation of the feature 106 in the substrate 102. For example, in an embodiment, the feature 106 is formed by utilizing a lithography-type process such as, but not limited to photolithography. Photolithography is well known in the art in which selected regions of a material are removed so as to reveal underlying elements or produce three-dimensional structures in a substrate.

In other embodiments, the feature 106 may be formed by utilizing a machining-type process such as, but not limited to, a micromachining process, wherein material is selectively removed with a mechanical processes. Various approaches may be utilized to facilitate formation of a feature, and accordingly, the claimed subject matter is not limited to a particular approach.

As shown in FIGS. 1A and 1B, the feature 106 defines a feature periphery surface portion 122 on the base substrate first surface 104. The hub top surface 124 defines a hub periphery surface portion 126. The feature periphery surface portion 122 and the hub periphery surface portion 126 are those portions where a portion of the first conductive pattern 108 is disposed on the respective surfaces. The first conductive pattern 108 is disposed on a portion of the feature 106 and on a portion of the feature periphery surface portion 122 and the hub periphery surface portion 126. In the illustrated embodiment, the first conductive pattern 108 is disposed in a manner whereby the first conductive pattern 108 lines portions of the feature wall surface 109, the feature periphery surface portion 122 and the hub periphery surface portion 126.

A variety of methods may be utilized in order to dispose the first conductive pattern 108. In an embodiment, the first conductive pattern 108 is disposed by utilizing a stamping-type approach such as, but not limited to, stamping a conductive pattern from sheet material, forming the conductive pattern to conform to the shape characteristics of the feature, and coupling the conductive pattern to the feature such as, but not limited to, using adhesive or a molding process.

In another embodiment, the first conductive pattern 108 is disposed by utilizing a plating-type approach such as, but not limited to, chemical and/or electro-plating a conductive pattern on a substrate. In another embodiment, the first conductive pattern 108 is disposed by utilizing a lithography-type approach such as, but not limited to, photolithography. The photolithography process provided to first plate the substrate with conductive material, image a photo-resist and use photolithography and etching to produce the circuit pattern from the conductive material. In yet another embodiment, a structuring-type approach such as, but not limited to, laser structuring-type approach may be utilized to dispose the first conductive pattern 108, such as wherein a laser is used to prepare the surface for plating with a conductive material. Various other approaches may be utilized to dispose a conductive pattern, and accordingly, the claimed subject matter is not limited to a particular approach.

Referring again to FIGS. 1A and 1B, the inner wall 119 and outer wall 129 taper inward towards each other as they extend towards the bottom wall 139. Among other things, the taper ensures that the inner wall 119 and outer wall 129 are viewable by those conductive material deposition processes that require line-of-sight surface exposure.

For example, but not limited thereto, imaging techniques may be utilized to dispose the conductive pattern. An example of an imaging technique known in the art includes, but is not limited to, photolithography, which is a method for disposing two-dimensional circuit traces on a printed circuit board, for example. In conventional photolithography of a planar substrate, the surface to be treated must be viewable by an imaging device that projects imaging onto the substrate surface. Likewise, imaging techniques used to dispose the conductive pattern on the inner wall 119 and outer wall 129 requires the same to be viewable by the imaging device. To facilitate such imaging, in accordance with an embodiment as shown in FIGS. 1A and 1B, the inner wall 119 and outer wall 129 depend into the base substrate first surface 104 at an obtuse angle defining an inward-sloping configuration of the inner wall 119 and outer wall 129 which presents an imaging device a broader viewable area as compared with a more vertical orientation of the inner wall 119 and outer wall 129.

The first conductive pattern 108 and second conductive pattern 116 may comprise a wide variety of electrically conductive materials such as, but not limited to, copper, tin, aluminum, gold, and other various types of conductive tracing materials. Accordingly, the claimed subject matter is not limited in scope in these respects.

Figure 1C:
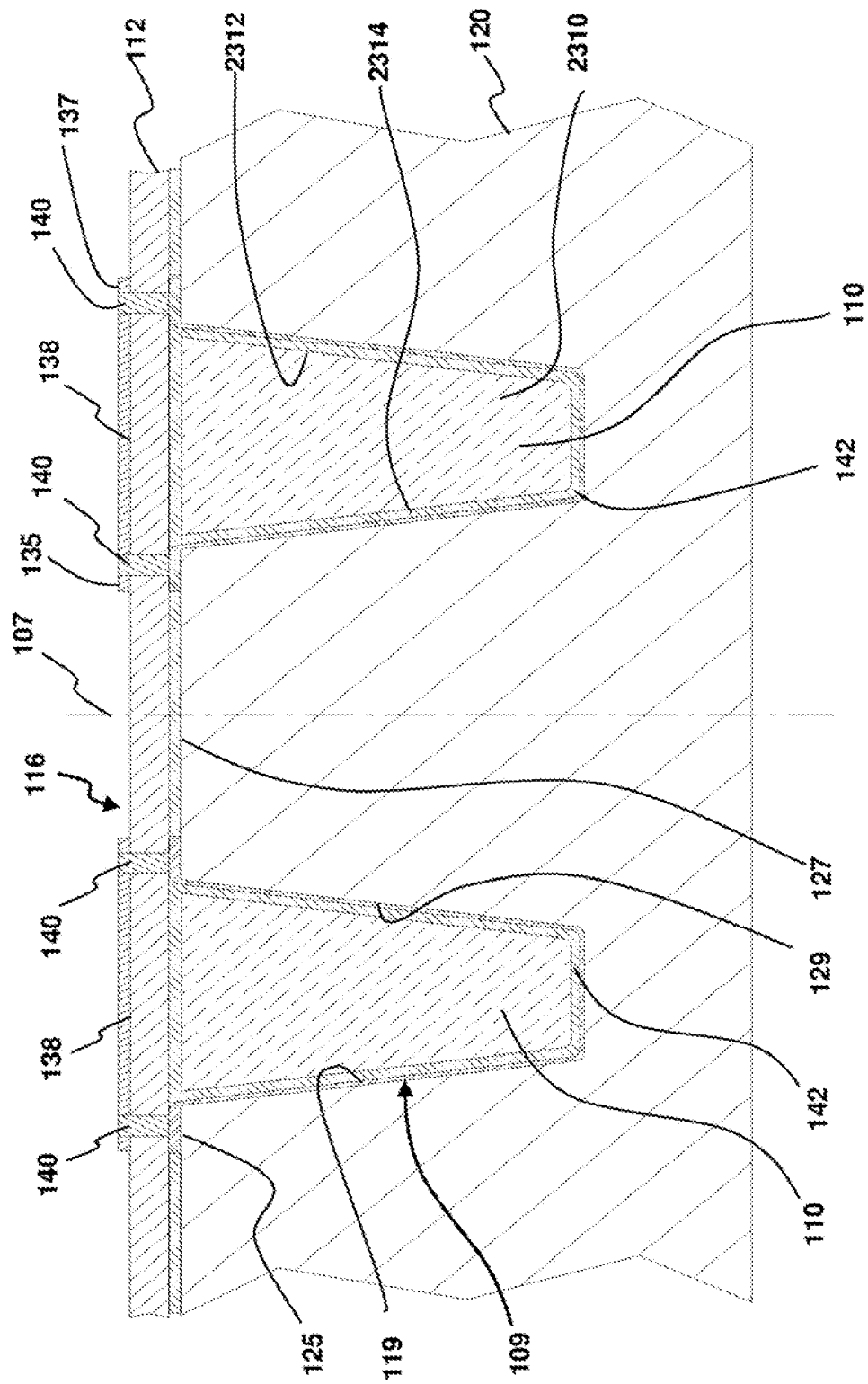
FIG. 1C is a cross-sectional view about cut line 1C-1C of the magnetic component of the embodiment of FIG. 1A.

In accordance with an embodiment, after the first conductive pattern 108 is disposed on the feature 106, the portion of the first conductive pattern 108 on the feature wall surface 109 may be covered with an electrically insulative layer (not shown), such as gap material 142 shown in FIG. 1C. The electrically insulative layer is operable, among other things, to prevent electrical shorting between the permeability material 110 and the first conductive pattern 108.

Continuing to refer to FIGS. 1A and 1B, the permeability material 110 is shown as having a shape defined at least in part by the shape of the feature 106. That is, in the embodiment of FIGS. 1A and 1B, the permeability material 110 comprises a substantially toroidal shape about the axis 107 that substantially fits within and corresponds to the toroidal shape of the feature 106. In the embodiment of FIGS. 1A and 1B, the permeability material 110 is shown as a separate solid object, where the solid object may be placed within the feature 106 by various methods such as, but not limited to, utilizing a pick and place machine. However, in another embodiment, the permeability material 110 may be of a liquid-type form whereby the liquid-type form may be poured into the feature 106 and subsequently cured to a solid mass. In another embodiment, the permeability material 110 may be in the form of a powder-type material whereby the powder-type material may be disposed into the feature 106. In yet another embodiment, the permeability material 110 may comprise of material that may be utilized with a vibration based type approach to facilitate placement of the permeability material substantially within the feature 106. That is, a method by which a vibration-type machine may be utilized. Accordingly, the claimed subject matter is not limited in scope in these respects.

The permeability material 110 may comprise a wide variety of materials such as, but not limited to, ferromagnetic-type materials that may include ferrite-type materials, iron-type materials, metal-type materials, metal alloy-type materials, and so forth. Additionally, the permeability material 110 may comprise materials based at least in part on the particular utilization of a magnetic component. For example, a magnetic component to be utilized as an isolation transformer may include a permeability material having a high relative permeability. In another example, a magnetic component to be utilized as a common mode filter may include a permeability material having a moderate relative permeability. Further, as previously alluded to, the size and shape of the permeability material 110 may be based at least in part on the utilization of the magnetic component as well. It is understood that other design parameters may be considered in the material type and method of forming the permeability material 110, such as, but not limited to, the coefficient of thermal expansion mismatch with the substrate that may be a factor in device production and use. Also, it is understood that an air-core may be used in certain embodiments. As used herein, the term "core" refers to a solid or semisolid element of permeability material. The use of the term "air-core" refers to a void, such as, for example, that which might be used in an air-core transformer designed to transfer radio-frequency currents. Accordingly, the claimed subject matter is not limited in scope in these respects.

FIG. 1C is a cross-sectional view about cut line 1C-1C of the magnetic component 100 of the embodiment of FIG. 1A. In accordance with embodiments, wherein the permeability material 110 is a solid element, after the permeability material 110 is disposed within the feature 106, a gap 142 may be defined between the permeability material 110 and the feature 106. This gap 142 may be filled with a gap filling material that is gap filling. The gap filling material is operable for, among other things, adhering the permeability material within the feature and to prevent shifting therein, electrically insulating the permeability material 110 from the first conductive pattern 108.

In FIGS. 1A-1C, for the purposes of describing the embodiment, the second substrate 112 may be shown as a relatively thin layer as compared to the base substrate 102. However, the second substrate 112 may be representative of one or more layers, such as, but not limited to, printed circuit layers disposed on the base substrate first surface 104 of the base substrate 102 and does not necessarily denote a single piece of substrate material, but it also could be a single piece of substrate material. The second substrate 112 may also be in a form of a sheet. Additionally, the second substrate 112 does not necessarily need to comprise the same material as the base substrate 102 and may comprise a different material. For example, in one embodiment, the second substrate 112 may include various lamination layers that facilitate build up of circuit layers. In another embodiment, a liquid-type material may be disposed on the base substrate 102 such as, but not limited to, a liquid dielectric-type material that is subsequently cured to at least a substantially rigid form. For example, a liquid-type dielectric-type material, such as a polyimide epoxy, may be disposed by utilizing at least one of a spray-type, roller-type, and/or a squeegee-type approach. A subsequent conductive foil layer may be laminated to the liquid dielectric-type material. It should be appreciated by those skilled in the relevant art that the second substrate 112 may be disposed on the base substrate first surface 104 of the base substrate 102 by a wide variety of approaches. Accordingly, the claimed subject matter is not limited to any one particular approach.

In the embodiment illustrated in FIGS. 1A-1C, the second conductive pattern 116 is shown on the substrate material second surface 114 of the second substrate 112. As previously described, the second conductive pattern 116 may be disposed on the second substrate 112 utilizing a variety of approaches such as, but not limited to, a lamination approach, lithography approach, etching approach, a screen printing-type approach, a laser structuring-type approach, and so forth. That is, the second conductive pattern 116 may be disposed as part of the process of providing the second substrate 112, and accordingly, the claimed subject matter is not limited in these respects.

In an embodiment, the second conductive pattern 116 is disposed by utilizing a stamping-type approach such as, but not limited to, stamping a conductive pattern from sheet material and coupling the conductive pattern to a substrate material, such as, but not limited to, using adhesive or embedding or over-molding the conductive pattern into the second substrate second surface 114 during a molding process.

In the embodiment of FIGS. 1A-1C, the second conductive pattern 116 comprises a complimentary pattern to the first conductive pattern 108 so as to cooperate electrically to facilitate electrical "wrapping" of the permeability material 110 between the first conductive pattern 108 and the second conductive pattern 116. Additionally, the first conductive pattern 108 and the second conductive pattern 116 are electrically coupled, such as by one or more vias and/or interconnects 140, as will be described in detail. Further, the first conductive pattern 108 and the second conductive pattern 116 are electrically coupled together to define one or more electrical circuits each having a positive terminal W1A, W2A and a negative terminal W1B, W2B, corresponding to the two electrical circuit embodiment of FIGS. 6A and 6B, suitable for coupling to a voltage source and/or other external components.

Together, the first conductive pattern 108 and the second conductive pattern 116 electrically cooperate to be capable of facilitating magnetic properties of the permeability material 110 when coupled to a voltage source and/or other external components. For example, the first conductive pattern 108 and the second conductive pattern 116 cooperate to be capable of inducing a magnetic field upon the permeability material 110 when the first and second conductive patterns 108, 116 are electrically coupled to a voltage potential.

Figure 2A:
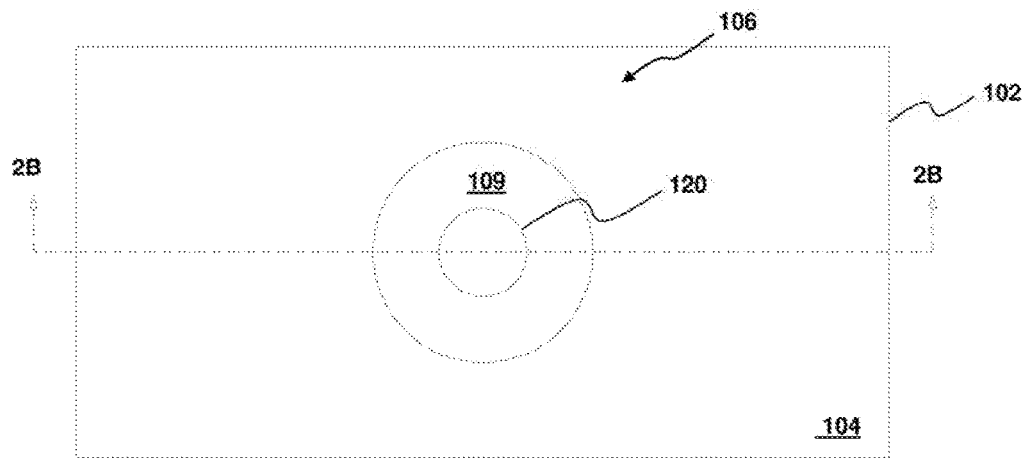
FIGS. 2A and 2B are top and cross-sectional views about line 2B-2B, respectively, of the base substrate in accordance with the embodiment of FIGS. 1A and 1B.
Figure 2B:
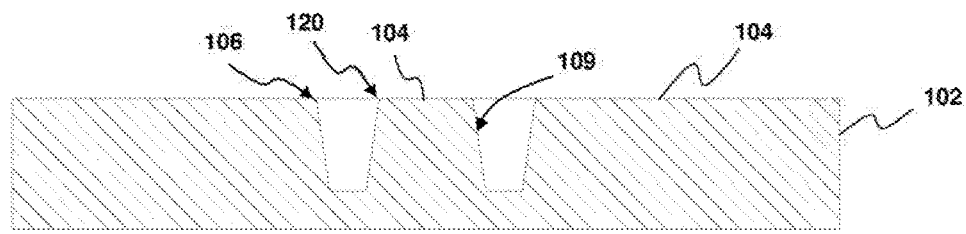

FIGS. 2A and 2B are top and cross-sectional views about line 2B-2B, respectively, of the base substrate 102 in accordance with the embodiment of FIGS. 1A and 1B. In FIG. 2A, the base substrate 102 comprises the base substrate first surface 104 and the feature 106. As shown in FIG. 2B, the feature 106 depends from the base substrate first surface 104 into the base substrate 102. In this embodiment, the feature 106 comprises a substantially toroidal shape formed as a depression-type feature into the base substrate 102 and defining the hub 120.

Figure 3:
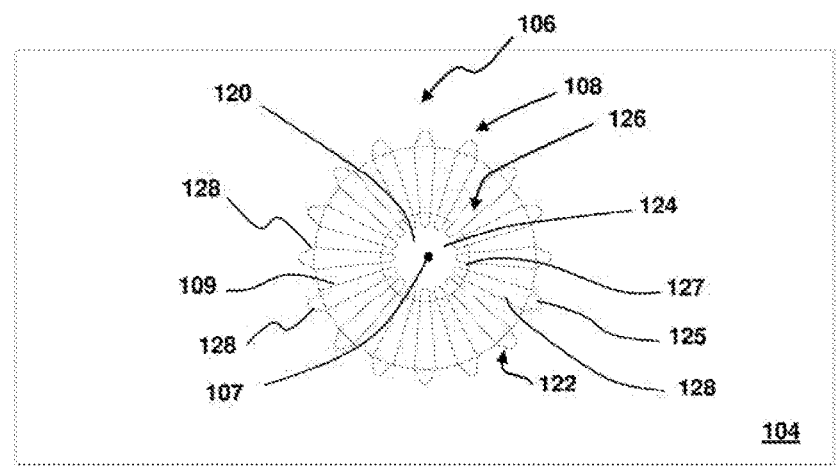
FIG. 3 is a top view of the base substrate and the first conductive pattern in accordance with the embodiment of FIGS. 1A and 1B.

FIG. 3 is a top view of the base substrate 102 and the first conductive pattern 108 in accordance with the embodiment of FIGS. 1A and 1B. The base substrate 102 comprises the base substrate first surface 104 and the feature 106. The first conductive pattern 108 is disposed within the feature 106 and on the feature periphery surface portion 122 and on the hub periphery surface portion 126. The first conductive pattern 108 comprises a plurality of discontinuous first conductive traces 128 radiating from about the axis 107. The first conductive traces 128 are disposed from the hub periphery surface portion 126 to the feature periphery surface portion 122 along the inside surface 109 therebetween, also as shown in FIGS. 2A and 2B. Each of the first conductive traces 128 comprise a trace hub end 127 that is associated with the hub periphery surface portion 126 and a trace feature end 125 that is associated with the feature periphery surface portion 122.

Referring again to FIG. 1A, the second conductive pattern 116 comprises a plurality of discontinuous second conductive traces 138 radiating from about the axis 107. Second conductive traces 138 comprise a first trace end 135 positioned closest to the axis 107 and a second trace end 137, opposite the first trace end 135. The number of second conductive traces 138 is determined by the number of first conductive traces 128 and for a particular purpose. In accordance with embodiments, including that shown in FIG. 1A, the number of second conductive traces 138 are equal to the number of first conductive traces 128. In the embodiment of FIG. 1A, the second conductive traces 138 radiate from about the axis 107 such that a first trace end 135 is aligned above a trace hub end 127 of a first conductive trace 128, and a second trace end 137 is aligned above a trace feature end 125 of an adjacent first conductive trace 128 when the second conductive pattern 116 and the second substrate 112 are coupled to the base substrate 102.

Electrical interconnects 140, as shown in FIG. 1B, are provided between the respective first trace end 135 and the trace hub end 127 and the second trace end 137 and the trace feature end 125 affecting an electrical coupling therebetween. Electrical interconnects 140 may also be referred to as vias, which are known in the art. The interconnection of the first conductive pattern and the second conductive pattern define a winding-type electric circuit around the permeability material 110. In accordance with an embodiment, the magnetic component 100 provides wherein the first conductive pattern 108 and second conductive pattern 116 are electrically coupled so as to define at least one continuous winding beginning at a first electrical tap W1 and terminating at a second electrical tap W2, such as shown in FIG. 1A, which are operable to be coupled to a voltage source.

Figure 4:
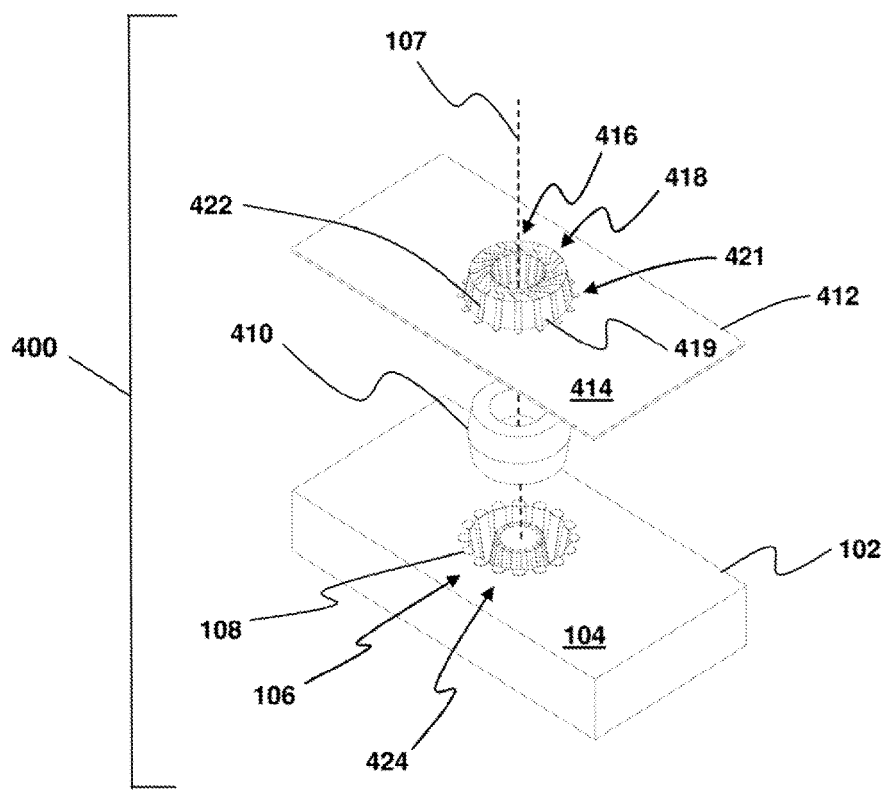
FIG. 4 illustrates a perspective exploded view of a magnetic component in accordance with another embodiment.

FIG. 4 illustrates a perspective exploded view of a magnetic component 400 in accordance with another embodiment. In FIG. 4, similar to the magnetic component 100, shown in FIGS. 1A and 1B, the magnetic component 400 includes a substrate 102, a first surface 104, a first feature 106, a first conductive pattern 108, a substrate material 412, a second surface 414, and a second conductive pattern 416. However, in this embodiment, a permeability material 410 is relatively large based at least in part on its application. Accordingly, a second feature 418 depending from the second surface 414 is formed in the substrate material 412 to facilitate accommodation of a portion of the permeability material 410 that depends above the first surface 104.

The second feature 416 defines a second groove of revolution 422 about an axis 107 perpendicular to the second surface 414. The second groove of revolution 422 defines a second groove surface 419 surrounding a second groove hub (hidden from view) including a second groove periphery 421 of the second surface 414. The substrate material 412 further includes the second conductive pattern 416 disposed on the second feature 418. The substrate 102 and substrate material 412 are placed in cooperative engagement so as to define a cavity 424 defined by the first groove of revolution 122 and the second groove of revolution 422.

As shown, the second conductive pattern 414 is disposed to at least partially cover an outer surface 419 of the second feature 418 and about a second groove periphery 421 of the second surface 414 so as to substantially correspond to complementary elements on the substrate 102. As previously described, second conductive pattern 414 and the first conductive pattern 108 are electrically interconnected suitable for a particular purpose substantially as described above.

Figure 5A:
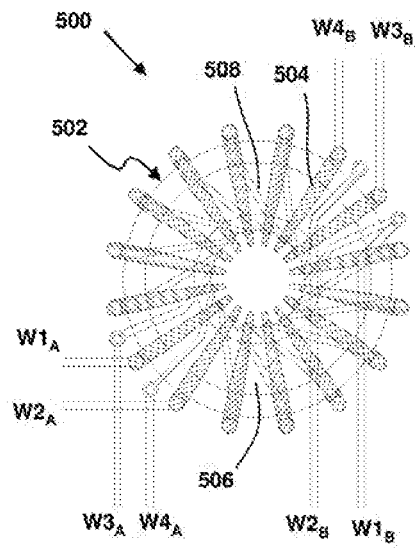
FIG. 5A is a circuit illustration as a superimposed image of a magnetic component in accordance with an embodiment.
Figure 5B:
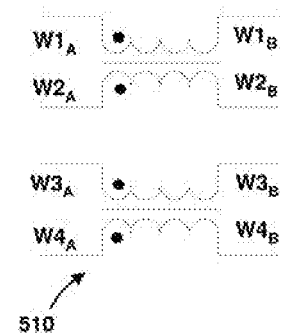
FIG. 5B is a schematic related to the embodiment of FIG. 5A.

Embodiments of magnetic components are provided below by way of example only, and the embodiments in accordance with the disclosed subject matter are not limited thereto FIG. 5A is a circuit illustration as a superimposed image of an embodiment of a magnetic component 500 including a base substrate (not shown) having a feature 502, a first conductive pattern 504, a permeability material 506, a second substrate (not shown), and a second conductive pattern 508. The first conductive pattern 504 and the second conductive pattern 508 are electrically interconnected so as to define four interleaved electrical paths capable of facilitating a dual common mode filter-type functionality. FIG. 5B is a dual common mode filter schematic 510 representative of the functionality of the embodiment of FIG. 5A. It should be appreciated that the substrate and substrate material are not shown in order to better illustrate the embodiment, and in particular, the interrelationship between the first conductive pattern 504 and the second conductive pattern 508.

The first conductive pattern 504 and second conductive pattern 508 define four circuits. A first circuit terminates at electrical taps W1A and W1B suitable for coupling with a voltage source. A second circuit terminates at electrical taps W2A and W2B suitable for coupling with a voltage source. A third circuit terminates at electrical taps W3A and W3B suitable for coupling with a voltage source. A fourth circuit terminates at electrical taps W4A and W4B suitable for coupling with a voltage source. The dots shown in FIG. 5B indicate that, in this embodiment, both W1A and W1B have the same polarity, that is, the same winding orientation. The interaction of the first and second circuits with the core and the interaction of the third and fourth circuits with the permeability material 506, and in combination, are represented schematically in FIG. 5B.

Figure 6A:
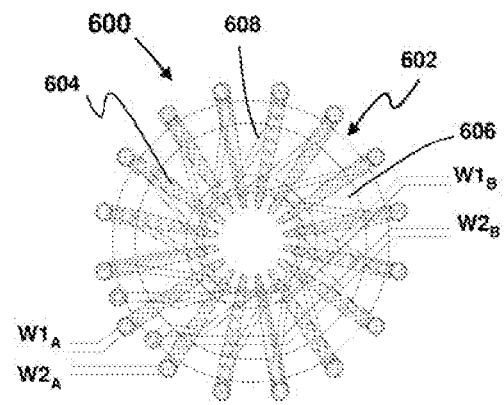
FIG. 6A is a circuit illustration as a superimposed image of another magnetic component in accordance with another embodiment.
Figure 6B:
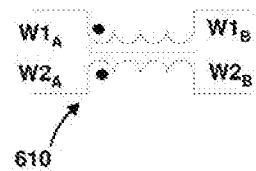
FIG. 6B is a schematic related to the embodiment of FIG. 6A.

FIG. 6A is a circuit illustration as a superimposed image of a magnetic component 600 in accordance with another embodiment. In FIG. 6A, the magnetic component 600 includes a base substrate (not shown) having a feature 602, a first conductive pattern 604, a permeability material 606, a second substrate (not shown), and a second conductive pattern 608. The first conductive pattern 604 and the second conductive pattern 608 are electrically interconnected so as to define two interleaved electrical paths capable of facilitating single common mode filter-type functionality. FIG. 6B is a single common mode filter schematic 610 representative of the functionality of the embodiment of FIG. 6A. It should be appreciated that the substrate and substrate material are not shown in order to better illustrate the embodiment, and in particular, the interrelationship between the first conductive pattern 604 and the second conductive pattern 608.

The first conductive pattern 604 and second conductive pattern 608 define two circuits. A first circuit terminates at electrical taps W1A and W1B suitable for coupling with a voltage source. A second circuit terminates at electrical taps W2A and W2B suitable for coupling with a voltage source. The interaction of the first and second circuits with the permeability material 606, and in combination, are represented schematically in FIG. 6B.

Figure 7A:
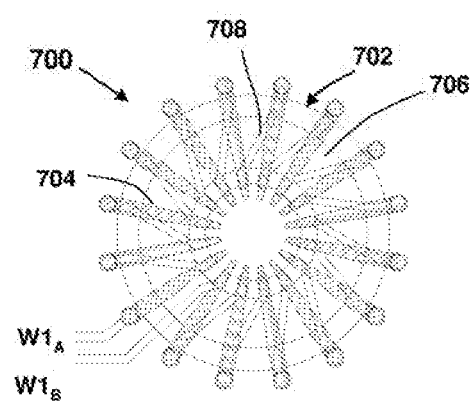
FIG. 7A is a circuit illustration as a superimposed image of another magnetic component in accordance with another embodiment.
Figure 7B:
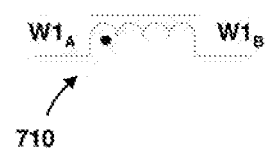
FIG. 7B is a schematic related to the embodiment of FIG. 7A.

FIG. 7A is a circuit illustration as a superimposed image of a magnetic component 700 in accordance with another embodiment. In FIG. 7A, the magnetic component 700 includes a base substrate (not shown) having a feature 702, a first conductive pattern 704, a permeability material 706, a second substrate (not shown), and a second conductive pattern 708. The first conductive pattern 704 and the second conductive pattern 708 are electrically interconnected so as to define one electrical path capable of facilitating a single inductor-type functionality. FIG. 7B is a single inductor schematic 710 representative of the functionality of the embodiment of FIG. 7A. The first conductive pattern 704 and the second conductive pattern 708 defines one circuit. The circuit terminates at electrical taps W1A and W1B suitable for coupling with a voltage source. It should be appreciated that the substrate and substrate material are not shown in order to better illustrate the embodiment, and in particular, the interrelationship between the first conductive pattern 704 and the second conductive pattern 708. The interaction of the circuit with the permeability material 706 is represented schematically in FIG. 7B.

FIG. 8A is a circuit illustration as a superimposed image of a magnetic component 800 in accordance with another embodiment. In FIG. 8A, the magnetic component 800 includes a base substrate (not shown) having a feature 802, a first conductive pattern 804, a permeability material 806, a second substrate (not shown), and a second conductive pattern 808. The first conductive pattern 804 and the second conductive pattern 808 are electrically interconnected so as to define two interleaved electrical paths capable of facilitating a transformer-type functionality. FIG. 8B an isolation transformer schematic 810 representative of the functionality of the embodiment of FIG. 8A. It should be appreciated that the substrate and substrate material are not shown in order to better illustrate the embodiment, and in particular, the interrelationship between the first conductive pattern 804 and the second conductive pattern 808.

The first conductive pattern 804 and second conductive pattern 808 define two circuits, each having a center electrical tap CT1, CT2. A first circuit terminates at electrical taps W1A and W1B suitable for coupling with a voltage source, with a center electrical tap CT1 substantially therebetween. A second circuit terminates at electrical taps W2A and W2B suitable for coupling with a voltage source, with a center electrical tap CT2 substantially therebetween. The interaction of the first and second circuits with the permeability material 806, and in combination, are represented schematically in FIG. 8B.

FIG. 9A is a circuit illustration as a superimposed image of a magnetic component 900 in accordance with another embodiment. In FIG. 9A, the magnetic component 900 includes a base substrate (not shown) having a feature 902, a first conductive pattern 904, a permeability material 906, a second substrate (not shown), and a second conductive pattern 908. The first conductive pattern 904 and the second conductive pattern 908 electrically cooperate so as to be capable of facilitating magnetic properties of the permeability material 906, and in this particular embodiment, magnetic component 900 may be capable of being utilized as three-wire common mode choke (i.e., a three-wire common mode choke-type functionality). FIG. 9B is a three-wire common mode choke schematic 910 representative of the functionality of the embodiment of FIG. 9A. It should be appreciated that the substrate and substrate material are not shown in order to better illustrate the embodiment, and in particular, the interrelationship between the first conductive pattern 904 and the second conductive pattern 908.

The first conductive pattern 904 and second conductive pattern 908 define three circuits. A first circuit terminates at electrical taps W1A and W1B suitable for coupling with a voltage source. A second circuit terminates at electrical taps W2A and W2B suitable for coupling with a voltage source. A third circuit terminates at electrical taps W3A and W3B suitable for coupling with a voltage source. The interaction of the first, second and third circuits with the permeability material 906, and in combination, are represented schematically in FIG. 9B.

The three-wire common choke is particularly useful for the Ethernet application. While the embodiment of FIG. 9A illustrates a three-wire choke, it is appreciated that a similar winding configuration may be utilized to make a 4-wire choke, 5-wire choke, on up to n-wire choke. Multi-winding chokes may be useful in applications for particular purposes.

FIG. 10A is a circuit illustration as a superimposed image of a magnetic component 1000 in accordance with another embodiment. In FIG. 10A, the magnetic component 1000 includes a base substrate (not shown) having a feature 1002, a first conductive pattern 1004, a permeability material 1006, a second substrate (not shown), and a second conductive pattern 1008. The first conductive pattern 1004 and the second conductive pattern 1008 electrically cooperate so as to be capable of facilitating magnetic properties of the permeability material 1006, and in this particular embodiment, magnetic component 1000 may be capable of being utilized as a center-tapped inductor (i.e., a center-tapped inductor-type functionality). FIG. 10B a center-tapped inductor schematic 1010 representative of the functionality of the embodiment of FIG. 10A. It should be appreciated that the substrate and substrate material are not shown in order to better illustrate the embodiment, and in particular, the interrelationship between the first conductive pattern 1004 and the second conductive pattern 1008.

The first conductive pattern 1004 and second conductive pattern 1008 define one circuit having a center electrical tap. The circuit terminates at electrical taps W1A and W1B suitable for coupling with a voltage source, with a center electrical tap CT1 substantially therebetween. The interaction of the circuit with the permeability material 1006, is represented schematically in FIG. 10B.

The above embodiments are simply examples of various modes of electrical interconnection of the first and second conductive patterns and are not limited thereto.

In various embodiments, one or more magnetic components may be formed on a single substrate. Additionally, because the magnetic properties of a magnetic component may be based at least in part on its conductive pattern, its feature size, permeability material utilized, and/or so forth, more than a single type of magnetic component may be formed from a single substrate, and accordingly, the claimed subject matter is not limited in these respects.

Figure 11:
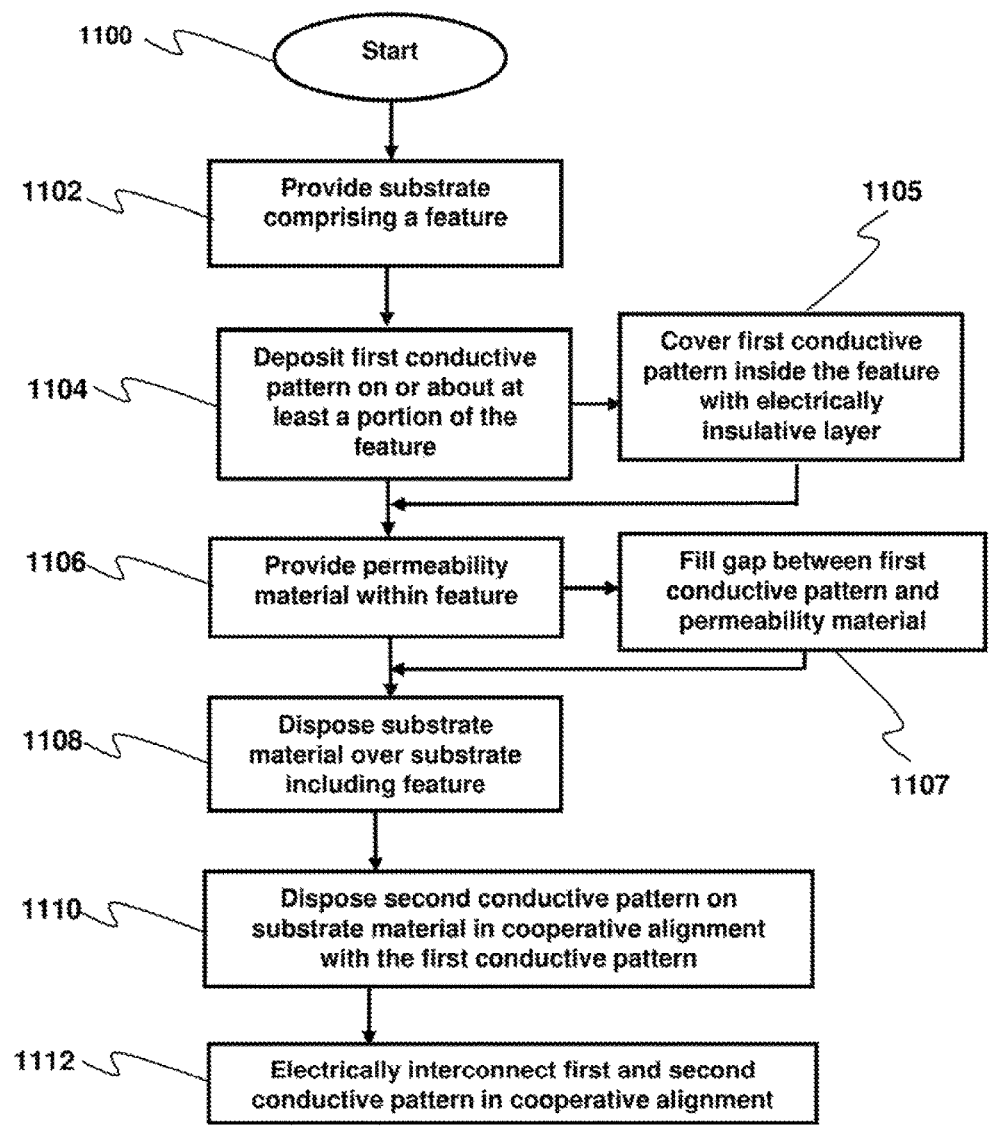
FIG. 11 is a flow diagram of an embodiment of a process for producing a magnetic component.

FIG. 11 is a flow diagram of an embodiment of a process 1100 for producing a magnetic component. The process 1100 comprises providing a substrate including a feature 1102. As previously described, the substrate may be of wide variety of materials that may be utilized to PCBs. The substrate includes the feature formed on the substrate utilizing a wide variety of approaches as previously described. A first conductive pattern is disposed on and about at least a portion of the feature and the substrate 1104. A permeability material is disposed within the feature 1106. A substrate material is disposed over the permeability material and the substrate 1108. A second conductive pattern is disposed on the substrate material 1110 and electrically coupled to the first conductive pattern, thereby facilitating a one or more winding-type electric circuits of the conductive patterns around the permeability material 1112.

In accordance with another embodiment of the process 1100, after the conductive pattern is disposed over the feature and the substrate 1104, the conductive pattern is covered with an electrically insulative layer 1105. The electrically insulative layer is operable, among other things, to prevent electrical shorting between the permeability material and the first conductive pattern.

In accordance with another embodiment of the process 1100, after the permeability material is disposed within the feature 1106, the gap defined between the permeability material and the feature is filled with an electrically insulative material 1107. The gap filling material is operable for, among other things, fixing the permeability material within the feature and to prevent shifting thereof.

In some of the above embodiments the feature is provided with tapered sidewalls so as to allow for line-of-sight-dependent conductive material deposition processes. Further embodiments are presented below wherein magnetic components need not have features having tapered sidewalls.

Figure 12:
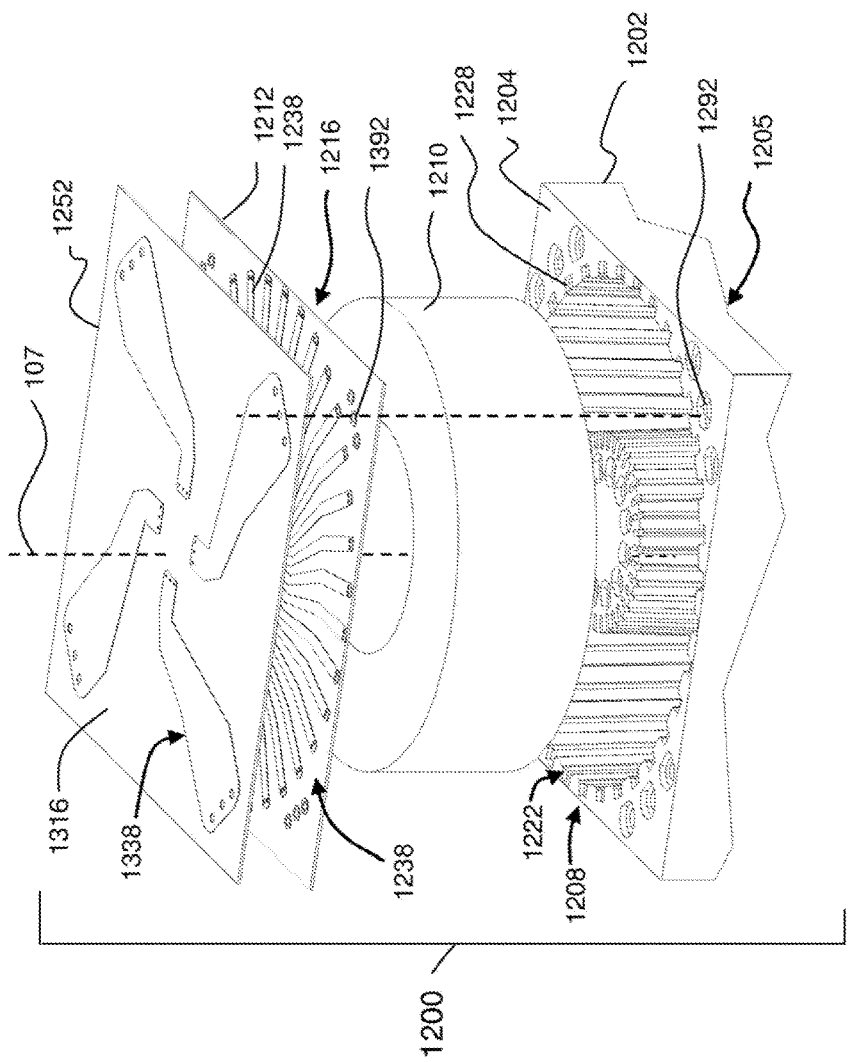
FIG. 12 is an exploded perspective view of an embodiment of a magnetic component.

FIG. 12 is an exploded perspective view of an embodiment of a magnetic component 1200. The magnetic component 1200 comprises a base substrate 1202, a first conductive pattern 1208, a core 1210, a second substrate 1212, a second conductive pattern 1216, a third substrate 1252, a third conductive pattern 1256 and a secondary conductive pattern hidden from view. As will be described in detail below, conductive patterns formed on the base substrate 1202, the second substrate 1216, and third substrate 1252 define one or more winding-type electric circuits surrounding the core 1210 so as to impart magnetic properties to the core 1210 when the one or more electric circuits are energized by a voltage source.

The embodiment of FIG. 12 illustrates the modularity of the methods and apparatus of magnetic components in accordance with embodiments of the disclosed subject matter. This modularity provides the flexibility of producing magnetic components having predetermined functionality. By way of example, providing the third substrate 1252 as shown in FIG. 12, is useful, by way of example but not limited thereto, for providing power transformer functionality to the magnetic component, where there is defined a primary and secondary winding. By way of another example, only the base substrate 1202 and second substrate 1216 may be used, by way of example but not limited thereto, for providing inductor functionality to the magnetic component, where only a primary or single winding is defined.

The second substrate 1212 and third substrate 1252 are substantially similar to the second substrate 112 of the embodiment of FIG. 1A. Similarly, as previously described, the second conductive pattern 1216 and third conductive pattern 1256 may be disposed on the second substrate 1212 and third substrate 1152, respectively, utilizing a variety of approaches such as, but not limited to, a lamination approach, lithography approach, etching approach, a screen printing-type approach, a laser structuring-type approach, molding approach, and so forth. That is, the second conductive pattern 1216 and third conductive pattern 1256 may be disposed as part of the process of providing the second substrate 1212 and third substrate 1252, respectively, and accordingly, the claimed subject matter is not limited in these respects.

The core 1210 is substantially similar in form and function to the permeability material 110 of the embodiment of FIG. 1A.

The base substrate 1202 of the embodiment of FIG. 12 is suitable for a magnetic device having a primary and secondary winding electric circuit. FIGS. 13A-D are top perspective, top, bottom perspective, and bottom views, respectively, of the base substrate 1202 of the embodiment of FIG. 12. The base substrate 1202 defines a first base surface 1204 and a second base surface 1205 opposite the first base surface 1204. Depending from the first base surface 1204 is a feature in the form of a first winding cup 1206. The first winding cup 1206 may be provided in the first base surface 1204 by any suitable method including, but not limited to, machining and molding processes as previously described.

The first winding cup 1206 defines a groove of revolution about an axis 107 perpendicular to the first base surface 1204. The first winding cup 1206 defines a first winding cup surface 1209 surrounding a hub 1220. The first winding cup surface 1209 defines a first winding cup bottom 1239, a first inner wall 1219 and a first outer wall 1229 contiguous with the first winding cup bottom 1239. It is appreciated that in other embodiments, the first inner wall 1219 and first outer wall 1229 may be contiguous with each other and with no first winding cup bottom 1239 as dictated by design preference. The hub 1220 extends from the first base surface 1204 to the first winding cup bottom 1239 of the first winding cup 1206. The hub 1220 defines a hub top surface 1224 that is substantially coplanar with the first base surface 1204.

As shown in FIG. 13B, the first winding cup 1206 defines a winding cup periphery surface portion 1222 on the first base surface 1204. The hub top surface 1224 defines a hub periphery surface portion 1226. The winding cup periphery surface portion 1222 and the hub periphery surface portion 1226 are those portions where a portion of the first conductive pattern 1208 is disposed on the respective surfaces.

Figure 14A:
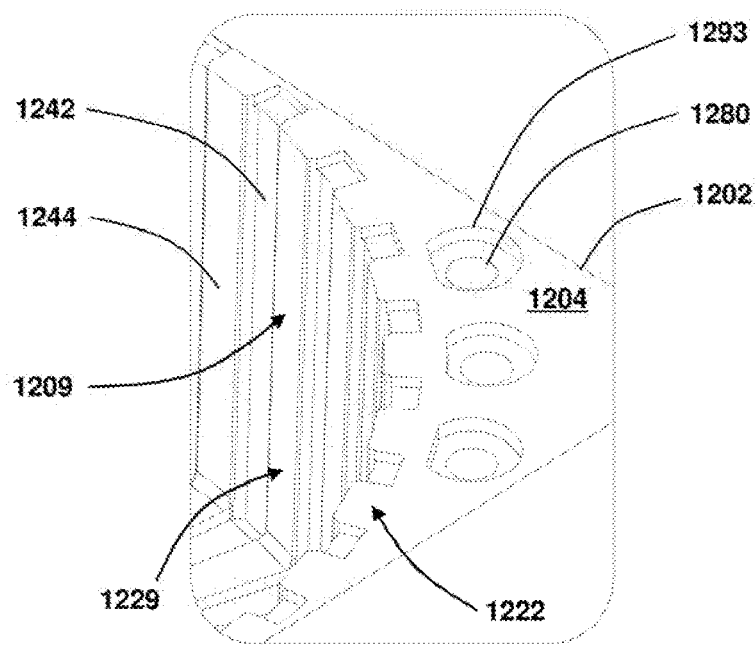
FIGS. 14A and 14B are close-up detailed perspective views of the winding cup periphery surface portion of section 14A of FIG. 13A and the hub periphery surface portion of section 14B of FIG. 13A, respectively, in accordance with the embodiment of FIG. 12.
Figure 14B:
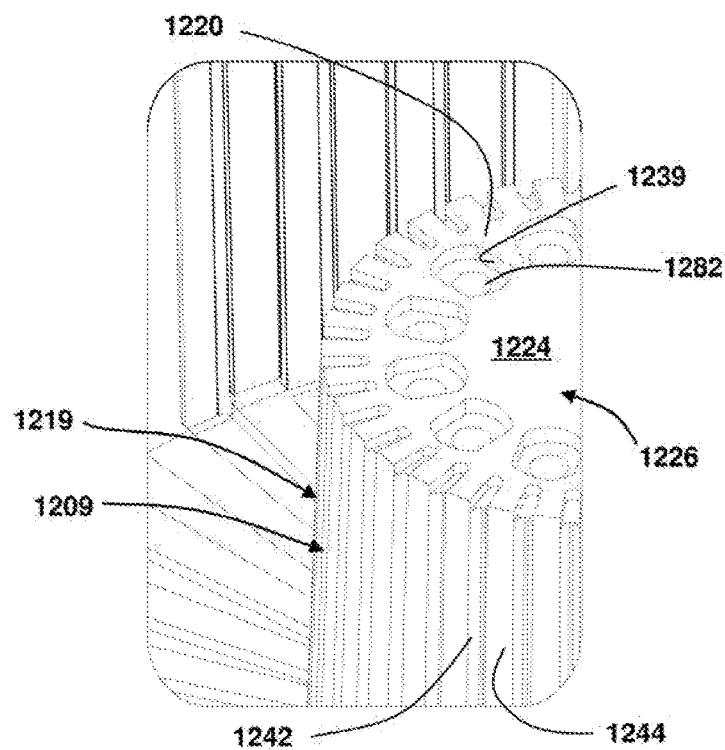

The first winding cup surface 1209 defines a plurality of winding cup channels 1242 depending from the first winding cup surface 1209 and winding cup lands 1244, best shown in FIGS. 14A and 14B, each of which are continuous from the winding cup periphery surface portion 1222 to the hub periphery surface portion 1226 of the hub top surface 1224. As will be discussed below, each of the winding cup channels 1244 will have conductive material disposed within so as to define a portion of an electrical circuit.

The winding cup channels 1242 may be produced in the first winding cup 1206 by any suitable method such as, but not limited to, machining and molding processes. For example, a machining process may be used wherein the first winding cup 1206 is provided in the base substrate 1202 by a process separate from the process of forming the winding cup channels 1242. In another example, a molding process may be used wherein the first winding cup 1206 and winding cup channels 1242 are provided in the base substrate 1202 by the same process. A mold may be provided with features so as to simultaneously create the first winding cup 1206 and winding cup channels 1242.

FIGS. 14A and 14B are close-up detailed perspective views of the winding cup periphery surface portion 1222 and the hub periphery surface portion 1226, respectively, in accordance with the embodiment of FIG. 13A. The winding cup channels 1242 provide a surface upon which conductive material may be disposed so as to define a conductive pattern, as will be described below. The winding cup lands 1244 provide an electrically insulative separation between each winding cup channel 1242. The resulting first conductive pattern 1208, shown in FIG. 13B, is also referred herein as a "half winding".

Referring again to FIGS. 13A and 13B, in accordance with an embodiment of a method to dispose conductive material into the winding cup channels 1242, an electrically conductive material is deposited onto the first winding cup surface 1209, including the winding cup lands 1244. The deposition process may be any of a plurality of processes, such as, but not limited to, plating and vapor deposition. The electrically conductive material may be any suitable material for the particular purpose, such as, but not limited to, copper, gold and silver. It is appreciated that selected regions of the base substrate 1202 may be covered with the conductive material or substantially the entire base substrate 1202 may be covered with the conductive material. The electrically conductive material substantially coats the first winding cup surface 1209 but does not necessarily have to substantially "fill-in" the winding cup channels 1242. Etch resist material, such as, but not limited to, that known in PCB and semiconductor processing arts, is disposed over the conductive material. Many known techniques may be utilized to dispose the etch resist material, such as, but not limited to, sprayed, dip coated, vacuum laminated, electro-deposited, sputtering and thermal deposition processes.

Figure 15A:
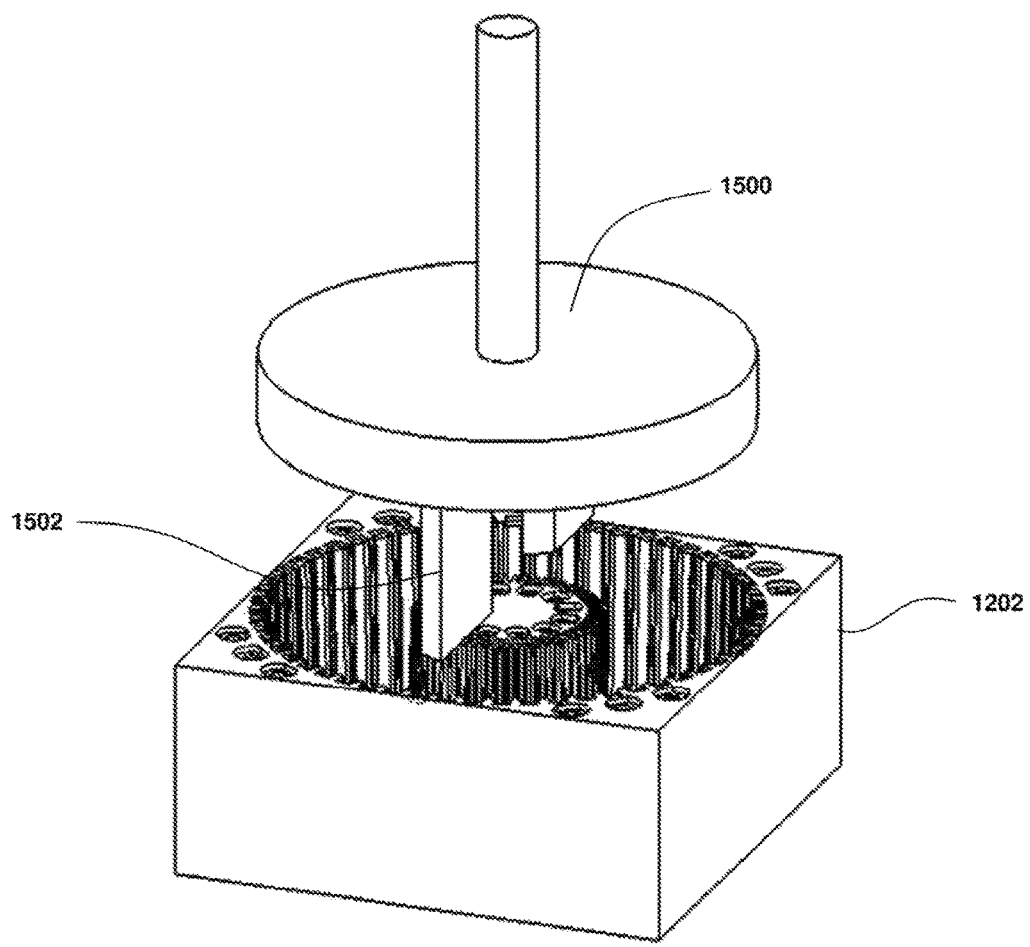
FIGS. 15A and 15B are perspective and cross-sectional views, respectively, of a milling tool in accordance with an embodiment.
Figure 15B:
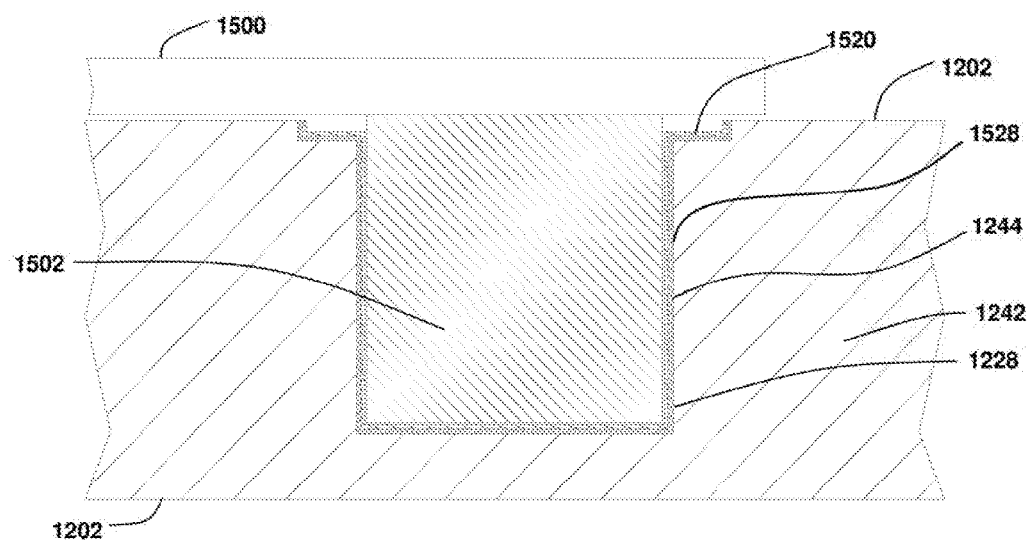

FIGS. 15A and B are perspective and cross-sectional views, respectively, of a milling tool 1500 in accordance with an embodiment. The milling tool 1500 may be used to preferentially remove etch resist material 1520 from the winding cup lands 1244, shown in FIG. 14A, so as to expose the conductive material 1528 thereon. The milling tool 1500 may be any suitable tool suitable for the particular purpose, such as, but not limited to a conventional end-mill cutter. In the embodiment of FIGS. 15A-B, the milling tool 1500 has one or more blades 1502 that conform to the first winding cup surface 1209 so as to remove the etch resist material 1520 and/or the conductive material 1528 deposited on the winding cup lands 1244. It is understood that the blades 1502 may facilitate a cutting or grinding action so as to remove the etch resist material and/or the conductive material 1528 deposited on the winding cup lands 1244.

It is understood that etch resist material and/or conductive material may be removed from a substrate using any suitable process, such as but not limited to, mechanical and chemical processes. Mechanical processes include, but not limited to, tools to affect grinding, cutting, abrading, milling and/or other mechanical removal process used to physically remove the target material. Chemical processes include, but not limited to, solvent, acid and aqueous solutions used to dissolve the target material.

Wherein only the etch resist material 1528 is removed from the winding cup lands 1244, the base substrate 1202 is subsequently exposed to a process to remove the exposed conductive material 1528 from the winding cup lands 1244 so as to expose the base substrate material thereon. Thus is provided an insulative feature between each of the plurality of winding cup channels 1242, each having conductive material 1528 contained therein defining a first conductive trace 1228. Wherein the conductive material 1528 does not substantially fill in the winding cup channel 1242, leaving the etch resist material 1520 on the conductive material 1528 in the winding cup channels 1242 may serve as an electrical insulator which may be useful for electrically isolating the conductive material 1528 from the core.

A subsequent process, such as, but not limited to a mechanical or chemical process, to remove the remaining etch resist material 1520 from the base substrate 1202 may be performed so as to expose the conductive material 1528 in the winding cup channels 1242.

Figure 14C:
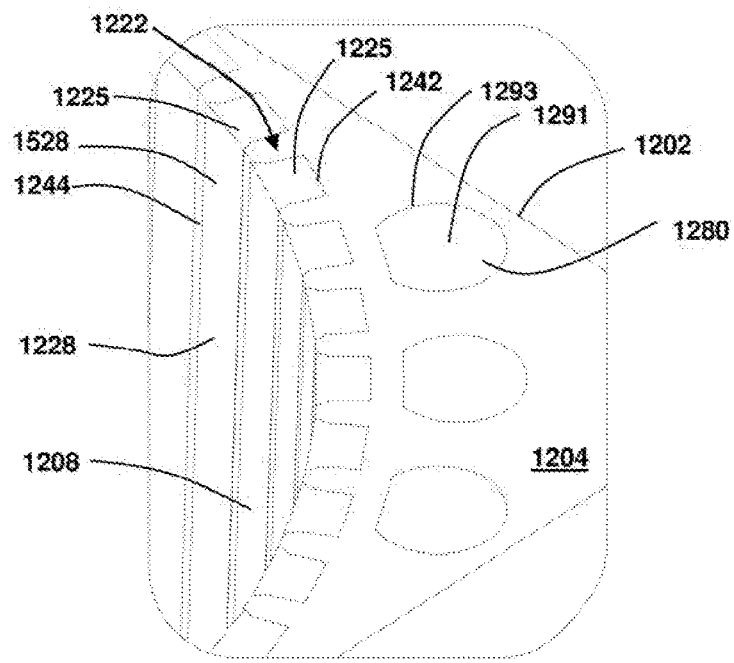
FIGS. 14C and 14D are close-up detailed perspective views of the winding cup periphery surface portion and the hub periphery surface portion, respectively, in accordance with another embodiment.
Figure 14D:
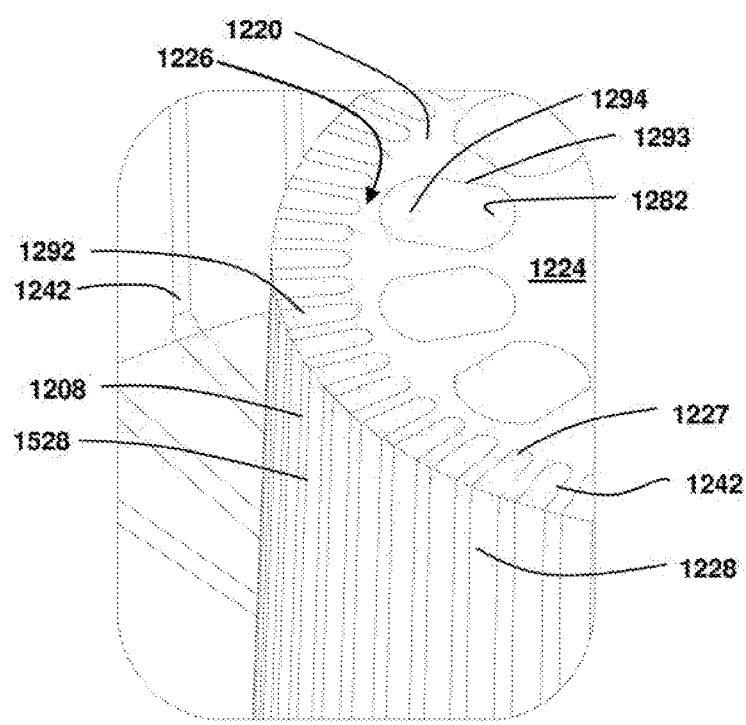

FIGS. 14C and 14D are close-up detailed perspective views of the winding cup periphery surface portion 1222 and the hub periphery surface portion 1226, respectively, in accordance with the embodiment of FIG. 12. In the embodiments of FIGS. 14C and 14D, the winding cup channels 1242 are filled-in with either conductive material 1528 or etch resist with an underlying layer of conductive material.

By way of example, wherein the first winding cup 1206, as shown in FIG. 13A, defines an oval or other geometric shape, an end-mill tool, for example, may be utilized to remove the etch resist material 1520 from the winding cup lands 1244.

Figure 16:
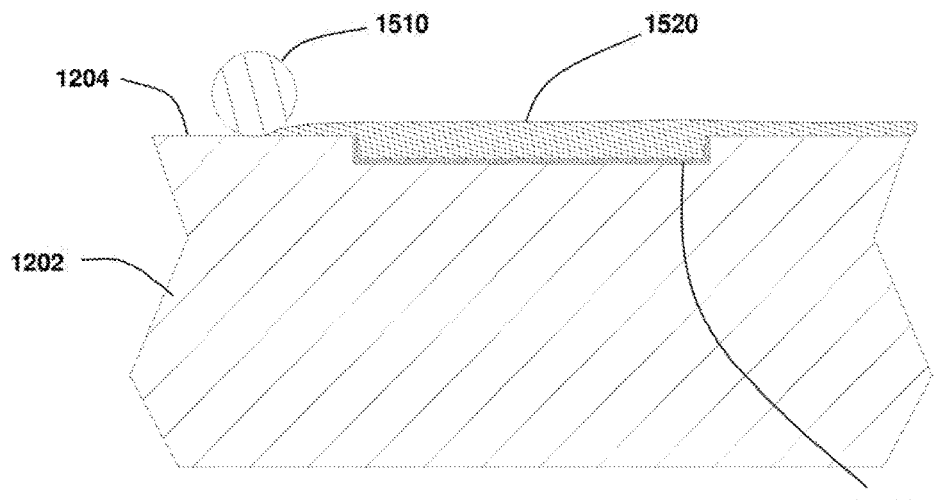
FIG. 16 is a cross-sectional view of an abrasive tool and work piece, in accordance with an embodiment.

FIG. 16 is a cross-sectional view of an abrasive tool 1510 and work piece, in accordance with an embodiment. Wherein the first base surface 1204 is substantially planar, an abrasive tool 1510 may be used to remove the etch resist material 1520 from those features thereon. Such an abrasive tool 1510 may be, such as, but not limited to, a roller sander, orbital sander, disc sander, wire brush and other abrasive tool useful for the removal of the etch resist material 1520.

Referring also to FIG. 13B, in accordance with an embodiment, after the removal of the etch resist material 1528 from the winding cup lands 1244, the method further comprises removing the conductive material 1528 that is exposed on the winding cup lands 1244 by use of a suitable method, such as, but not limited to those methods associated with etching. After the exposed conductive material 1528 is substantially removed from the winding cup lands 1244, a three-dimensional electrically conductive first conductive pattern 1208 comprising a plurality of discontinuous first conductive traces 1228 radiating from about the axis 107 is defined. The first conductive traces 1228 are disposed from the hub periphery surface portion 1226 to the winding cup periphery surface portion 1222 along the winding cup channels 1242 therebetween. Each of the first conductive traces 1228 comprise a trace hub end 1227 that is associated with the winding cup periphery surface portion 122 and a trace winding cup periphery end 1225 that is associated with the hub periphery surface portion 1226, also shown in FIGS. 14C and 14D. In accordance with an embodiment, the first conductive pattern 1208 is a "half winding" of an inductive device. As will be explained below, the resulting half winding will be associated with a complementary conductive pattern so as to produce a complete winding-type electric circuit structure.

Figure 13C:
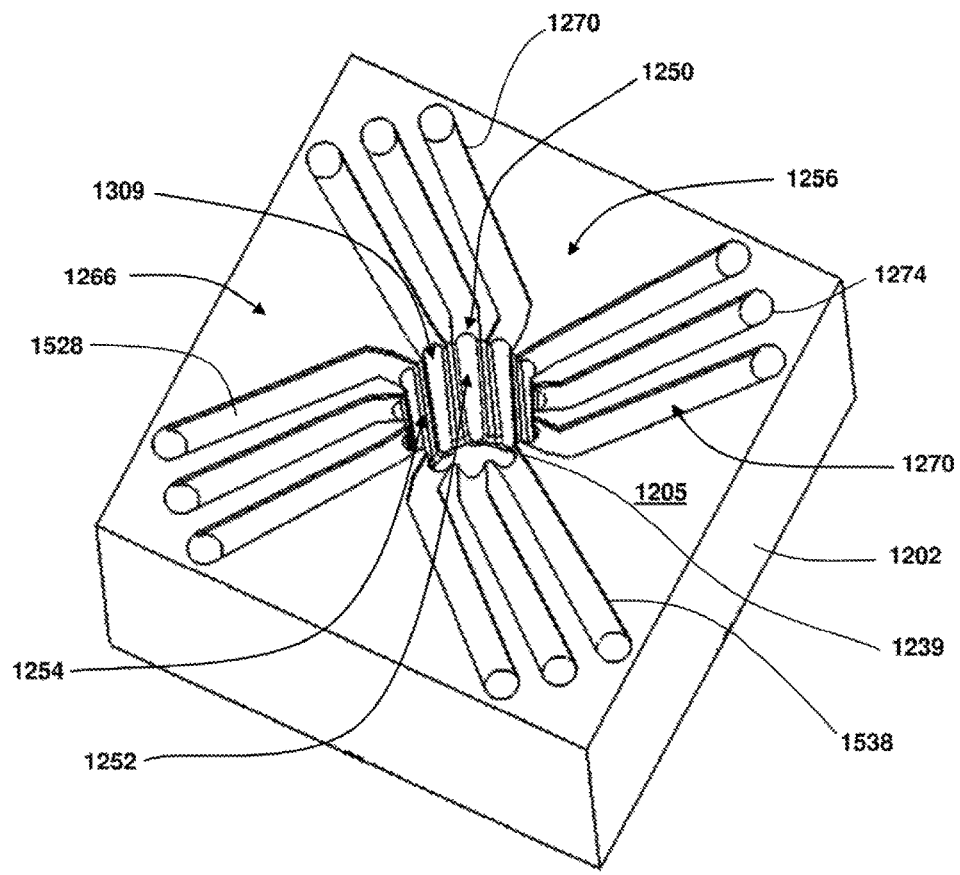

FIGS. 13C and 13D are bottom and bottom perspective views of the base substrate 1202, in accordance with the embodiment of FIG. 12. In this embodiment, the hub 1220, as shown in FIG. 13A, is hollow; that is, a hub recess 1250 depends from the second base surface 1205 having an axis substantially coaxial with that of the hub 1220 defining a hub recess surface 1309 and a hub recess bottom surface 1256. The hub recess surface 1309 is provided with hub recess channels 1252 substantially similar to those of the first winding cup surface 1209 of FIG. 13A, that extend from the hub recess bottom surface 1256 to the second base surface 1205. The hub recess surface 1309 defines the plurality of hub recess channels 1252 depending from the hub recess surface 1309 defining hub recess lands 1254. Radiating from each of the hub recess channels 1252 is a second surface channel 1270 that terminates at a second surface channel end 1274.

An electrically conductive material 1528 is disposed in the hub recess channels 1252 and the second surface channels 1270 so as to define a plurality of secondary traces 1538 of a secondary conductive winding pattern 1266. The deposition of the electrically conductive material 1528 is substantially similar to the process for depositing the conductive material 1528 provided in the winding cup channels 1242 of FIG. 13A. The hub recess lands 1254 are void of electrically conductive material 1528 so as to provide an electrically insulating function between the hub recess channels 1252. The resulting secondary conductive winding pattern 1266 defines a portion of a secondary winding.

The second conductive traces 1238 of the secondary conductive winding pattern 1266 are electrically interconnected on the first base surface 1204 of FIG. 13A with complementary conductive traces or circuitry by electrical interconnects, referred to herein as vias, that transcend through the base substrate 1202. Referring to FIGS. 13B, 14A and 14C, second end vias 1280 are provided that extend from the first base surface 1204 adjacent the winding cup 1206 through to the second base surface 1205 intersecting the second surface channel second end 1274, as shown in FIG. 13D. As shown in FIGS. 14A and 14C, a winding cup periphery pad 1291 may be formed within a pad depression 1293 into which conductive material may be disposed. At the first base surface 1204, the second end via 1280 terminates at a winding cup periphery pad 1291. The winding cup periphery pad 1291 may provided a greater surface area to affect electrical interconnection with complementary conductive traces. The second end via 1280 may be disposed in the base substrate 1202 by any known method. By way of example, a method known in the art involves drilling a bore from one surface to another and coating the inside of the bore or filling the bore with electrically conductive material providing an electrical conduit therebetween.

Similarly, electrical interconnects are provided on the hub 1220. Referring to FIGS. 13B, 13D, 14B and 14D, hub vias 1282 are provided that extend from the hub top surface 1224 through to the hub recess bottom surface 1256 intersecting the second conductive trace second end 1239, as shown in FIGS. 13C and D. At the hub top surface 1224, the hub vias 1282 terminates at a hub pad 1294. The hub pad 1294 may provided a greater surface area to affect electrical interconnection with complementary conductive traces. The hub vias 1282 may be disposed in the base substrate 1202 by any known method as described above.

As shown in FIGS. 14B and 14D, the hub pad 1294 may be formed within a pad depression 1293 into which conductive material may be disposed. It is understood that the configuration of the end of the via may be modified suitable for a particular purpose. The end of the via may be flush with the respective surface or may be recessed. Similarly, if a pad is provided, the pad may be flush with the respective surface or may be recesses suitable for a particular purpose.

Figure 17:
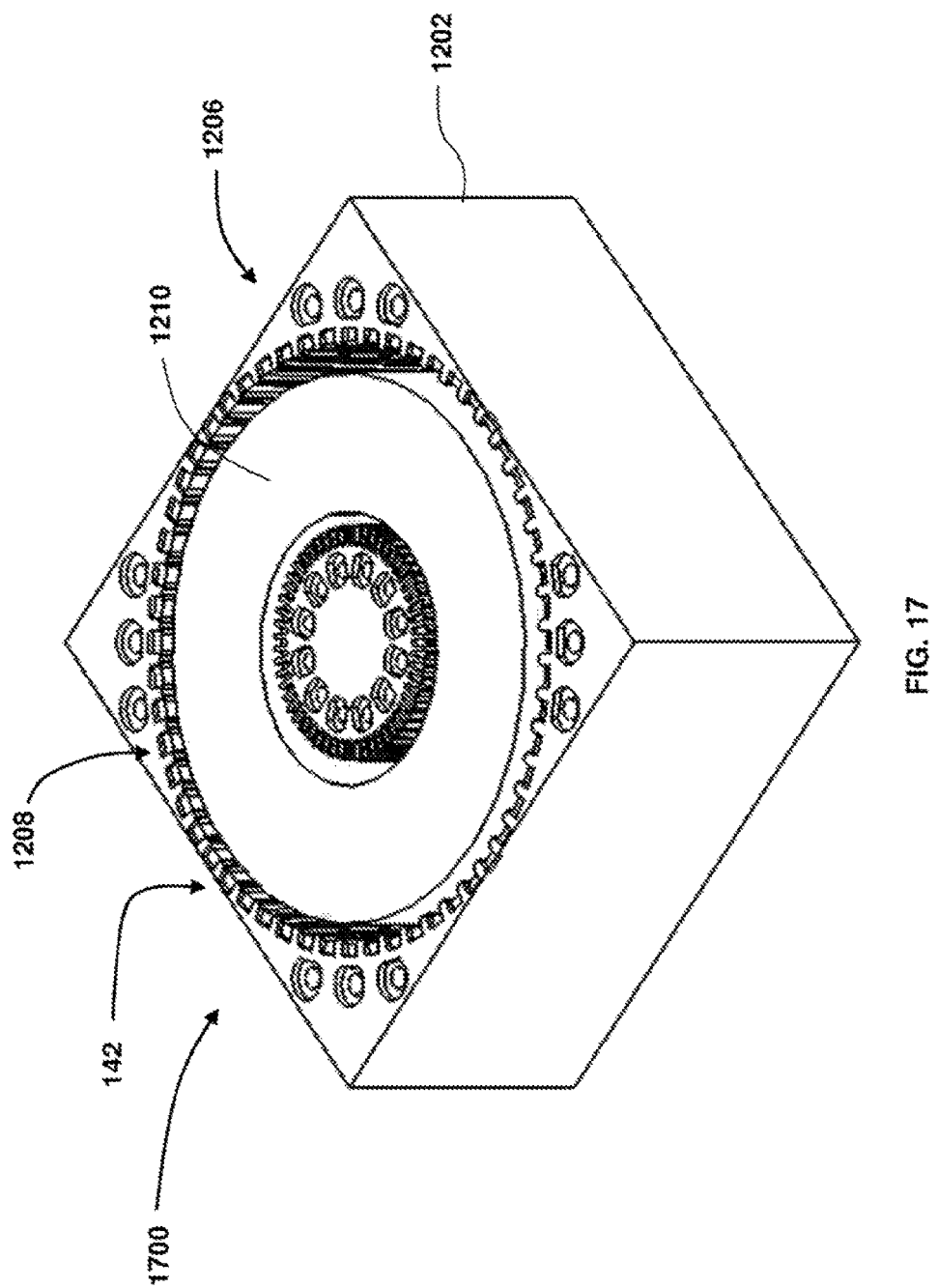
FIG. 17 is a top perspective view of an assembly comprising the base substrate and a core disposed within the winding cup of the embodiment of FIG. 12.

FIG. 17 is a top perspective view of an assembly 1700 comprising the base substrate 1202 and a core 1210 disposed within the winding cup 1206 of the embodiment of FIG. 12. In the embodiment of FIG. 17, the core 1210 has a toroidal shape that corresponds to the shape of the winding cup 1206. It is understood that other core shapes, including, but not limited to, square and oval, may be used is a complementary-shaped winding cup.

Although the core 1210 and the winding cup 1206 may, in some embodiments, have a complimentary close fit, a gap 142 may be defined therebetween. In accordance with further embodiments, an electrically insulative material is disposed within the gap 142 between the core 1210 and the winding cup 1206. Such materials are known in the art and include, but not limited to, certain types of epoxy fill material. Filling the gap 142 may provide a number of benefits, such as, but not limited to, centering the core 1210 within the winding cup, electrically insulating the core 1210 from the first conductive patterns 1208, and fixing the position of the core 1210 to prevent movement thereof.

Figure 18:
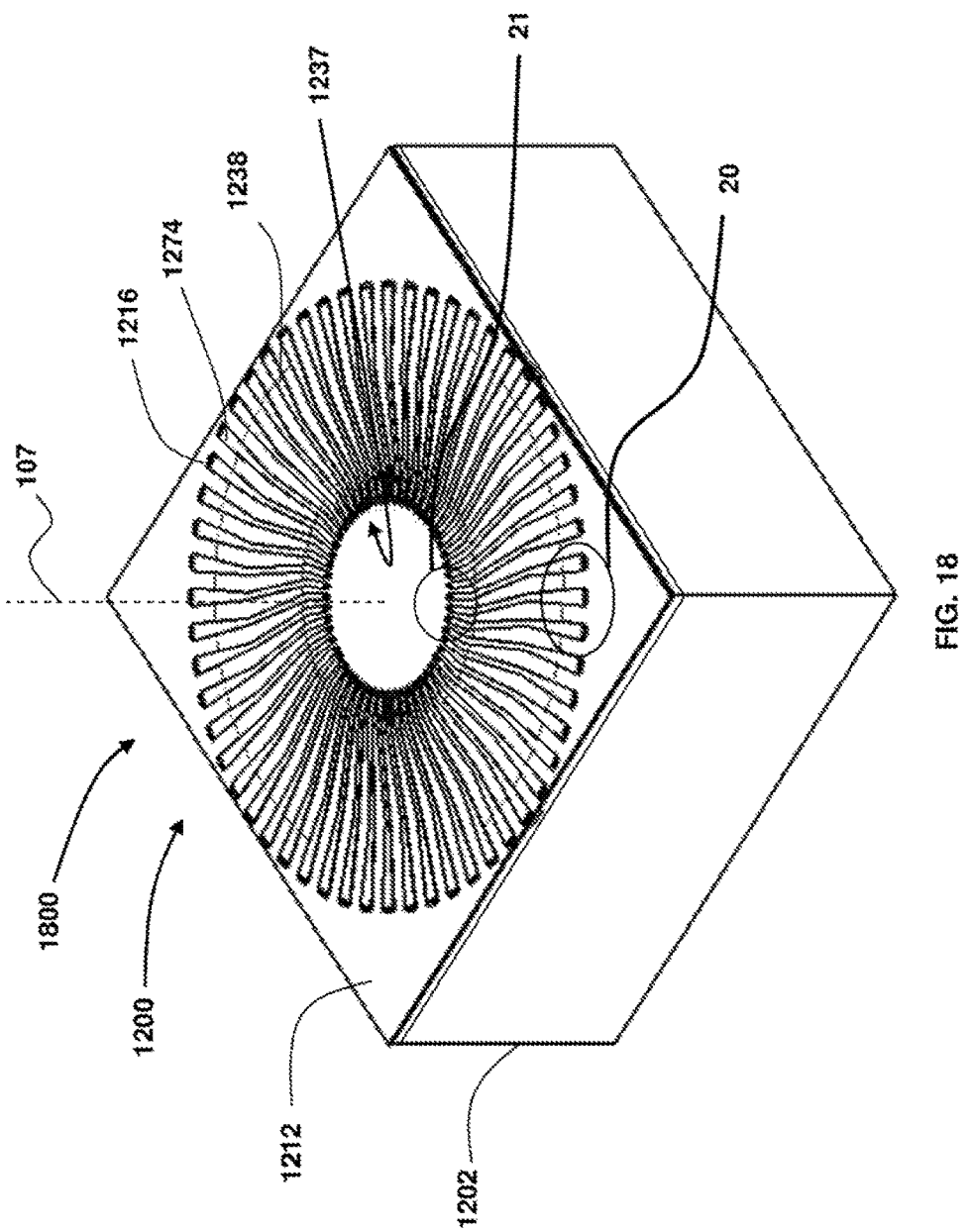
FIG. 18 is a top perspective view of an assembly comprising the base substrate and the second substrate, in accordance with an embodiment.

FIG. 18 is a top perspective view of an assembly 1800 comprising the base substrate 1202 and the second substrate 1212, in accordance with an embodiment. Also referring to FIGS. 12, 13A and 13B, after the core 1210 is disposed within the winding cup 1206, unless an air-core is used, the second substrate 1212 is coupled to the first base surface 1204 of the base substrate 1202 and in operable alignment with the first conductive pattern 1208. The first conductive pattern 1208 of the base substrate 1202 and the second conductive pattern 1216 of the second substrate 1212 are caused to become into electrical communication with each other so as to define a first winding, as will be described below. In accordance with embodiments, vias are provided within the second substrate 1212 that extend from the second conductive pattern 1216 on the second substrate 1212 to the first conductive pattern 1208 on the winding cup 1206. The vias comprise an electrically conducting material so as to form electrical interconnects between the first conductive pattern 1208 and the second conductive pattern 1216.

Vias are known in the art as an element that transcends one or more insulative layers or substrates (such as circuit boards) so as to interconnect electrical elements thereon. In accordance to embodiments, vias are produced by any method suitable, such as, but not limited to, drilling, and then plating or filling the resulting bore with an electrically conductive material. The electrically conductive material provides an electrical interconnect between the respective conductive patterns.

The second conductive pattern 1216 is operable to be associated with the first conductive pattern 1208 on the hub periphery surface portion 1226 and the winding cup periphery surface portion 1222 shown in FIG. 13B. In accordance with embodiments, trace hub end 1227 is electrically coupled to the second conductive trace first end 1237 and the trace winding cup periphery end 1225 is electrically coupled to the second conductive trace second end 1239.

The second conductive pattern 1216 comprises a plurality of discontinuous second conductive traces 1238 radiating from about the axis 107. The second conductive traces 1238 comprise a second conductive trace first end 1237 positioned closest to the axis 107 and a second conductive trace second end 1274, opposite the second conductive trace first end 1237. The number of second conductive traces 1238 is determined by the number of first conductive traces 1228 and for a particular purpose. In accordance with embodiments, including that shown in FIG. 12, the number of second conductive traces 1238 is equal to the number of first conductive traces 1228. In the embodiment of FIG. 12, the second conductive traces 1238 radiate from about the axis 107 such that a second conductive trace first end 1237 is aligned above a trace hub end 1227, shown in FIG. 14D, of a first conductive trace 1228, and a second conductive trace second end 1274 is aligned above a trace winding cup periphery end 1225 of an adjacent first conductive trace 1228, shown in FIG. 14C, when the second conductive pattern 1216 and the second substrate 1212 are coupled to the base substrate 1202.

It is appreciated that the second substrate 1212 including the second conductive pattern 1216 may be provided by any of a number of methods. For example, in the previous embodiment the second substrate 1212 may be provided as a unitary element in the form of a printed circuit board that may be coupled to the first base surface 1204 of the base substrate 1202 using a laminating process. In other embodiments, the second substrate 1212 and the second conductive pattern 1266 may be coupled to the base substrate 1202 in separate processes. For example, the second substrate 1212 may be an electrically insulative layer that is molded, sprayed or printed onto the first base surface 1204 of the base substrate 1202 and over any gap filling material and the core 1210. The second conductive pattern 1216 may subsequently be molded, sprayed or screen printed onto the second substrate 1212, for example.

In accordance with embodiments, the second substrate 1212 is provided as a printed circuit board (PCB) having a second conductive pattern 1216 that is complementary to the first conductive pattern 1208 of the winding cup 1206. As with the base substrate 1202, similar processes may be used to provide the second conductive pattern 1216. For example, but not limited thereto, the second conductive pattern 1216 may be provided using a plating technique or a layering technique, wherein a plated metallic surface or a thin layer of conductive material may be applied in a subsequent plating step. In another example, not limited thereto, the conductive material may be provided as a plating layer that is photo-imaged and etched using conventional printed circuit assembly techniques.

Multiple substrate and conductive layers may be added, as warranted by the design.

Figure 19:
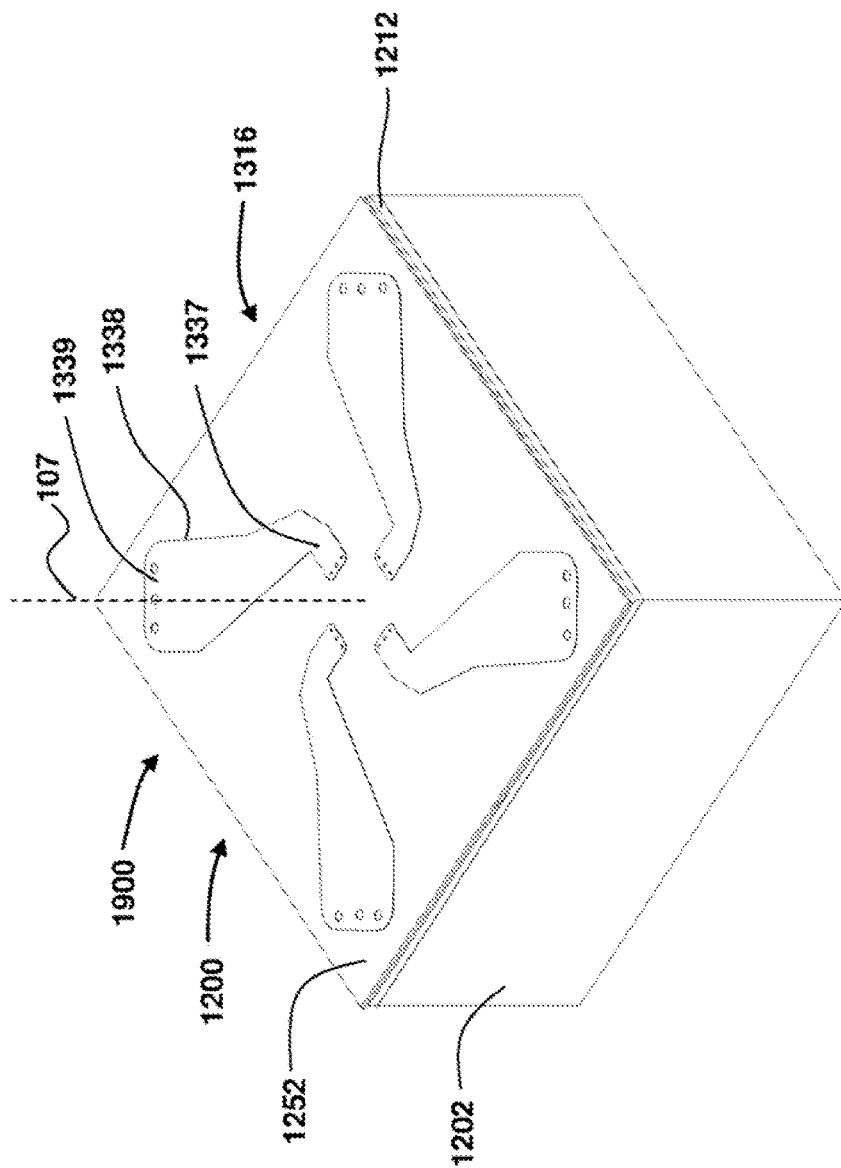
FIG. 19 is a top perspective view of an assembly of the embodiment of FIG. 12, comprising the base substrate, the second substrate, and the third substrate.

FIG. 19 is a top perspective view of an assembly 1900 of the embodiment of FIG. 12, comprising the base substrate 1202, the second substrate 1212, and the third substrate 1252. The secondary conductive traces 1538 of the secondary conductive pattern 1266, shown on FIG. 13D, are electrically interconnected on the first base surface 1204 with the third conductive traces 1338 of the third conductive pattern 1316. Substantially as described previously for the electrical interconnection of the second conductive traces with the first conductive traces, vias are provided so as to electrically interconnect the third conductive traces 1338 with the secondary conductive traces 1538. Vias are provided to interconnect the third conductive trace first end 1337 with the hub pad 1294, shown in FIG. 14D, and to interconnect the third conductive trace second end 1339 with the winding cup periphery pad 1291 shown in FIG. 14C. The vias pass through the third substrate 1252 and the second substrate 1212 to the respective pad.

Referring again to FIGS. 18 and 19, the base substrate 1202 and the second substrate 1212 are operable to electrically define a first or primary winding of a magnetic component 1200 of FIG. 12. The base substrate 1202 and the third substrate 1252 are operable to electrically define a second or secondary winding of the magnetic component 1200.

As described previously for the embodiments of FIGS. 5A-10B, the physical characteristics of the interconnected circuit patterns for the magnetic components 1200, determines the magnetic component's electrical characteristics; for example, whether the magnetic component is an inductor, transformer or other type of component having the functionality of a conventional wire-wound configuration.

As shown in FIG. 12, the second conductive pattern 1216 and corresponding first conductive pattern 1208 comprises a much denser winding than the third conductive pattern 1316 and corresponding secondary conductive winding pattern 1266. The winding density ratio "n" of the primary and secondary windings, respectively, may vary suitable for a particular purpose. FIG. 12 illustrates an embodiment wherein there is a large winding density ratio between the primary and secondary windings. By way of examples, but not limited thereto, in power converter designs, step-down transformers are used, such as to convert from 120V to 24V or 48V to 12V. The voltage step-down is determined, in part, by the winding ratio between the primary and secondary windings. Step-up transformers are also useful and may be provided in embodiments.

It is noted that FIG. 12 only depicts a second substrate 1212 and a third substrate 1252 provided on a base substrate 1202. It is appreciated that more substrates may be provided, as warranted by the design suitable for a particular purpose.

As explained above, embodiments of magnetic devices in accordance with the claimed subject matter contain one or more winding-type electric circuits (windings); that is, the electrical interaction of the electrically interconnected conductive patterns form, in effect, one or more winding-type electric circuit structures surrounding a core. As provided above, electrical properties of the windings may be manipulated and predetermined by the physical characteristics of the conductive patterns. By way of example, the dimensions of thickness and width of the conductive patterns may be predetermined so as to provide a desired electrical characteristic. In addition, the resistance and/or AC impedance of the windings may be controlled by the preselected configuration of the vias, such as, but not limited to, the size, shape and number of the vias.

Figure 20:
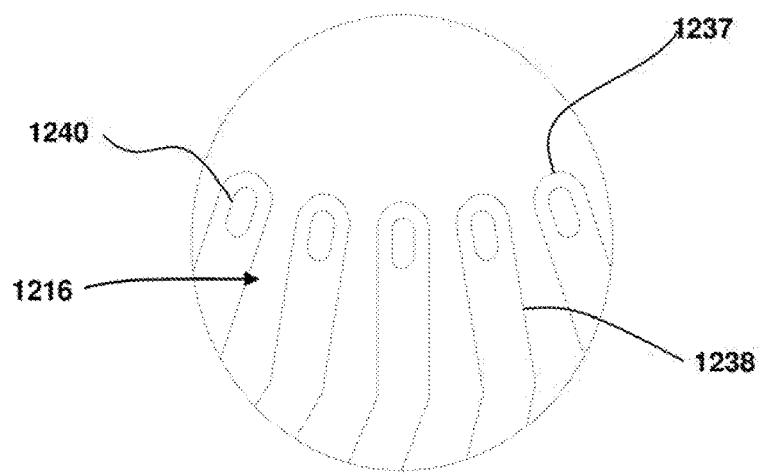
FIG. 20 is a top view of the second conductive trace second end of the second conductive pattern as a detailed view of section in FIG. 18, in accordance with an embodiment.

By way of example, FIG. 20 is a top view of the second conductive trace second end 1237 of the second conductive pattern 1216 as a detailed view of section 20 in FIG. 18, in accordance with an embodiment. Each of the second conductive trace second ends 1237 is provided with a first via 1240 having a predetermined shape, in this case an oval, that is predetermined to provide a desired electrical resistance and/or impedance as described previously. The first via 1240 provides an electrical interconnect between the second conductive trace first end 1237 of the second conductive trace 1238 and the trace hub end 1227 of the first conductive trace 1228 as shown in FIG. 13B.

Figure 21:
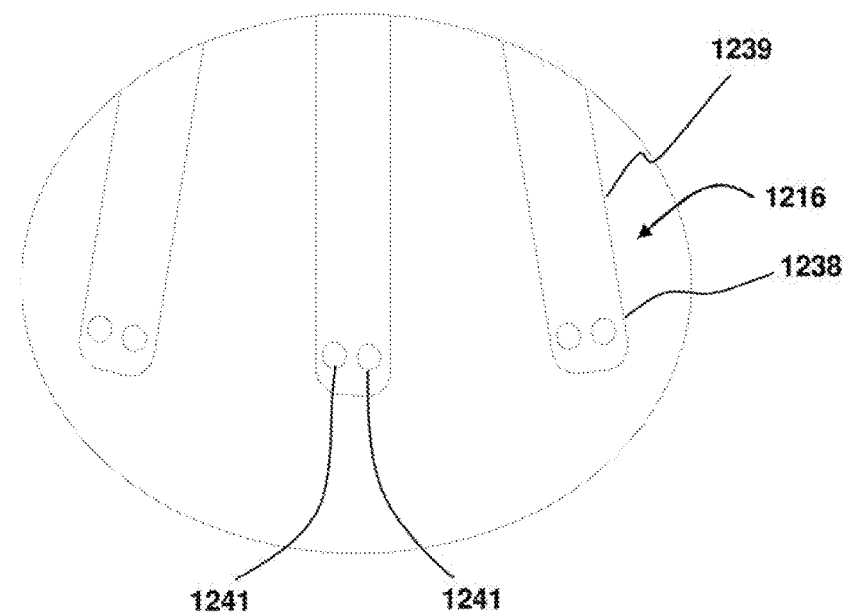
FIG. 21 is a top view of the second conductive trace second end of the second substrate as a detailed view shown in FIG. 18, in accordance with an embodiment.

By way of another example, FIG. 21 is a top view of the second conductive trace second end 1239 of the second conductive pattern 1216 as a detailed view 21 shown in FIG. 18, in accordance with an embodiment. Each of the second conductive trace second ends 1239 is provided with a plurality of vias 1241, in this example there are three, the number and size of which are predetermined to provide a desired electrical resistance and/or impedance.

The plurality of vias 1241 may be used to electrically interconnect the second conductive trace second end 1239 of the second conductive trace 1238 to the trace winding cup periphery end 1225 on the base substrate 1202 shown in FIG. 13B.

In accordance with other embodiments, the base substrate may be provided with cavities, such as within the hub and adjacent the winding cup. These cavities may assist in the molding process if such is used for manufacturing the base substrate. In other embodiments, the cavities may be filled with various materials so as to affect performance characteristics. In accordance with an embodiment, by way of example, a cavity in the hub may be provided with a material having a high thermal conductivity to provide passive thermal management so as to conduct heat from the windings under an electrical load away from the magnetic component.

Embodiments of the embedded magnetic component support vertical integration. Voids and cavities may be provided in the base substrate to receive passive and active components that may be used in the application circuit. For example, holes may be molded into the base substrate operable to receive electrolytic capacitors packaged in a "can"-style package known in the art. Similarly, cavities may be provided and selectively plated with an electrically conductive material and operable to receive active and passive surface-mount components.

Figure 22:
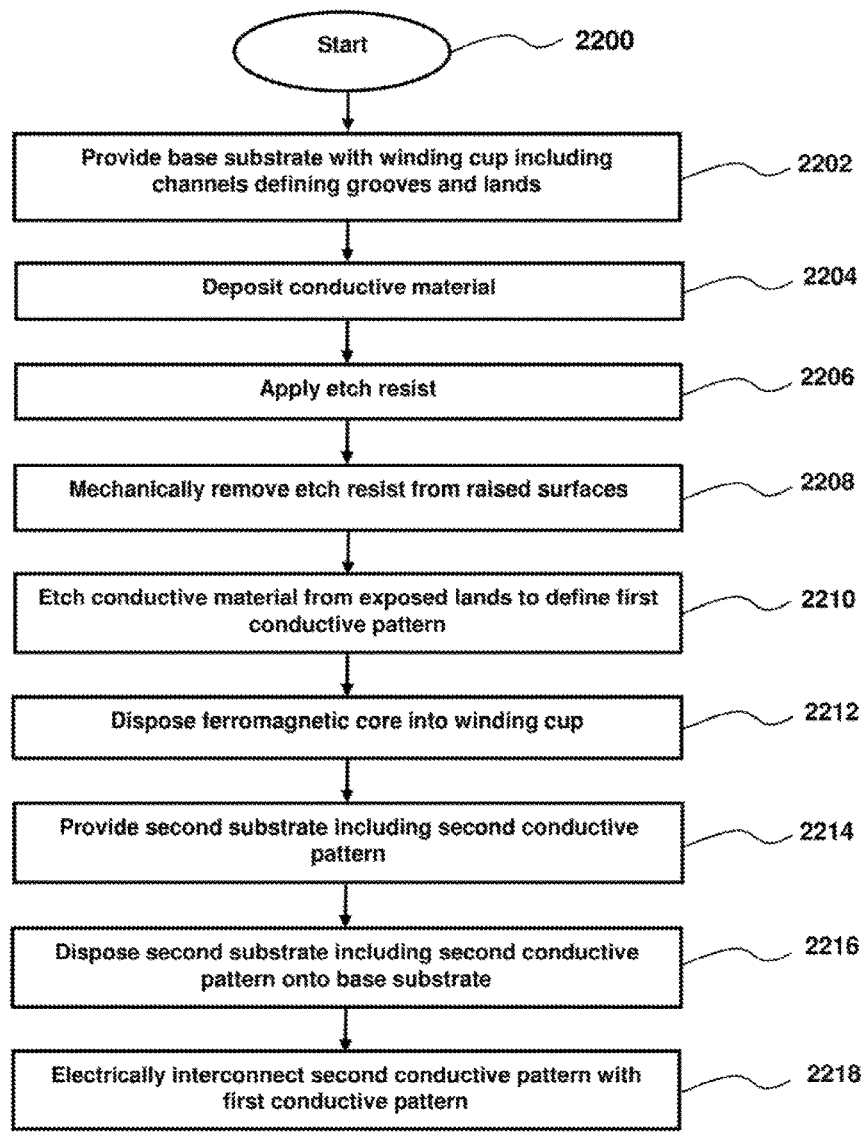
FIG. 22 is a flow diagram of an embodiment of a method of making a magnetic component, in this embodiment, an inductive device.

FIG. 22 is a flow diagram of an embodiment of a method 2200 of making a magnetic component, in this embodiment, an inductive device. It is understood that the particular embodiment may be used to make a variety of magnetic components having a wire-wound characteristic. The method comprises providing a base substrate having a first surface defining a winding cup including a hub, the winding cup including grooves and lands 2202; depositing an electrically conductive layer within and about the winding cup and hub 2204; applying an etch resist material to the conductive layer 2206; removing the etch resist material from the lands using mechanical means exposing the conductive layer from the lands 2208; removing the exposed conductive layer from the lands, the remaining conductive layer defining a first conductive pattern 2210; disposing a core in the winding cup 2212; providing a second substrate having a second conductive pattern 2214; disposing the second substrate onto the first surface of the base substrate covering the core 2216; and providing means for electrically interconnecting the first conductive pattern with the second conductive pattern 2218.

It is appreciated that the fabrication process is scalable allowing the process to serve a variety of core sizes. A molding process for fabricating the winding cup may be used to produce relatively deep winding cup structures which may be very challenging or impossible to produce when using imaging, printing, sputtering, laser structuring and other techniques for producing three-dimensional circuits.

In accordance with embodiments of methods of the claimed subject matter, a batch process may be used for manufacturing winding toroid core structures. These methods provide a distinct advantage over hand or machine wire-wound electrical components. Prior-art processes for producing transformers and inductors, for example, provide wire that is wound on larger and costlier E and C core structures due to the fabrication process of winding a bobbin with wire and clamping a core around it. Embodiments in accordance with the claimed subject matter provide methods for fabricating toroid-shaped components that have a relatively smaller form-factor using relatively low cost and simple approaches. In many electrical applications, toroid-shaped components may be more efficient than E and C clamped cores. Additionally, toroid-based devices may have less secondary parasitic parameters, such as, but not limited to, leakage inductance and inter-winding capacitance. In accordance with embodiments of the claimed subject matter, the embedded magnetic components and fabrication approach allows for these secondary effects to me minimized. In addition, the structure easily supports the inclusion of electromagnetic shielding and thermal heat sinks.

Embodiments of methods of the claimed subject matter provide processes that may produce conductive patterns that are used to produce winding-type electrical circuits (windings) that are very repeatable to high electrical tolerances, assisting in the production of devices having consistent performance characteristics.

In an embodiment, a multi-layer structure that supports conductors of different geometries and provides high voltage isolation between primary and secondary windings is provided.

In an embodiment, milling tools are provided that have a specific profile that is the converse of a predefined winding cup and can efficiently remove etch resistance material from the raised surfaces, such as the winding channel lands.

Methods in accordance with embodiments provide a process that is useful for producing inductors and transformers for sensors, communications and power applications, but not limited thereto.

As previously discussed, embodiments of the magnetic component include a ferromagnetic core disposed in the winding cup. Embodiments of the claimed subject matter include methods for producing ferromagnetic cores operable for disposition in winding cups.

Figure 23:
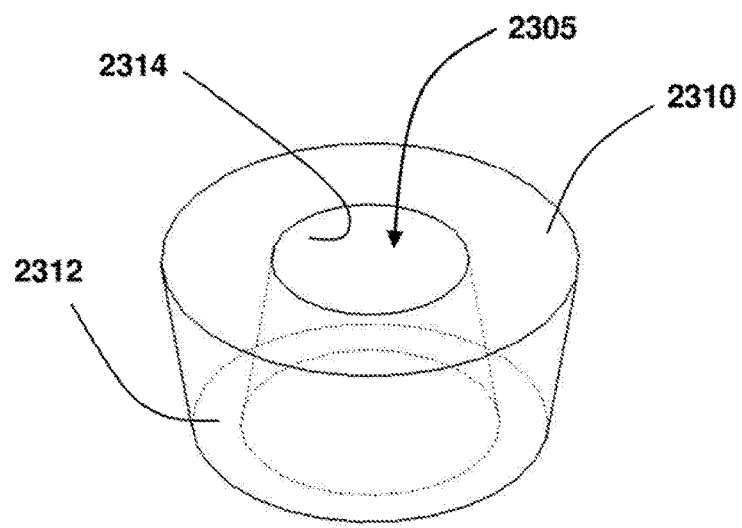
FIG. 23 is a top perspective view of a circular core, in accordance with an embodiment.

FIG. 23 is a top perspective view of a circular toroidal core 2310 comprising a bore 2305 and core sidewalls 2312, 2314 that are complementary to the groove feature wall surface 109 of the embodiment of FIG. 1A, in accordance with an embodiment. The complementary core sidewalls 2312, 2314 and inner wall 119 and outer wall 129 provide, when assembled, a close proximity between the first conductive pattern 108 and the core 2310. The close proximity between the first conductive pattern 108 and the core 2310 is important, for example, for optimizing inductive coupling and affecting a magnetic flux within the core 2310 during operation. Referring to FIG. 1C, the sloping core side walls 2312, 2314 of the core 2310 assist in self-alignment of the core 2310 within the feature 106.

In accordance with embodiments, the core 2310 is fixed in place within the feature 108 with an electrically insulative potting material, such as, but not limited to, an electrically insulative epoxy material. The electrically insulative material should have a thermal expansion coefficient complementary with that of the base substrate and the core 2310 such that minimal movement of the core 2310 when the magnetic component is subjected to operational and environmental thermal conditions.

In accordance with embodiments, the core sidewalls 2312, 2314 are substantially complementary to the inner and outer walls 119, 129 so as to minimize the gap 142 therebetween. Wherein the gap 142 is minimized, a minimum amount of electrically insulative material may be used within the gap 142. A minimal gap 142 and a minimal amount of electrically insulative material is advantageous for a number of reasons, one of which may be to minimize the effects of thermal expansion mismatch between the base substrate, electrically insulative material, and the core 2310.

Figure 24:
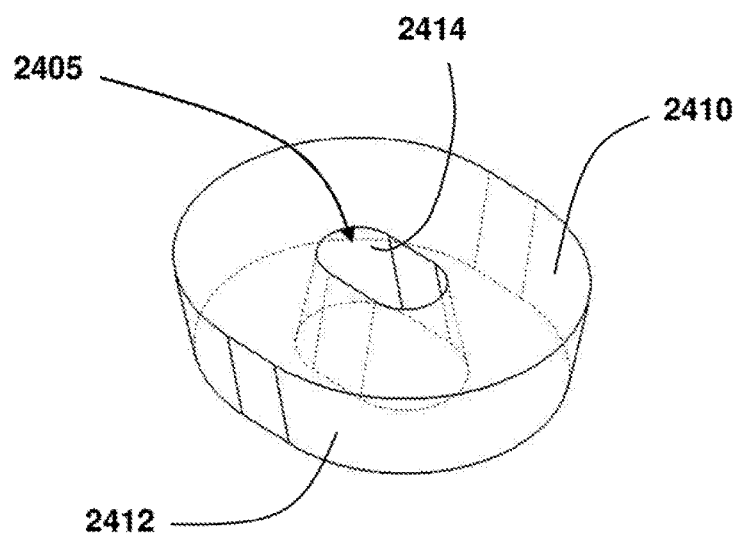
FIG. 24 is a top perspective view of an oval-shaped core with tapered side walls and an oval bore, in accordance with an embodiment.

FIG. 24 is a top perspective view of an oval-shaped core 2410 with tapered side walls 2412, 2414 and an oval bore 2405, in accordance with an embodiment. Advantages of an oval shape for a core 2410 will be discussed further below.

Figure 25:
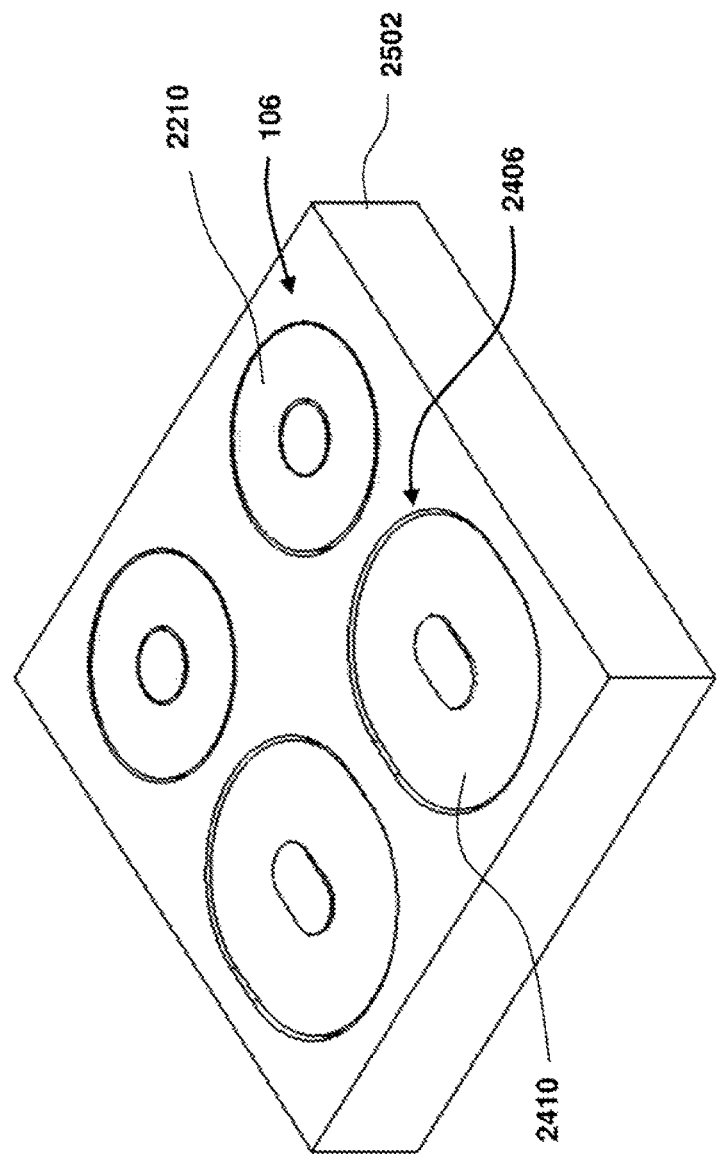
FIG. 25 is a top perspective view of circular and oval ferromagnetic cores disposed within respective complementary features, respectively, of a base substrate, in accordance with an embodiment.

FIG. 25 is a top perspective view of circular and oval ferromagnetic cores 2310, 2410 disposed within respective complementary features 106, 2406, respectively, of a base substrate 2502, in accordance with an embodiment. Once the cores 2310, 2410 are seated within the respective features 106, 2406, a second substrate comprising a conductive layer is disposed upon the base substrate 2502 substantially as discussed above.

It is appreciated that the shape of the ferromagnetic core imparts specific electrical characteristics to the magnetic component. The modularity of the embodiments of the claimed subject matter provides that ability to produce ferromagnetic cores of various geometries. For example, but not limited thereto, an oval, binocular or rectangular-shaped cores.

Figure 26:
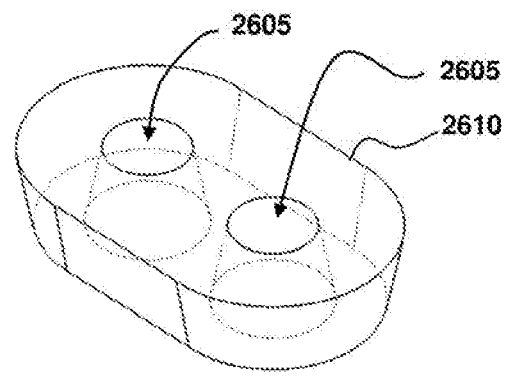
FIG. 26 is a top perspective view of a binocular core, in accordance with an embodiment.
Figure 27:
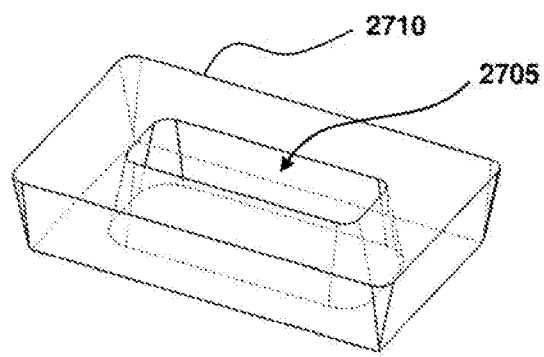
FIG. 27 is a top perspective view of a core that has a rectangular shape, in accordance with an embodiment.

FIG. 26 is a top perspective view of a core 2610 that has an oval shape and includes two bores 2605, referred to as a binocular core, in accordance with an embodiment. This core would be complimentary with a feature having a complimentary shape with two hubs. FIG. 27 is a top perspective view of a core 2710 that has a rectangular shape and includes a rectangular bore 2705. This core 2710 would be complimentary with a feature having a complimentary rectangular shape with a rectangular hub.

FIG. 27 is a top perspective view of a core 2710 that has a rectangular shape and includes one square bore 2705, in accordance with an embodiment. This core 2710 would be complimentary with a feature having a complimentary rectangular shape with one or no hub. Embodiments of the claimed subject matter provide a means to provide simple or complex magnetic components having winding features.

Figure 28:
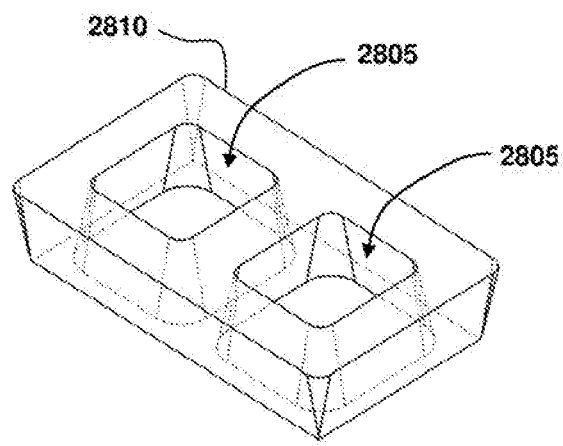
FIG. 28 is a top perspective view of a core that has a rectangular shape and includes two square bores, in accordance with an embodiment.

FIG. 28 is a top perspective view of a core 2810 that has a rectangular shape and includes two square bores 2805, in accordance with an embodiment. This core 2810 would be complimentary with a feature having a complimentary rectangular shape with two hubs. Embodiments of the claimed subject matter provide a means to provide simple or complex magnetic components having winding features.

Referring again to FIG. 24, the oval bore 2405 may be useful to increase the bore as compared with the circular bore 2305 shown in FIG. 23, and correspondingly allow for an increase in the number of windings (which is dependent on the pattern spacing allowed by the hub), such as might be beneficial in a transformer or inductor device. Increasing the number of conductive pattern windings provided on the hub effectively increases the effective winding count, referring to an equivalent number of windings of a wire in wire-wound components.

The larger bore opening also allows the use of larger conductor pattern geometries for the windings. The oval shape can also have a larger magnetic path length versus a circular shape, which is a parameter that may be used to manage the magnetic flux within the core.

The oval or rectangular shaped core with a larger path length in one of the length or width may reduce the core's susceptibility to magnetic saturation due to magnetic flux. Ferromagnetic materials have specific saturation points dependant on their specific material composition. Wherein there is too much induced magnetic flux, the material may magnetically saturate and its ability to store and transfer electromagnetic energy may be diminished. Magnetic saturation may also be exasperated by thermal stress and mechanical stress. In general, the longer magnetic path length of an oval shaped core increases the magnetic flux that may be contained in the core and reduce the core's susceptibility to magnetic saturation. This longer path length, larger core volume and reduced susceptibility to magnetic saturation also stabilizes the core's performance under mechanical and thermal stress environments.

Powered applications of wire-wound type devices often require a mix of wire gauges, different winding segments and different winding ratios. They also often require that taps, also referred to as conductive take-offs, that are pulled, a term in the art for coupled, from the winding to provide electrical connections intermediate to the winding. Embodiments of claimed subject matter, providing the "winding" in the form of conductive pattern, may facilitate methods for, such as, but not limited to, applying conductive patterns to a toroid core device, controlling the resistance of the conductive patterns, allowing for large conductive pattern ratios, and pulling intermediate taps.

In accordance with embodiments of the disclosed subject matter, the conductive patterns may have varying or different effective gauge values suitable for a particular purpose. Effective gage, used herein, refers to a wire gage equivalent. Where one circuit including a conductive pattern requires a larger current carrying capacity indicative of a larger gauge wire, the conductive pattern may be predetermined to provide that capability by predetermining the physical dimensions of the traces for a specific conductive material. The methods of producing magnetic devices in accordance with embodiments facilitate multiple circuits including a conductive pattern of a magnetic device wherein the effective gauge of one circuit including a conductive pattern may not be dependent on the effective gauge of another circuit including another conductive pattern. By way of example, referring to FIGS. 6A and 6B, the circuit comprising W1A and W1B many have a different effective gauge or current carrying capacity than the circuit comprising W2A and W2B.

Another advantage of the claimed subject matter is that, for particular electromagnetic devices, the more preferred toroid core geometry may be used. For example, the toroid shape may be a more efficient geometry to transfer electromagnetic energy between windings. In wire-wound device production, the toroid core geometry is difficult to wind with wire. In some cases, the less effective C and E core geometry may be used as being more conducive to bobbin winding production incorporating different gauge wires, winding taps and large winding ratios, for example. Embodiments of the disclosed subject matter provide an efficient and effective means for producing the desired electromagnetic devices without some of the design-limiting production limitations of a wire-winding process.

Although magnetic components such as provided by apparatus and methods presented herein may be used in a vast number of electronic components and devices, by way of example, they are particularly advantageous in the construction of wideband data communication transformers and power electronics. The apparatus presented herein allows for optimization of performance by keeping the circuit windings and core in close proximity to one another.

In various embodiments as described herein, example embodiments include at least the following examples.

A magnetic component comprising: a base substrate defining a first base surface and a second base surface opposite the first base surface, the first base surface defining a winding cup depending therefrom having a shape of a closed groove surrounding a hub, the winding cup defining a winding cup surface, the hub defining a hub top surface that is substantially coplanar with the first base surface, the winding cup defining a core space operable to receive a core therein; a first conductive pattern disposed on at least a portion of the first base surface, the winding cup surface, and the hub top surface; a second substrate defining a second substrate first side and a second substrate second side opposite the second substrate first side; and a second conductive pattern disposed on at least a portion of the second substrate second side, the second substrate coupled to the first base surface, the second substrate coupled to the first base surface and the hub top surface with the first conductive pattern in operable alignment with the second conductive pattern, wherein the first conductive pattern and the second conductive pattern are coupled in electrical communication so as to define one or more winding-type electric circuits surrounding the core space so as to induce a magnetic flux within the core space when the one or more electric circuits are energized by a voltage source.

The magnetic component as claimed above, further comprising a plurality of vias operable to electrically interconnect the first conductive pattern and the second conductive pattern wherein the vias extend from the second conductive pattern to the first conductive pattern through the second substrate.

The magnetic component as claimed above, further comprising a plurality of vias provided within the second substrate that extend from the second conductive pattern on the second substrate to the first conductive pattern on the base substrate, the vias comprising an electrically conductive material so as to provide electrical interconnects between the first conductive pattern and the second conductive pattern.

The magnetic component as claimed above, further comprising a core disposed within the core space so as to impart magnetic properties to the core when the one or more electric circuits are energized by a voltage source.

The magnetic component as claimed above, wherein the winding cup defines a groove of revolution about an axis that is perpendicular to the first base surface.

The magnetic component as claimed above, wherein the winding cup defines a groove of revolution about an axis that is perpendicular to the first base surface having a shape generally of a toroid.

The magnetic component as claimed above, wherein the first base surface defines a winding cup periphery surface portion adjacent the winding cup, the hub top surface defining a hub periphery surface portion, wherein the first conductive pattern is at least partially disposed on at least a portion of the winding cup periphery surface portion and the hub periphery surface portion.

The magnetic component as claimed above, wherein the winding cup surface defines a winding cup bottom, a winding cup inner wall and a winding cup outer wall that are contiguous with the winding cup bottom, the hub extending from the first base surface to the winding cup bottom defining the winding cup inner wall.

The magnetic component as claimed above, wherein the winding cup surface defines a plurality of winding cup channels depending from the winding cup surface and defining winding cup lands between the winding cup channels, each of the winding cup channels being continuous from the winding cup periphery surface portion to the hub periphery surface portion, wherein the first conductive pattern comprises conductive material disposed within each of the winding cup channels defining a plurality of discontinuous first conductive traces extending from the winding cup periphery surface portion to the hub periphery surface portion, the winding cup lands defining an electrically insulative separation between each first conductive trace.

The magnetic component as claimed above, wherein each of the first conductive traces comprise a trace hub end that is associated with the hub periphery surface portion and a trace winding cup periphery end that is associated with the winding cup periphery surface portion, the second conductive pattern comprising a plurality of discontinuous second conductive traces extending from about the axis, the second conductive traces comprise a second conductive trace first end adjacent the axis and a second conductive trace second end opposite the second conductive trace first end, the number of second conductive traces is predetermined by the number of first conductive traces and for a particular purpose, the second conductive pattern is operable to be associated with the first conductive pattern on both the hub periphery surface portion and the winding cup periphery surface portion, at least one trace hub end is electrically coupled to at least one second conductive trace first end and at least one trace winding cup periphery end is electrically coupled to at least one second conductive trace second end defining at least one winding-type electric circuit, each winding-type electric circuit having two opposite ends for coupling to a voltage source operable to complete an electrical circuit.

The magnetic component as claimed above, wherein the number of second conductive traces is equal to the number of first conductive traces.

The magnetic component as claimed above, wherein the first conductive pattern and the second conductive pattern are in electrical communication so as to define at least one continuous winding-type electric circuit beginning at a first terminal and terminating at a second terminal.

The magnetic component as claimed above, wherein the second conductive traces radiate from about the axis such that each of the second conductive trace first ends is aligned with each of the trace hub ends of a corresponding first conductive trace and each of the second conductive trace second ends is aligned with each of the trace winding cup periphery ends of an adjacent first conductive trace when the second substrate is coupled to the base substrate.

The magnetic component as claimed above, wherein the core comprises a permeability material.

The magnetic component as claimed above, wherein the permeability material comprises a ferromagnetic type material.

The magnetic component as claimed above, wherein the core substantially conforms to a shape of the core space.

The magnetic component as claimed above, wherein the first conductive pattern and the second conductive pattern are in electrical communication so as to impart magnetic properties to the core operable for facilitating inductor-type functionality.

The magnetic component as claimed above, wherein the first conductive pattern and the second conductive pattern are in electrical communication so as to impart magnetic properties to the core operable for facilitating transformer-type functionality.

The magnetic component as claimed above, wherein the first conductive pattern and the second conductive pattern are in electrical communication so as to impart magnetic properties to the core operable for facilitating common mode-filter type functionality.

The magnetic component as claimed above, wherein the first conductive pattern and second conductive pattern are electrically interconnected so as to define four interleaved electrical paths operable for facilitating a dual common mode filter-type functionality, and wherein the magnetic properties of the core comprise magnetic properties operable for facilitating a dual common mode filter-type functionality.

The magnetic component as claimed above, wherein the first conductive pattern and second conductive pattern are electrically interconnected so as to define two interleaved electrical paths operable for facilitating a single common mode filter-type functionality, and wherein the magnetic properties of the core comprise magnetic properties operable for facilitating a single common mode filter-type functionality.

The magnetic component as claimed above, wherein the first conductive pattern and second conductive pattern are electrically interconnected so as to define two interleaved electrical paths operable for facilitating a single inductor-type functionality, and wherein the magnetic properties of the core comprise magnetic properties capable of facilitating a single inductor-type functionality.

The magnetic component as claimed above, wherein the first conductive pattern and second conductive pattern are electrically interconnected so as to define three interleaved electrical paths operable for facilitating a transformer-type functionality, and wherein the magnetic properties of the core comprise magnetic properties capable of facilitating a transformer-type functionality.

The magnetic component as claimed above, wherein the core and the winding cup surface defines a gap therebetween, the magnetic component further comprising an electrically insulative material disposed within the gap.

The magnetic component as claimed above, wherein the core space defines a tapered profile and wherein the core comprises a complimentary tapered profile, wherein the complimentary tapered profiles provide for self-alignment of the core within the core space.

The magnetic component as claimed above, wherein the core space defines a closed groove having a generally circular shape.

The magnetic component as claimed above, wherein the core space defines a closed groove having a generally oval-shape.

The magnetic component as claimed above, wherein the core space defines a closed groove having a generally oval-shape defining two hubs.

The magnetic component as claimed above, wherein the core space defines a closed groove having a generally rectangular shape defining two hubs.

The magnetic component as claimed above, further comprising: a hub recess depending from the second base surface, the hub recess having an axis substantially coaxial with that of the hub axis; and a thermally-conductive element disposed within the hub recess whereby thermal energy from the one or more winding-type electric circuits may be conducted away from the one or more winding-type electric circuits and into the thermally-conductive element.

The magnetic component as claimed above, further comprising: a third substrate including a third substrate first side and a third substrate second side opposite the third substrate first side; a third conductive pattern comprising at least one third conductive trace disposed on at least a portion of the third substrate second side, each third conductive trace having a hub end and a secondary channel end opposite the hub end; and a secondary conductive pattern disposed on at least a portion of the second base surface, wherein the third substrate is coupled to the second substrate, the third conductive pattern and the secondary conductive pattern are in electrical communication so as to define one or more winding-type electric circuits surrounding the core space so as to impart magnetic properties to the core space when the one or more electric circuits are energized by a voltage source.

The magnetic component as claimed above, further comprising: a third substrate including a third substrate first side and a third substrate second side opposite the third substrate first side; a third conductive pattern comprising at least one third conductive trace disposed on at least a portion of the third substrate second side, each third conductive trace having a hub end and a secondary channel end opposite the hub end; at least one third hub via extending from the hub end of the third conductive trace to the third substrate first side; at least one third secondary channel via extending from the secondary channel end of the third conductive trace to the third substrate first side; a hub recess depending from the second base surface, the hub recess having an axis substantially coaxial with that of the hub axis, the hub recess defining a hub recess surface, the secondary conductive pattern disposed on at least a portion of the second base surface and at least a portion of the hub recess surface; at least one hub recess via extending from the secondary conductive pattern disposed on at least a portion of the hub recess surface to the hub top surface; at least one secondary via extending from the secondary conductive pattern disposed on at least a portion of the second base surface to the first base surface; and the second substrate further comprising pass-through vias extending from the second substrate first side to the second substrate second side and operable to electrically interconnect the third hub vias with the hub vias and to electrically interconnect the secondary channel vias with the secondary vias, wherein the third substrate is coupled to the second substrate, the third conductive pattern and the secondary conductive pattern are in electrical communication so as to define one or more winding-type electric circuits surrounding the core space so as to impart magnetic properties to the core space when the one or more electric circuits are energized by a voltage source.

The magnetic component as claimed above, further comprising: a third substrate including a third substrate first side and a third substrate second side opposite the third substrate first side; a third conductive pattern comprising at least one third conductive trace disposed on at least a portion of the third substrate second side, each third conductive trace having a hub end and a secondary channel end opposite the hub end; at least one third hub via extending from the hub end of the third conductive trace to the third substrate first side; at least one third secondary channel via extending from the secondary channel end of the third conductive trace to the third substrate first side; a hub recess depending from the second base surface, the hub recess having an axis substantially coaxial with that of the hub axis, the hub recess defining a hub recess side surface and a hub recess bottom surface, the hub recess side surface defining a plurality of hub recess channels depending from the hub recess side surface defining hub recess lands that extend from the hub recess bottom surface to the second base surface, the second base surface defining a plurality of second surface channels that extend from each of the hub recess channels and terminating at a second surface channel end, the magnetic component further comprising an electrically conductive material disposed in the hub recess channels and the second surface channels defining a secondary conductive winding pattern, the secondary conductive winding pattern defining a plurality of secondary traces; at least one hub recess via extending from each of the hub recess channels to the hub top surface; at least one secondary via extending from the second surface channel end to the first base surface; and the second substrate further comprising pass-through vias extending from the second substrate first side to the second substrate second side and operable to electrically interconnect the third hub vias with the hub vias and to electrically interconnect the secondary channel vias with the secondary vias, wherein the third substrate is coupled to the second substrate, the third conductive pattern and the secondary conductive pattern are in electrical communication so as to define one or more winding-type electric circuits surrounding the core space so as to impart magnetic properties to the core space when the one or more electric circuits are energized by a voltage source.

A method of making a magnetic component comprising: providing a base substrate defining a first base surface and a second base surface opposite the first base surface; providing a winding cup depending from the first base surface having a shape of a closed groove surrounding a hub, the winding cup defining a winding cup surface, the hub defining a hub top surface that is substantially coplanar with the first base surface, the winding cup defining a core space operable to receive a core therein; disposing a first conductive pattern on at least a portion of the first base surface, the winding cup surface, and the hub top surface; providing a second substrate defining a second substrate first side and a second substrate second side opposite the second substrate first side; and disposing a second conductive pattern on at least a portion of the second substrate second side; providing a plurality of vias within the second substrate that extend from the second conductive pattern on the second substrate to the first conductive pattern on the base substrate, the vias comprising an electrically conductive material so as to provide electrical interconnects between the first conductive pattern and the second conductive pattern; coupling the second substrate to the first base surface and the hub top surface with the first conductive pattern in operable alignment with the second conductive pattern; and coupling the first conductive pattern and the second conductive pattern in electrical communication so as to define one or more winding-type electric circuits surrounding the core space so as to induce a magnetic flux within the core space when the one or more electric circuits are energized by a voltage source.

The method as claimed above, further comprising disposing a core of permeability material within the core space.

The method as claimed above, wherein the core and the winding cup surface defines a gap therebetween, the method further comprising disposing an electrically insulative material within the gap.

The method as claimed above, wherein disposing a winding cup further comprises disposing a winding cup defining a groove of revolution about an axis that is perpendicular to the first base surface.

The method as claimed above, wherein providing a base substrate further comprises: providing a base substrate wherein the first base surface defines a winding cup periphery surface portion adjacent the winding cup, the hub top surface defining a hub periphery surface portion, wherein disposing a first conductive pattern on at least a portion of the first base surface, the winding cup surface, and the hub top surface further comprises disposing the first conductive pattern on at least a portion of the winding cup periphery surface portion and the hub periphery surface portion.

The method as claimed above, wherein disposing a winding cup further comprises disposing a winding cup wherein the winding cup surface defines a winding cup bottom, a winding cup inner wall and a winding cup outer wall that are contiguous with the winding cup bottom, the hub extending from the first base surface to the winding cup bottom defining the winding cup inner wall.

The method as claimed above, wherein disposing a winding cup further comprises disposing a winding cup wherein the winding cup surface defines a plurality of winding cup channels depending from the winding cup surface and defining winding cup lands between the winding cup channels, each of the winding cup channels being continuous from the winding cup periphery surface portion to the hub periphery surface portion, wherein disposing a first conductive pattern further comprises disposing a first conductive pattern disposed within each of the winding cup channels defining a plurality of discontinuous first conductive traces extending from the winding cup periphery surface portion to the hub periphery surface portion, the winding cup lands defining an electrically insulative separation between each first conductive trace.

The method as claimed above, wherein disposing a first conductive pattern within each of the winding cup channels comprises: disposing conductive material on the winding cup surface; and removing the conductive material on the winding cup lands.

The method as claimed above, wherein removing the conductive material from the winding cup lands comprises removing the conductive material from the winding cup lands using a mechanical process.

The method as claimed above, wherein removing the conductive material on the winding cup lands comprises: disposing etch-resist material on the conductive material; removing the etch-resist material from the conductive material disposed on the winding cup lands; and removing the conductive material dispose on the winding cup lands using an etching process.

The method as claimed above, wherein removing the etch-resist material from the conductive material disposed on the winding cup lands comprises removing the etch-resist material from the conductive material disposed on the winding cup lands using a machining process.

The method as claimed above, further comprising removing the etch-resist material from the conductive material disposed in the winding cup channel after removing the conductive material dispose on the winding cup lands.

The method as claimed above, wherein disposing a first conductive pattern further comprises disposing a first conductive pattern includes wherein each of the first conductive traces comprise a trace hub end that is associated with the hub periphery surface portion and a trace winding cup periphery end that is associated with the winding cup periphery surface portion, wherein disposing a second conductive pattern further comprises disposing a second conductive pattern comprising a plurality of discontinuous second conductive traces extending from about the axis, the second conductive traces comprising a second conductive trace first end adjacent the axis and a second conductive trace second end opposite the second conductive trace first end, the number of second conductive traces is predetermined by the number of first conductive traces and for a particular purpose, the second conductive pattern is operable to be associated with the first conductive pattern on both the hub periphery surface portion and the winding cup periphery surface portion; wherein coupling the first conductive pattern and the second conductive pattern comprises coupling at least one trace hub end to at least one second conductive trace first end and coupling at least one trace winding cup periphery end to at least one second conductive trace second end defining at least one winding-type electric circuits, each winding-type electric circuits having two opposite ends operable for coupling to a voltage source operable to complete an electrical circuit.

The method as claimed above, wherein coupling the first conductive pattern and the second conductive pattern comprises coupling the first conductive pattern and the second conductive pattern so as to define at least one continuous winding-type electric circuit beginning at a first terminal and terminating at a second terminal.

The method as claimed above, wherein disposing a second conductive pattern further comprises disposing a second conductive pattern wherein the second conductive traces radiate from about the axis such that each of the second conductive trace first ends is aligned with each of the trace hub ends of a corresponding first conductive trace and each of the second conductive trace second ends is aligned with each of the trace winding cup periphery ends of an adjacent first conductive trace when the second substrate is coupled to the base substrate.

The method as claimed above, wherein coupling the first conductive pattern and the second conductive pattern in electrical communication further comprises coupling the first conductive pattern and the second conductive pattern in electrical communication so as to impart magnetic properties to the core operable for facilitating inductor-type functionality.

The method as claimed above, wherein coupling the first conductive pattern and the second conductive pattern in electrical communication further comprises coupling the first conductive pattern and the second conductive pattern in electrical communication so as to impart magnetic properties to the core operable for facilitating transformer-type functionality.

The method as claimed above, wherein coupling the first conductive pattern and the second conductive pattern in electrical communication further comprises coupling the first conductive pattern and the second conductive pattern in electrical communication so as to impart magnetic properties to the core operable for facilitating common mode-filter type functionality.

The method as claimed above, wherein coupling the first conductive pattern and the second conductive pattern in electrical communication further comprises coupling the first conductive pattern and the second conductive pattern in electrical communication so as to define four interleaved electrical paths operable for facilitating a dual common mode filter-type functionality, and wherein the magnetic properties of the core comprise magnetic properties operable for facilitating a dual common mode filter-type functionality.

The method as claimed above, wherein coupling the first conductive pattern and the second conductive pattern in electrical communication further comprises coupling the first conductive pattern and the second conductive pattern in electrical communication so as to define two interleaved electrical paths operable for facilitating a single common mode filter-type functionality, and wherein the magnetic properties of the core comprise magnetic properties operable for facilitating a single common mode filter-type functionality.

The method as claimed above, wherein coupling the first conductive pattern and the second conductive pattern in electrical communication further comprises coupling the first conductive pattern and the second conductive pattern in electrical communication so as to define two interleaved electrical paths operable for facilitating a single inductor-type functionality, and wherein the magnetic properties of the core comprise magnetic properties capable of facilitating a single inductor-type functionality.

The method as claimed above, wherein coupling the first conductive pattern and the second conductive pattern in electrical communication further comprises coupling the first conductive pattern and the second conductive pattern in electrical communication so as to define three interleaved electrical paths operable for facilitating a transformer-type functionality, and wherein the magnetic properties of the core comprise magnetic properties capable of facilitating a transformer-type functionality.

The method as claimed above, wherein disposing a winding cup further comprises disposing a winding cup defining a core space having an inwardly tapered profile; and wherein disposing a core further comprises disposing a core having a complimentary tapered profile to the winding cup, wherein the complimentary tapered profiles provide for self-alignment of the core within the core space.

The method as claimed above, further comprising: providing a hub recess depending from the second base surface, the hub recess having an axis substantially coaxial with that of the hub axis; and disposing a thermally-conductive element within the hub recess whereby thermal energy from the one or more winding-type electric circuits may be conducted away from the one or more winding-type electric circuits and into the thermally-conductive element.

The method as claimed above, further comprising: providing a third substrate including a third substrate first side and a third substrate second side opposite the third substrate first side; disposing a third conductive pattern comprising at least one third conductive trace on at least a portion of the third substrate second side, each third conductive trace having a hub end and a secondary channel end opposite the hub end; and disposing a secondary conductive pattern on at least a portion of the second base surface; coupling the third substrate to the second substrate; and coupling the third conductive pattern and the secondary conductive pattern in electrical communication so as to define one or more winding-type electric circuits surrounding the core space so as to impart magnetic properties to the core space when the one or more electric circuits are energized by a voltage source.

The method as claimed above, further comprising: providing a third substrate including a third substrate first side and a third substrate second side opposite the third substrate first side; disposing a third conductive pattern comprising at least one third conductive trace on at least a portion of the third substrate second side, each third conductive trace having a hub end and a secondary channel end opposite the hub end; providing at least one third hub via extending from the hub end of the third conductive trace to the third substrate first side; providing at least one third secondary channel via extending from the secondary channel end of the third conductive trace to the third substrate first side; providing a hub recess depending from the second base surface, the hub recess having an axis substantially coaxial with that of the hub axis, the hub recess defining a hub recess surface; wherein disposing the secondary conductive pattern further comprises disposing the secondary conductive pattern on at least a portion of the second base surface and at least a portion of the hub recess surface; providing at least one hub recess via extending from the secondary conductive pattern disposed on at least a portion of the hub recess surface to the hub top surface; providing at least one secondary via extending from the secondary conductive pattern disposed on at least a portion of the second base surface to the first base surface; providing pass-through vias extending from the second substrate first side to the second substrate second side and operable to electrically interconnect the third hub vias with the hub vias and to electrically interconnect the secondary channel vias with the secondary vias; coupling the third substrate to the second substrate; and coupling the third conductive pattern and the secondary conductive pattern in electrical communication so as to define one or more winding-type electric circuits surrounding the core space so as to impart magnetic properties to the core space when the one or more electric circuits are energized by a voltage source.

The method as claimed above, further comprising: providing a third substrate including a third substrate first side and a third substrate second side opposite the third substrate first side; disposing a third conductive pattern comprising at least one third conductive trace on at least a portion of the third substrate second side, each third conductive trace having a hub end and a secondary channel end opposite the hub end; providing at least one third hub via extending from the hub end of the third conductive trace to the third substrate first side; providing at least one third secondary channel via extending from the secondary channel end of the third conductive trace to the third substrate first side; providing a hub recess depending from the second base surface, the hub recess having an axis substantially coaxial with that of the hub axis, the hub recess defining a hub recess side surface and a hub recess bottom surface, the hub recess side surface defining a plurality of hub recess channels depending from the hub recess side surface defining hub recess lands that extend from the hub recess bottom surface to the second base surface, the second base surface defining a plurality of second surface channels that extend from each of the hub recess channels and terminating at a second surface channel end; disposing an electrically conductive material in the hub recess channels and the second surface channels defining a secondary conductive winding pattern, the secondary conductive winding pattern defining a plurality of secondary traces; providing at least one hub recess via extending from each of the hub recess channels to the hub top surface; providing at least one secondary via extending from the second surface channel end to the first base surface; providing pass-through vias extending from the second substrate first side to the second substrate second side and operable to electrically interconnect the third hub vias with the hub vias and to electrically interconnect the secondary channel vias with the secondary vias; coupling the third substrate to the second substrate; and coupling the third conductive pattern and the secondary conductive pattern in electrical communication so as to define one or more winding-type electric circuits surrounding the core space so as to impart magnetic properties to the core space when the one or more electric circuits are energized by a voltage source.

While there has been illustrated and/or described what are presently considered to be example embodiments of claimed subject matter, it will be understood by those skilled in the art that various other modifications may be made, and/or equivalents may be substituted, without departing from the true scope of claimed subject matter. Additionally, many modifications may be made to adapt a particular situation to the teachings of claimed subject matter without departing from subject matter that is claimed. Therefore, it is intended that the patent not be limited to the particular embodiments disclosed, but that it covers all embodiments falling within the scope of the appended claims.

What is claimed is:

1. A magnetic component comprising:
 a base substrate defining a first base surface and a second base surface opposite the first base surface, the first base surface defining a winding cup depending therefrom having a shape of a closed groove surrounding a hub, the winding cup defining a winding cup surface, the hub defining a hub top surface that is substantially coplanar with the first base surface, the winding cup defining a core space operable to receive a core therein;
 a first conductive pattern disposed on at least a portion of the first base surface, the winding cup surface, and the hub top surface;
 a second substrate defining a second substrate first side and a second substrate second side opposite the second substrate first side; and
 a second conductive pattern disposed on at least a portion of the second substrate second side, the second substrate coupled to the first base surface, the second substrate coupled to the first base surface and the hub top surface with the first conductive pattern in operable alignment with the second conductive pattern, wherein the first conductive pattern and the second conductive pattern are coupled in electrical communication so as to define one or more winding-type electric circuits surrounding the core space so as to induce a magnetic flux within the core space when the one or more electric circuits are energized by a voltage source.

2. The magnetic component of claim 1, wherein the winding cup surface defines a winding cup bottom, a winding cup inner wall and a winding cup outer wall that are contiguous with the winding cup bottom, the hub extending from the first base surface to the winding cup bottom defining the winding cup inner wall.

3. The magnetic component of claim 2, wherein the winding cup surface defines a plurality of winding cup channels depending from the winding cup surface and defining winding cup lands between the winding cup channels, each of the winding cup channels being continuous from the winding cup periphery surface portion to the hub periphery surface portion, wherein the first conductive pattern comprises conductive material disposed within each of the winding cup channels defining a plurality of discontinuous first conductive traces extending from the winding cup periphery surface portion to the hub periphery surface portion, the winding cup lands defining an electrically insulative separation between each first conductive trace.

4. The magnetic component of claim 3, wherein each of the first conductive traces comprise a trace hub end that is associated with the hub periphery surface portion and a trace winding cup periphery end that is associated with the winding cup periphery surface portion, the second conductive pattern comprising a plurality of discontinuous second conductive traces extending from about the axis, the second conductive traces comprise a second conductive trace first end adjacent the axis and a second conductive trace second end opposite the second conductive trace first end, the number of second conductive traces is predetermined by the number of first conductive traces and for a particular purpose, the second conductive pattern is operable to be associated with the first conductive pattern on both the hub periphery surface portion and the winding cup periphery surface portion, at least one trace hub end is electrically coupled to at least one second conductive trace first end and at least one trace winding cup periphery end is electrically coupled to at least one second conductive trace second end defining at least one winding-type electric circuit, each winding-type electric circuit having two opposite ends for coupling to a voltage source operable to complete an electrical circuit.

5. The magnetic component of claim 4, wherein the first conductive pattern and second conductive pattern are electrically interconnected so as to define two interleaved electrical paths operable for facilitating a single common mode filter-type functionality, and wherein the magnetic properties of the core comprise magnetic properties operable for facilitating a single common mode filter-type functionality.

6. The magnetic component of claim 4, wherein the first conductive pattern and second conductive pattern are electrically interconnected so as to define one electrical path operable for facilitating a single inductor-type functionality, and wherein the magnetic properties of the core comprise magnetic properties capable of facilitating a single inductor-type functionality.

7. The magnetic component of claim 4, wherein the first conductive pattern and second conductive pattern are electrically interconnected so as to define three interleaved electrical paths operable for facilitating a transformer-type functionality, and wherein the magnetic properties of the core comprise magnetic properties capable of facilitating a transformer-type functionality.

8. The magnetic component of claim 1, further comprising a core disposed within the core space so as to impart magnetic properties to the core when the one or more electric circuits are energized by a voltage source.

9. The magnetic component of claim 8, wherein the core and the winding cup surface define a gap therebetween, the magnetic component further comprising an electrically insulative material disposed within the gap.

10. The magnetic component of claim 8, wherein the core space defines a tapered profile and wherein the core comprises a complimentary tapered profile, wherein the complimentary tapered profiles provide for self-alignment of the core within the core space.

11. The magnetic component of claim 8, wherein the core space defines a closed groove having a generally circular shape.

12. The magnetic component of claim 8, wherein the core space defines a closed groove having a generally oval-shape.

13. The magnetic component of claim 8, wherein the core space defines a closed groove having a generally oval-shape defining two hubs.

14. The magnetic component of claim 8, wherein the core space defines a closed groove having a generally rectangular shape defining two hubs.

15. The magnetic component of claim 8, further comprising:

a hub recess depending from the second base surface, the hub recess having an axis substantially coaxial with that of the hub axis; and a thermally-conductive element disposed within the hub recess whereby thermal energy from the one or more winding-type electric circuits may be conducted away from the one or more winding-type electric circuits and into the thermally-conductive element.

16. The magnetic component of claim 1, further comprising:

a third substrate including a third substrate first side and a third substrate second side opposite the third substrate first side;

a third conductive pattern comprising at least one third conductive trace disposed on at least a portion of the third substrate second side, each third conductive trace having a hub end and a secondary channel end opposite the hub end; and a secondary conductive pattern disposed on at least a portion of the second base surface, wherein the third substrate is coupled to the second substrate, the third conductive pattern and the secondary conductive pattern are in electrical communication so as to define one or more winding-type electric circuits surrounding the core space so as to impart magnetic properties to the core space when the one or more electric circuits are energized by a voltage source.

17. The magnetic component of claim 1, further comprising:

a third substrate including a third substrate first side and a third substrate second side opposite the third substrate first side;

a third conductive pattern comprising at least one third conductive trace disposed on at least a portion of the third substrate second side, each third conductive trace having a hub end and a secondary channel end opposite the hub end;

at least one third hub via extending from the hub end of the third conductive trace to the third substrate first side;

at least one third secondary channel via extending from the secondary channel end of the third conductive trace to the third substrate first side;

a hub recess depending from the second base surface, the hub recess having an axis substantially coaxial with that of the hub axis, the hub recess defining a hub recess surface, the secondary conductive pattern disposed on at least a portion of the second base surface and at least a portion of the hub recess surface;

at least one hub recess via extending from the secondary conductive pattern disposed on at least a portion of the hub recess surface to the hub top surface;

at least one secondary via extending from the secondary conductive pattern disposed on at least a portion of the second base surface to the first base surface; and the second substrate further comprising pass-through vias extending from the second substrate first side to the second substrate second side and operable to electrically interconnect the third hub vias with the hub vias and to electrically interconnect the secondary channel vias with the secondary vias, wherein the third substrate is coupled to the second substrate, the third conductive pattern and the secondary conductive pattern are in electrical communication so as to define one or more winding-type electric circuits surrounding the core space so as to impart magnetic properties to the core space when the one or more electric circuits are energized by a voltage source.

18. The magnetic component of claim 1, further comprising:
a third substrate including a third substrate first side and a third substrate second side opposite the third substrate first side;
a third conductive pattern comprising at least one third conductive trace disposed on at least a portion of the third substrate second side, each third conductive trace having a hub end and a secondary channel end opposite the hub end;
at least one third hub via extending from the hub end of the third conductive trace to the third substrate first side;
at least one third secondary channel via extending from the secondary channel end of the third conductive trace to the third substrate first side;
a hub recess depending from the second base surface, the hub recess having an axis substantially coaxial with that of the hub axis, the hub recess defining a hub recess side surface and a hub recess bottom surface, the hub recess side surface defining a plurality of hub recess channels depending from the hub recess side surface defining hub recess lands that extend from the hub recess bottom surface to the second base surface, the second base surface defining a plurality of second surface channels that extend from each of the hub recess channels and terminating at a second surface channel end,
the magnetic component further comprising an electrically conductive material disposed in the hub recess channels and the second surface channels defining a secondary conductive winding pattern, the secondary conductive winding pattern defining a plurality of secondary traces;
at least one hub recess via extending from each of the hub recess channels to the hub top surface;
at least one secondary via extending from the second surface channel end to the first base surface; and
the second substrate further comprising pass-through vias extending from the second substrate first side to the second substrate second side and operable to electrically interconnect the third hub vias with the hub vias and to electrically interconnect the secondary channel vias with the secondary vias,
wherein the third substrate is coupled to the second substrate, the third conductive pattern and the secondary conductive pattern are in electrical communication so as to define one or more winding-type electric circuits surrounding the core space so as to impart magnetic properties to the core space when the one or more electric circuits are energized by a voltage source.

19. A method of making a magnetic component comprising:
providing a base substrate defining a first base surface and a second base surface opposite the first base surface;
providing a winding cup depending from the first base surface having a shape of a closed groove surrounding a hub, the winding cup defining a winding cup surface, the hub defining a hub top surface that is substantially coplanar with the first base surface, the winding cup defining a core space operable to receive a core therein;
disposing a first conductive pattern on at least a portion of the first base surface, the winding cup surface, and the hub top surface;
providing a second substrate defining a second substrate first side and a second substrate second side opposite the second substrate first side; and
disposing a second conductive pattern on at least a portion of the second substrate second side;
providing a plurality of vias within the second substrate that extend from the second conductive pattern on the second substrate to the first conductive pattern on the base substrate, the vias comprising an electrically conductive material so as to provide electrical interconnects between the first conductive pattern and the second conductive pattern;
coupling the second substrate to the first base surface and the hub top surface with the first conductive pattern in operable alignment with the second conductive pattern; and
coupling the first conductive pattern and the second conductive pattern in electrical communication so as to define one or more winding-type electric circuits surrounding the core space so as to induce a magnetic flux within the core space when the one or more electric circuits are energized by a voltage source.

20. The method of claim 19, further comprising disposing a core of permeability material within the core space.

21. The method of claim 20, wherein the core and the winding cup surface define a gap therebetween, the method further comprising disposing an electrically insulative material within the gap.

22. The method of claim 19, wherein disposing a winding cup further comprises disposing a winding cup defining a groove of revolution about an axis that is perpendicular to the first base surface.

23. The method of claim 19, wherein providing a base substrate further comprises: providing a base substrate wherein the first base surface defines a winding cup periphery surface portion adjacent the winding cup, the hub top surface defining a hub periphery surface portion, wherein
disposing a first conductive pattern on at least a portion of the first base surface, the winding cup surface, and the hub top surface further comprises disposing the first conductive pattern on at least a portion of the winding cup periphery surface portion and the hub periphery surface portion.

24. The method of claim 22, wherein disposing a winding cup further comprises disposing a winding cup wherein the winding cup surface defines a winding cup bottom, a winding cup inner wall and a winding cup outer wall that are contiguous with the winding cup bottom, the hub extending from the first base surface to the winding cup bottom defining the winding cup inner wall.

25. The method of claim 22, wherein disposing a winding cup further comprises disposing a winding cup wherein the winding cup surface defines a plurality of winding cup channels depending from the winding cup surface and defining winding cup lands between the winding cup channels, each of the winding cup channels being continuous from the winding cup periphery surface portion to the hub periphery surface portion,
wherein disposing a first conductive pattern further comprises disposing a first conductive pattern disposed within each of the winding cup channels defining a plurality of discontinuous first conductive traces extending from the winding cup periphery surface portion to the hub periphery surface portion, the winding cup lands defining an electrically insulative separation between each first conductive trace.

26. The method of claim 22, wherein disposing a first conductive pattern within each of the winding cup channels comprises:
  disposing conductive material on the winding cup surface; and
  removing the conductive material on the winding cup lands.

27. The method of claim 26, wherein removing the conductive material from the winding cup lands comprises removing the conductive material from the winding cup lands using a mechanical process.

28. The method of claim 26, wherein removing the conductive material on the winding cup lands comprises:
  disposing etch-resist material on the conductive material;
  removing the etch-resist material from the conductive material disposed on the winding cup lands; and
  removing the conductive material disposed on the winding cup lands using an etching process.

29. The method of claim 28, wherein removing the etch-resist material from the conductive material disposed on the winding cup lands comprises removing the etch-resist material from the conductive material disposed on the winding cup lands using a machining process.

30. The method of claim 29, further comprising removing the etch-resist material from the conductive material disposed in the winding cup channel after removing the conductive material disposed on the winding cup lands.

31. The method of claim 22, wherein disposing a first conductive pattern further comprises disposing a first conductive pattern includes wherein each of the first conductive traces comprise a trace hub end that is associated with the hub periphery surface portion and a trace winding cup periphery end that is associated with the winding cup periphery surface portion,
  wherein disposing a second conductive pattern further comprises disposing a second conductive pattern comprising a plurality of discontinuous second conductive traces extending from about the axis, the second conductive traces comprising a second conductive trace first end adjacent the axis and a second conductive trace second end opposite the second conductive trace first end, the number of second conductive traces is predetermined by the number of first conductive traces and for a particular purpose, the second conductive pattern is operable to be associated with the first conductive pattern on both the hub periphery surface portion and the winding cup periphery surface portion;
  wherein coupling the first conductive pattern and the second conductive pattern comprises coupling at least one trace hub end to at least one second conductive trace first end and coupling at least one trace winding cup periphery end to at least one second conductive trace second end defining at least one winding-type electric circuits, each winding-type electric circuits having two opposite ends operable for coupling to a voltage source operable to complete an electrical circuit.

32. The method of claim 31, wherein coupling the first conductive pattern and the second conductive pattern comprises coupling the first conductive pattern and the second conductive pattern so as to define at least one continuous winding-type electric circuit beginning at a first terminal and terminating at a second terminal.

33. The method of claim 31, wherein disposing a second conductive pattern further comprises disposing a second conductive pattern wherein the second conductive traces radiate from about the axis such that each of the second conductive trace first ends is aligned with each of the trace hub ends of a corresponding first conductive trace and each of the second conductive trace second ends is aligned with each of the trace winding cup periphery ends of an adjacent first conductive trace when the second substrate is coupled to the base substrate.

34. The method of claim 20, wherein coupling the first conductive pattern and the second conductive pattern in electrical communication further comprises coupling the first conductive pattern and the second conductive pattern in electrical communication so as to impart magnetic properties to the core operable for facilitating inductor-type functionality.

35. The method of claim 20, wherein coupling the first conductive pattern and the second conductive pattern in electrical communication further comprises coupling the first conductive pattern and the second conductive pattern in electrical communication so as to impart magnetic properties to the core operable for facilitating transformer-type functionality.

36. The method of claim 20, wherein coupling the first conductive pattern and the second conductive pattern in electrical communication further comprises coupling the first conductive pattern and the second conductive pattern in electrical communication so as to impart magnetic properties to the core operable for facilitating common mode-filter type functionality.

37. The method of claim 20, wherein coupling the first conductive pattern and the second conductive pattern in electrical communication further comprises coupling the first conductive pattern and the second conductive pattern in electrical communication so as to define four interleaved electrical paths operable for facilitating a dual common mode filter-type functionality, and wherein the magnetic properties of the core comprise magnetic properties operable for facilitating a dual common mode filter-type functionality.

38. The method of claim 20, wherein coupling the first conductive pattern and the second conductive pattern in electrical communication further comprises coupling the first conductive pattern and the second conductive pattern in electrical communication so as to define two interleaved electrical paths operable for facilitating a single common mode filter-type functionality, and wherein the magnetic properties of the core comprise magnetic properties operable for facilitating a single common mode filter-type functionality.

39. The method of claim 20, wherein coupling the first conductive pattern and the second conductive pattern in electrical communication further comprises coupling the first conductive pattern and the second conductive pattern in electrical communication so as to define one electrical path operable for facilitating a single inductor-type functionality, and wherein the magnetic properties of the core comprise magnetic properties capable of facilitating a single inductor-type functionality.

40. The method of claim 20, wherein coupling the first conductive pattern and the second conductive pattern in electrical communication further comprises coupling the first conductive pattern and the second conductive pattern in electrical communication so as to define three interleaved electrical paths operable for facilitating a transformer-type functionality, and wherein the magnetic properties of the core comprise magnetic properties capable of facilitating a transformer-type functionality.

41. The method of claim 20, wherein disposing a winding cup further comprises disposing a winding cup defining a core space having an inwardly tapered profile; and wherein disposing a core further comprises disposing a core having a complimentary tapered profile to the winding cup, wherein the complimentary tapered profiles provide for self-alignment of the core within the core space.

42. The method of claim 20, further comprising:
providing a hub recess depending from the second base surface, the hub recess having an axis substantially coaxial with that of the hub axis; and
disposing a thermally-conductive element within the hub recess whereby thermal energy from the one or more winding-type electric circuits may be conducted away from the one or more winding-type electric circuits and into the thermally-conductive element.

43. The method of claim 19, further comprising:
providing a third substrate including a third substrate first side and a third substrate second side opposite the third substrate first side;
disposing a third conductive pattern comprising at least one third conductive trace on at least a portion of the third substrate second side, each third conductive trace having a hub end and a secondary channel end opposite the hub end; and
disposing a secondary conductive pattern on at least a portion of the second base surface;
coupling the third substrate to the second substrate; and
coupling the third conductive pattern and the secondary conductive pattern in electrical communication so as to define one or more winding-type electric circuits surrounding the core space so as to impart magnetic properties to the core space when the one or more electric circuits are energized by a voltage source.

44. The method of claim 19, further comprising:
providing a third substrate including a third substrate first side and a third substrate second side opposite the third substrate first side;
disposing a third conductive pattern comprising at least one third conductive trace on at least a portion of the third substrate second side, each third conductive trace having a hub end and a secondary channel end opposite the hub end;
providing at least one third hub via extending from the hub end of the third conductive trace to the third substrate first side;
providing at least one third secondary channel via extending from the secondary channel end of the third conductive trace to the third substrate first side;
providing a hub recess depending from the second base surface, the hub recess having an axis substantially coaxial with that of the hub axis, the hub recess defining a hub recess surface;
wherein disposing the secondary conductive pattern further comprises disposing the secondary conductive pattern on at least a portion of the second base surface and at least a portion of the hub recess surface;
providing at least one hub recess via extending from the secondary conductive pattern disposed on at least a portion of the hub recess surface to the hub top surface;
providing at least one secondary via extending from the secondary conductive pattern disposed on at least a portion of the second base surface to the first base surface;
providing pass-through vias extending from the second substrate first side to the second substrate second side and operable to electrically interconnect the third hub vias with the hub vias and to electrically interconnect the secondary channel vias with the secondary vias;
coupling the third substrate to the second substrate; and
coupling the third conductive pattern and the secondary conductive pattern in electrical communication so as to define one or more winding-type electric circuits surrounding the core space so as to impart magnetic properties to the core space when the one or more electric circuits are energized by a voltage source.

45. The method of claim 19, further comprising:
providing a third substrate including a third substrate first side and a third substrate second side opposite the third substrate first side;
disposing a third conductive pattern comprising at least one third conductive trace on at least a portion of the third substrate second side, each third conductive trace having a hub end and a secondary channel end opposite the hub end;
providing at least one third hub via extending from the hub end of the third conductive trace to the third substrate first side;
providing at least one third secondary channel via extending from the secondary channel end of the third conductive trace to the third substrate first side;
providing a hub recess depending from the second base surface, the hub recess having an axis substantially coaxial with that of the hub axis, the hub recess defining a hub recess side surface and a hub recess bottom surface, the hub recess side surface defining a plurality of hub recess channels depending from the hub recess side surface defining hub recess lands that extend from the hub recess bottom surface to the second base surface, the second base surface defining a plurality of second surface channels that extend from each of the hub recess channels and terminating at a second surface channel end;
disposing an electrically conductive material in the hub recess channels and the second surface channels defining a secondary conductive winding pattern, the secondary conductive winding pattern defining a plurality of secondary traces;
providing at least one hub recess via extending from each of the hub recess channels to the hub top surface;
providing at least one secondary via extending from the second surface channel end to the first base surface;
providing pass-through vias extending from the second substrate first side to the second substrate second side and operable to electrically interconnect the third hub vias with the hub vias and to electrically interconnect the secondary channel vias with the secondary vias;
coupling the third substrate to the second substrate; and
coupling the third conductive pattern and the secondary conductive pattern in electrical communication so as to define one or more winding-type electric circuits surrounding the core space so as to impart magnetic properties to the core space when the one or more electric circuits are energized by a voltage source.

* * * * *